United States Patent
Matsuura et al.

(10) Patent No.: US 8,274,642 B2
(45) Date of Patent: Sep. 25, 2012

(54) MASKLESS EXPOSURE METHOD

(75) Inventors: Hiroyasu Matsuura, Yokohama (JP);
Seiji Ishikawa, Kawasaki (JP);
Tadamichi Wachi, Fujisawa (JP);
Toshimasa Ishigaki, Chiba (JP)

(73) Assignees: Hitachi Displays, Ltd., Chiba (JP);
Panasonic Liquid Crystal Display Co., Ltd., Hyogo-ken (JP)

( * ) Notice: Subject to any disclaimer, the term of this patent is extended or adjusted under 35 U.S.C. 154(b) by 837 days.

(21) Appl. No.: 12/390,687

(22) Filed: Feb. 23, 2009

(65) Prior Publication Data

US 2009/0262319 A1    Oct. 22, 2009

(30) Foreign Application Priority Data

Mar. 10, 2008 (JP) .................... 2008-059001
Aug. 7, 2008 (JP) .................... 2008-203766

(51) Int. Cl.
*G03B 27/32* (2006.01)
*G03B 27/44* (2006.01)
*G03B 27/42* (2006.01)

(52) U.S. Cl. ................. 355/77; 355/54; 355/53

(58) Field of Classification Search ............ 355/67, 355/53, 54, 77
See application file for complete search history.

(56) References Cited

U.S. PATENT DOCUMENTS

| 6,228,743 | B1 | 5/2001 | Chen et al. |
| 6,292,208 | B1 * | 9/2001 | Lofhus et al. ............. 347/234 |
| 6,312,134 | B1 * | 11/2001 | Jain et al. ............. 359/855 |
| 6,717,650 | B2 * | 4/2004 | Jain ............. 355/53 |
| 7,212,327 | B2 * | 5/2007 | Nakaya et ............. 359/290 |
| 7,842,926 | B2 * | 11/2010 | Olsson et al. ............. 250/370.08 |
| 2001/0008790 | A1 * | 7/2001 | Chen et al. ............. 438/401 |
| 2004/0156027 | A1 * | 8/2004 | Best et al. ............. 355/53 |

FOREIGN PATENT DOCUMENTS

| JP | 11-345866 | 12/1999 |
| JP | 2005-043576 | 2/2005 |
| JP | 2005-283893 | 10/2005 |

* cited by examiner

*Primary Examiner* — Toan Ton
*Assistant Examiner* — Deoram Persaud
(74) *Attorney, Agent, or Firm* — Antonelli, Terry, Stout & Kraus, LLP.

(57) ABSTRACT

A maskless exposure method of drawing a circuit pattern includes: moving a substrate with respect to a projection optical system; scanning, by the projection optical system, the substrate in a first direction; shifting a scanning region in a second direction; scanning the substrate in the first direction so that an overlapping part is formed. A plurality of marks different from the circuit pattern are exposed in a vicinity of the overlapping part. The plurality of marks are a set of marks at least including two marks disposed on one side of the overlapping part and two marks disposed on another side of the overlapping part. Deviations between the pair of the scanning regions, an inclination of exposing light, and a yawing angle of a stage are analyzed by measuring deviations of distances among the plurality of marks. Calibration data are obtained from a result of the analyzing.

1 Claim, 37 Drawing Sheets

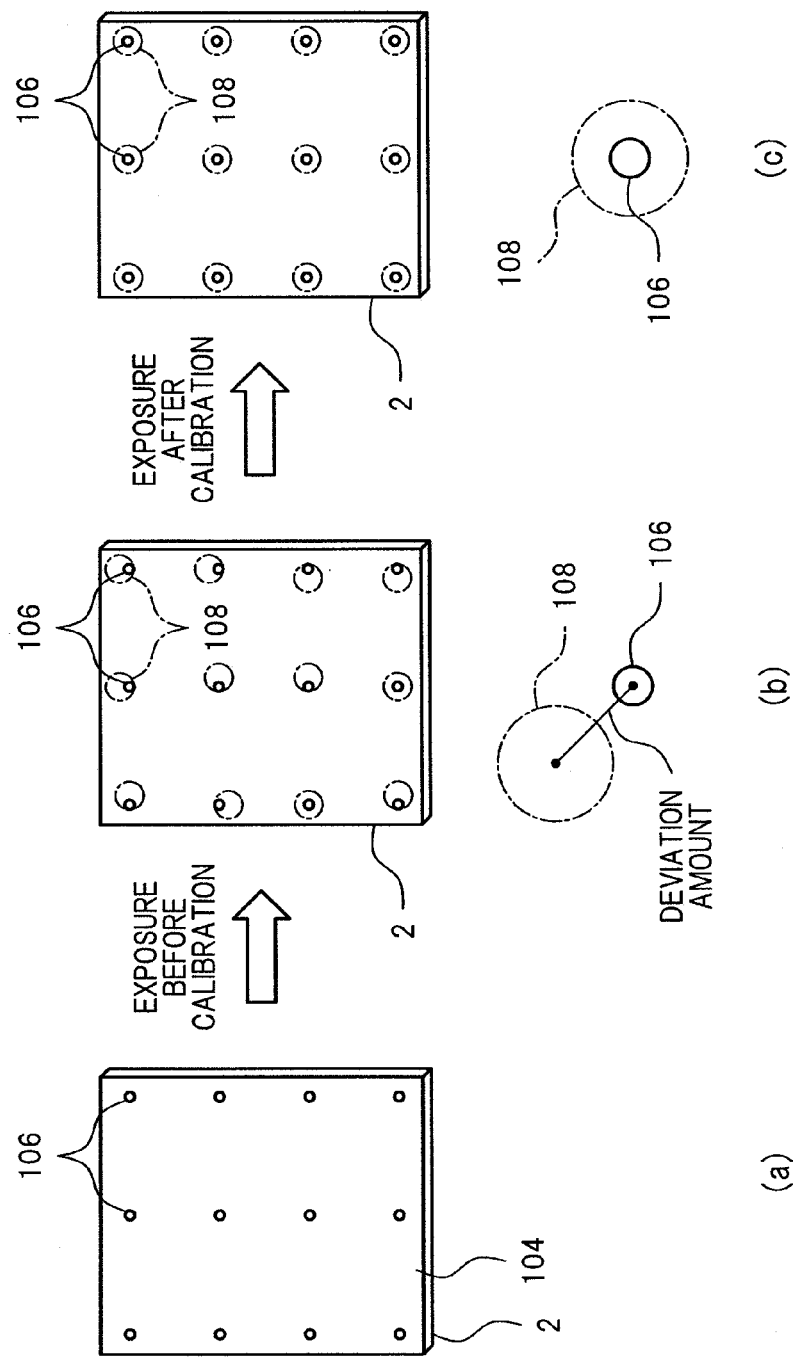

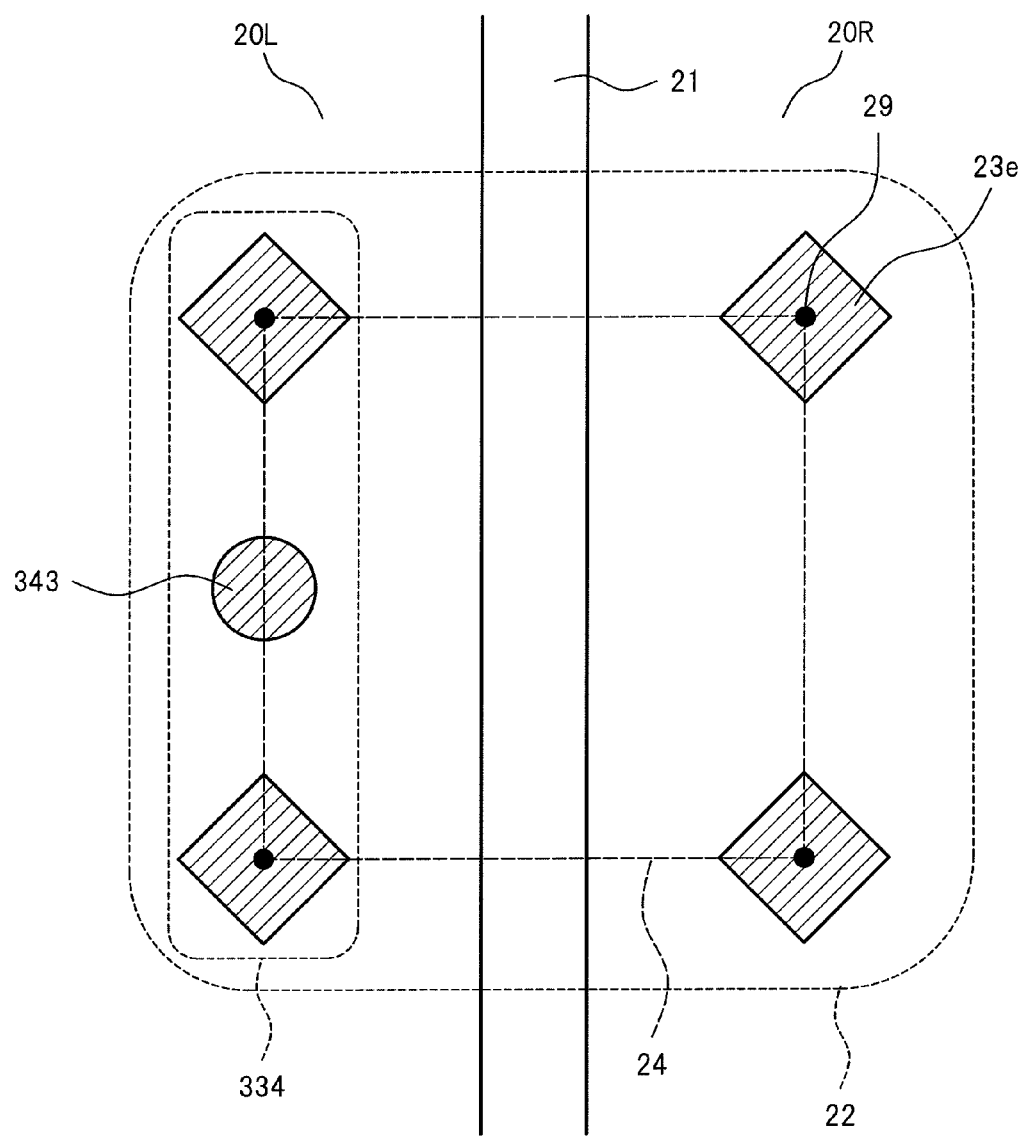

ERROR MAP 380
A PART

ENLARGED DIAGRAM OF A PART

MASKLESS EXPOSURE METHOD

CROSS-REFERENCE TO RELATED APPLICATIONS

The present application claims priority from Japanese applications JP 2008-059001 filed on Mar. 10, 2008 and JP2008-203766 filed on Aug. 7, 2008, the contents of which are hereby incorporated by reference into this application.

BACKGROUND OF THE INVENTION

1. Field of the Invention

The present invention relates to a maskless exposure method, which is used in a manufacturing process for an LCD panel or the like, for instance.

2. Description of the Related Art

A size of a glass substrate (hereinafter referred to as a substrate) used for manufacturing LCD panels, for example, has been increased because of an increase in size of the panel or to improve the production efficiency. In addition, a requirement of display resolution with respect to the large substrate is apt to increase rather than maintaining the same level.

As the size of the substrate increases, a mask for exposure is also increased in size. Then, how to reduce cost of the mask has become one of problems in the mass production. Therefore, a maskless exposure system has been tried, in which ON and OFF of light to be projected is controlled without using a mask so that a pattern is directly burned on the substrate on which a resist is applied.

In this maskless exposure system, a drawing head that emits light controlled by an optical modulator scans the substrate held on a stage so that a pattern is drawn. On this occasion, the stage holding the substrate is required to move with high precision without speed variation. If the maskless exposure system cannot constantly maintain a position and an angle of the head, speed variation, rectilinearity and positioning accuracy of the stage, a drawing start timing, and a drawing magnification (magnitude of width) of exposing light with high accuracy, quality of the product may be deteriorated. In addition, as an essential function of an exposure machine, it is required to have a high accuracy of alignment in the exposure process with accurate positioning with respect to a base pattern.

Here, with reference to FIGS. 16 and 17, a conventional method of calibrating the maskless exposure machine is described. In the conventional method, a jig illustrated in FIG. 16 is used for calibrating a state of drawing position accuracy of a maskless exposure apparatus, or the calibration is performed in accordance with a positional deviation of an exposure pattern with respect to a reference mark as illustrated in FIG. 17. Note that the method illustrated in FIG. 16 is disclosed in Japanese Patent Application Laid-open No. 2005-43576, and the method illustrated in FIG. 17 is disclosed in Japanese Patent Application Laid-open No. 2005-283893.

The jig illustrated in FIG. 16 includes a calibrating plate 110 to be disposed on the stage of the exposure machine instead of the substrate, on which line sensors 111 are arranged in matrix. The line sensors 111 are consist of two parts which are oriented in two directions, i.e., the scanning direction and the direction perpendicular thereto. When a calibration pattern light is projected from a projection optical system (not shown) to the line sensors 111 of the jig, the drawing start timing, positional deviation of the exposing light or the scanning region, and an inclination of the scanning region are detected for adjusting the exposure machine.

In addition, according to the method illustrated in FIG. 17, when the adjustment of the maskless exposure machine is finished, a film of aluminum, chrome or the like is formed on the principal surface of the substrate, and a photosensitive resist is further applied thereon. A reference pattern 106 is exposed on the substrate (see Stage (A) of FIG. 17), and a developing process, an etching process and a resist removing process are further performed so that a calibrating substrate is made. The photosensitive resist is applied on the substrate, and the substrate is led into the maskless exposure machine regularly so that the adjusted state of the apparatus is checked. Positioning the led substrate with the alignment marks disposed on the periphery thereof, hole patterns 108 piercing the resist are formed so as to have the same coordinates as the reference patterns 106 as their centers (see Stage (B) of FIG. 17). After the exposure process, a difference between the center position of the hole pattern 108 and the center position of the reference pattern 106 is measured as a positional deviation of exposure, and the adjustment is performed so as to eliminate the positional deviation (see Stage (C) of FIG. 17).

The maskless exposure machine that exposes a pattern on a resist film by scanning the resist film with a plurality of drawing heads emitting controlled light has no mask to be a criterion of dimensions, and hence it is required to perform calibration of the dimension of the drawing itself as well as check and calibration of functions of the exposure machine regularly so as to insure the accuracy. The items that require the accuracy insurance include rectilinearity, feed pitch accuracy, speed uniformity, drawing start timing and the like that are related to the stage for scanning operation, and include an inclination of the drawing head with respect to the scanning direction and a distance between the drawing heads when a plurality of drawing heads are used, which are related to optical characteristics. When these items are configured appropriately, the alignment accuracy with respect to the pattern of the base layer is improved.

The method of using the calibrating plate 110 illustrated in FIG. 16 is developed for a printed circuit board as a target. If a liquid crystal display (LCD) or an organic EL display (OLED) is a target, a fine wiring pattern is used as the exposure pattern. In this case, the line sensors 111 having high resolution for detecting the deviation of the exposure pattern must be developed, and high accuracy of positioning of the line sensor with respect to the calibrating plate is also required. It is difficult to satisfy these necessary conditions. In addition, it is a problem on a manufacturing site that the production must be stopped every time the calibration is performed. In addition, the method of using a test pattern substrate for the calibration illustrated in FIG. 17 requires to expose the test pattern by another exposure machine that has finished the calibration during the development of the apparatus. Therefore, a problem with supply of the substrate may occur when a dimensions of the substrate is increased or in other cases. In addition, a problem may occur also about storage of the test substrate. In addition, a small variation of the exposure position surely exists even if the calibration is completed. Therefore, when the calibration is performed with respect thereto, the alignment error is added when the second exposure is performed. Therefore, there is a limitation in the accuracy control. Further, this case also has a problem that it is necessary to stop the production every time the calibration is performed on the manufacturing site.

In order to dispose the exposure pattern at the accurate position, it is necessary to perform a yawing correction of the stage on which the substrate is disposed to be moved when the scanning exposure is performed, and to maintain an arrangement of the projection optical system as a designed value for the scanning exposure. In general, a state of deviation of the pattern in a particular part of the exposed substrate is measured so that the exposure start timing and the arrangement of the projection optical system are adjusted. However, if the inclination of the stage is deviated, a deviation between scanning regions may occur due to the coordinates of the scanning region in a first direction even if the alignment state of the projection optical system is normal. Therefore, it is difficult to decide the arrangement state of the projection optical system from the deviation of the exposure pattern. As a result, the adjustment may be mistaken. It is considered that a part causing the deviation of inclination of the stage may be a length measuring system that is used for controlling the stage. Usually, the exposure machine has a laser length measuring machine for measuring a position of the stage ora yawing angle (inclination) When the inclination of the stage is measured by the laser length measuring machine, a plane mirror is attached to an end face of the stage, and two laser length measuring machines are disposed with a predetermined distance therebetween so as to be opposed to the plane mirror. Each of the laser length measuring machines emits a laser beam, and the laser beam reflected by the plane mirror is detected by a detection unit in the laser length measuring machine. The detection units of the two laser length measuring machines make the emitted laser beam and the incident laser beam interfere with each other, and hence the detection unit can detect the inclination of the stage with high accuracy from a change in interference fringe due to a change in optical length. Usually, the inclination of the stage is corrected based on the above-mentioned detection result. Here, the plane mirror has a precisely flat surface. However, if dimensions of the stage are increased along with an increase in size of the substrates, a size of the plane mirror is also increased so that it becomes difficult to ensure the flatness thereof. In addition, some methods of fixing the plane mirror to the stage may cause a distortion of the plane mirror. Further, pitch feed of the stage is performed also in a second direction so that the position where the laser beam enters the plane mirror is changed, and hence the inclination may be detected in error even if the stage has no inclined state. When the scanning exposure is performed, the stage is controlled and held in a certain constant direction. Therefore, if the inclination of the stage caused by the reason described above is not detected correctly, the inclination of the stage is corrected by error. The miscorrection of the inclination cannot be confirmed by monitoring a change in interference fringe, and the miscorrection can be decided only by a result of exposing a measuring pattern on the substrate and measuring the same. As described above, in order to improve the position accuracy of the exposed pattern, it is necessary to analyze each of the inclination of the stage, the exposure start timing and the arrangement deviation of the projection optical system precisely so as to perform correction. Conventionally, the test pattern is exposed on the jig serving as the reference or the substrate provided with the pattern serving as the reference for detecting the deviation of a measuring point, and hence the exposure position of the pattern is corrected according thereto. However, if the adjustment including the inclination of the stage is not performed, the adjustment of the exposure start timing and the arrangement of the projection optical system becomes imperfect. As a result, sufficient position accuracy of the pattern cannot be obtained. In addition, the method of using the calibrating jig or the test pattern substrate has the problem that the production must be stopped every time the exposure accuracy of the apparatus is checked on the manufacturing site.

SUMMARY OF THE INVENTION

It is an object of the present invention to provide a maskless exposure method in which the drawing by the exposure apparatus can be monitored accurately without disturbing a flow of the production, and calibrating data can be extracted from the monitored data, so as to perform a feedback of the calibrating data to the exposure apparatus.

Another object of the present invention is to provide a maskless exposure method in which the inclination of the stage, the exposure start timing and the arrangement of the projection optical system can be monitored accurately without disturbing a flow of the production, and data for constituting the apparatus is extracted if necessary for a feedback thereof to the exposure apparatus.

A summary of representative aspects of the present invention to be disclosed herein is briefly described as follows.

(1) A maskless exposure method of drawing a circuit pattern on a photosensitive resist film, including: moving a substrate on which the photosensitive resist film is formed with respect to a projection optical system; scanning, by the projection optical system, the substrate in a first direction; shifting a scanning region in a second direction that crosses the first direction; and scanning the substrate in the first direction so that an overlapping part is formed in the second direction. A plurality of marks different from the circuit pattern are exposed in a vicinity of the overlapping part on a pair of the scanning regions adjacent to each other with the overlapping part. The plurality of marks are a set of marks at least including two marks disposed on one side of the overlapping part and two marks disposed on another side of the overlapping part. Deviations between the pair of the scanning regions adjacent to each other in the first direction and in the second direction, and an inclination of exposing light of the projection optical system with respect to the first direction are detected by measuring deviations of distances among the plurality of marks. Calibration data are obtained from a result of the detecting.

(2) In the maskless exposure method of item (1), each of marks which make a set is a polygon including a set of two parallel sides that are opposed to each other and have an inclination with respect to the first direction; and the maskless exposure method further includes drawing the set of marks by supplying information to the projection optical system so that centroid positions of the two marks on the one side and centroid positions of the two marks on the another side with respect to the overlapping part are positioned at vertexes of an imaginary square having sides parallel to the first direction.

(3) In the maskless exposure method of item (2), the each of the marks has at least one shape selected from the group consisting of a square shape, a rectangular shape, and the square shape and the rectangular shape with one of chamfered corners, rounded corners and notched corners, and centroids thereof are positioned at the vertexes of the imaginary square.

(4) In the maskless exposure method of item (1), the substrate is used for manufacturing a display device, and the each of the marks are formed in a region outside a display region of the display device.

(5) In the maskless exposure method of item (1), the substrate is used for manufacturing a display device, and the set of marks are formed in a region inside a display region of the display device.

(6) A substrate to which the maskless exposure method of item (1) is applied, in which the set of marks are formed in a region outside a display region of the display device.

(7) A display device to which the maskless exposure method of item (1) is applied, in which the set of marks are formed in a region outside a display region of the display device.

(8) The maskless exposure method of any one of items (1) to (3), a distance between centroids of two marks that are opposed to each other so that an edge of each of the two marks is inclined by 45 degrees with respect to the first direction is measured based on measurement of a distance between edges of the two marks after the photosensitive resist film is developed, the measurement of the distance is based on image information enabling to observe the set of marks simultaneously; and the deviations between the pair of the scanning regions adjacent to each other in the first direction and in the second direction are measured based on a difference between the measured distance between the centroids and a distance between centroids of dimension information in instruction values of the set of marks, which is supplied to the projection optical system.

(9) The maskless exposure method of item (1), if the deviations between the pair of the scanning regions adjacent to each other are detected, a scanning drawing start timing of the projection optical system and a pitch feed width of the projection optical system in the second direction are corrected in accordance with the result of the detecting the deviations; and the deviations between the pair of the scanning regions adjacent to each other in the first direction and in the second direction are calibrated in next exposing.

(10) The maskless exposure method of item (1) or (8), marks are drawn on a center axis along the first direction in a plurality of the scanning regions by the projection optical system; coordinates of two points among the marks drawn by the same projection optical system are measured after the photosensitive resist film is developed; the deviation between the pair of the scanning regions adjacent to each other in the first direction is derived from a difference between a distance between the two points in the first direction and a distance in an exposure instruction value between the measured two points in the first direction; calibration data of a scanning start timing of the projection optical system are generated from the deviation between the pair of the scanning regions adjacent to each other in the first direction obtained in the measuring the coordinates; the deviation between the pair of the scanning regions adjacent to each other in the first direction are measured among the plurality of the scanning regions; measured values of the measured deviation in the first direction are averaged; the deviation between the pair of the scanning regions adjacent to each other in the first direction are derived; calibration data of the inclination of the projection optical system with respect to the first direction are generated from a difference between the deviation between the pair of the scanning regions adjacent to each other in the first direction obtained in the measuring among the plurality of the scanning regions and the deviation between the pair of the scanning regions adjacent to each other in the first direction obtained in the measuring the coordinates; and correcting the scanning start timing of the projection optical system and adjusting the inclination of the exposing light of the projection optical system with respect to the first direction based on each of the calibration data of the scanning start timing of the projection optical system and the calibration data of the inclination of the exposing light of the projection optical system.

(11) The maskless exposure method of item (1) or (8), marks on a photosensitive resist applied on a principal surface of the substrate are exposed by the projection optical system in vicinities of start points and end points of a first scanning region and a last scanning region. Coordinates are measured after developing the substrate. A scanning start timing of the projection optical system in the first direction and a pitch feed amount with respect to the second direction are adjusted so that coordinate deviations in the first direction and in the second direction become a predetermined value or smaller. The inclination of the projection optical system with respect to the first direction is adjusted so as to cancel relative deviations between the pair of the scanning regions adjacent to each other in the first direction that is a scanning direction.

(12) In the maskless exposure method of item (1) or (8), each of the set of marks is a square mark with sides having an inclination with respect to the first direction. The set of marks are drawn by supplying information to the projection optical system so that centroid positions of the two marks on the one side and centroid positions of the two marks on the another side with respect to the overlapping part are positioned at vertexes of an imaginary square having sides parallel to the first direction. At least one mark is drawn in addition to the two marks either between one of the set of marks or in a vicinity thereof with respect to the one side of the overlapping part. One of drawing, with respect to the another side of the overlapping part, at least one mark on positions having a positional relationship different from a positional relationship between the at least one mark added on the one side and the initial two marks and drawing no mark in addition to the initial two marks are performed.

(13) A maskless exposure method, including: placing a substrate with a photosensitive resist applied on a principal surface thereof on a stage having a rotation mechanism and a mechanism movable in a first direction and in a second direction perpendicular to the first direction; scanning, by a plurality of projection optical systems that are fixed above the principal surface of the substrate and are arranged at a constant interval in the second direction, the substrate in the first direction and exposing a predetermined pattern on the photosensitive resist on the substrate; shifting a scanning region in the second direction crossing the first direction after finishing the exposing the predetermined pattern in the scanning the substrate in the first direction, and exposing so that a pair of the scanning regions arranged side by side in the second direction have an overlapping part; forming at least one mark different from a circuit pattern on both sides of the overlapping part in the pair of the scanning regions so as to form a pair of marks on the photosensitive resist on the substrate by exposure using the plurality of projection optical systems; performing a developing process on the substrate after finishing the exposure; handling a set of measuring points as a measuring group, the measuring points being the pair of marks having the same coordinate in the first direction, in which a scanning region exposed earlier in a time sequence is exposed in the same manner and a scanning region exposed later is also exposed in the same manner; measuring relative deviations between the scanning regions in the first direction and in the second direction from a positional relationship between the pair of marks among the measuring points with respect to the measuring points belonging to the measuring group; setting angular deviations of the rotation mechanism of the stage as parameters, which are generated upon exposure of the scanning region exposed earlier and the scanning region exposed later in the measuring group, values of the angular deviations being common values among all the measuring points; computing a coordinate deviation due to the angular deviation of the scanning regions at each measuring point to determine amounts of the relative deviations between the scanning regions in the first direction and in the second direction at the measuring point from the computing; setting at least one set of the measuring groups; searching for a value of the angular deviation upon the exposure of the each scanning region in the measuring groups by changing a given value of the angular deviation of the each scanning region, so that a difference between measured data and a result of computation of the relative deviation between the scanning regions is decreased as a whole of the measuring points to compute the angular deviation when the scanning region is exposed; and performing angle correction on the stage so that the determined angular deviation of the stage is decreased when the measuring point of the measuring group is exposed.

(14) A maskless exposure method, including: placing a substrate with a photosensitive resist applied on a principal surface thereof on a stage having a rotation mechanism and a mechanism movable in a first direction and in a second direction perpendicular to the first direction; scanning, by a plurality of projection optical systems that are fixed above the principal surface of the substrate and are arranged at a constant interval in the second direction, the substrate in the first direction and exposing a predetermined pattern on the photosensitive resist on the substrate; shifting a scanning region in the second direction crossing the first direction after finishing the exposing the predetermined pattern in the scanning the substrate in the first direction, and exposing so that a pair of the scanning regions arranged side by side in the second direction have an overlapping part; forming at least one mark different from a circuit pattern on both sides of the overlapping part in the pair of the scanning regions so as to form a pair of marks on the photosensitive resist on the substrate by exposure using the plurality of projection optical systems; performing a developing process on the substrate after finishing the exposure; handling a set of measuring points as a measuring group, the measuring points being the pair of marks having the same coordinate in the first direction, in which a scanning region exposed earlier in a time sequence is exposed in the same manner and a scanning region exposed later is also exposed in the same manner, and further the scanning region exposed earlier and the scanning region exposed later are exposed by different projection optical systems disposed adjacent to each other; measuring relative deviations between the scanning regions in the first direction and in the second direction from a positional relationship between the pair of marks among the measuring points with respect to the measuring points belonging to the measuring group; setting angular deviations of the rotation mechanism of the stage as parameters, which are generated upon exposure of the scanning region exposed earlier and the scanning region exposed later in the measuring group, values of the angular deviations being common values among all the measuring points in each measuring group; setting relative deviation amounts in the first direction and in the second direction from a predetermined interval in the projection optical systems disposed adjacent to each other as parameters, being common values among the measuring points having the same coordinate in the second direction regardless of the measuring group, and adding the relative deviation amounts from the predetermined interval of the projection optical systems disposed adjacent to each other to a result of computing a coordinate deviation based on the angular deviation of the scanning regions at each measuring point so as to determine the relative deviation amounts of the scanning regions in the first direction and in the second direction at all the measuring points; setting at least one set of the measuring groups; searching for a value of the angular deviation upon the exposure of the each scanning region and a value of the relative deviation amount from the predetermined interval of the projection optical systems disposed adjacent to each other in the measuring groups by changing a given value of the angular deviation of the each scanning region and a given value of the relative deviation amount from the predetermined interval of the projection optical systems disposed adjacent to each other in the measuring groups so that a difference between measured data and a result of computation of the relative deviation between the scanning regions is decreased as a whole of the measuring points, to compute the angular deviation when the scanning region is exposed; and performing angle correction on the stage, mechanical arrangement adjustment of the plurality of projection optical systems, and correction on an exposure start timing in the first direction so that the determined angular deviation of the stage and an arrangement deviation of the plurality of projection optical systems are decreased when the measuring point of the measuring group is exposed.

(15) In the maskless exposure method of item (14), when a plurality of the measuring groups are set, at least one of the measuring groups is set at a position in a vicinity of a rotation center of the stage.

(16) In the maskless exposure method of item (14), when the relative deviation amounts in the first direction and in the second direction from the predetermined interval in the projection optical systems disposed adjacent to each other are set as the parameters, a measurement value of a deviation in the second direction of the measuring point in the measuring group set at a position in a vicinity of a rotation center of the stage is set to be an initial value.

(17) In the maskless exposure method of any one of items (14) to (16), when a plurality of the measuring groups are set, at least one of the measuring groups is set at a position in a vicinity of an edge of the substrate.

(18) In the maskless exposure method of any one of items (14) to (17), a difference between a measurement value of a deviation of the measuring point in the first direction in the measuring group set at a position in a vicinity of an edge of the substrate and a deviation of the scanning region in the first direction based on coordinates computed from an angular deviation parameter at the measuring point is set to be an initial value of the parameter of the relative deviation amount in the first direction from the predetermined interval in the projection optical systems disposed adjacent to each other.

(19) The maskless exposure method of any one of items (13) to (18), further including: mapping the stage angular deviation at the measuring point in the measuring groups determined by the maskless exposure method of any one of items (13) to (18) and the relative deviation amounts in the first direction and in the second direction at the measuring points determined in a computing process thereof for the measuring points; computing the stage angular deviation and the deviations in the first direction and in the second direction between the measuring points by interpolation or extrapolation from data of the measuring points; and controlling the stage so as to obtain an orbit that reduces the deviation upon the scanning from a design value based on the computing.

(20) An exposure pattern for monitoring a maskless exposure machine disposed above the substrate in the maskless exposure method of any one of items (13) to (19), including at least one mark different from a circuit pattern of a display device is exposed and formed on a photosensitive resist of the substrate on both sides of an overlapping part of a pair of scanning regions in the pair of scanning regions, in which: a plurality of the marks are arranged on an entire surface of the substrate in a grid-like manner including a plurality of rows each of which includes the marks having the same coordinate in the first direction and aligned in the second direction; and the marks are arranged at a position in a vicinity of a rotation center of the substrate and the stage, and a position in a vicinity of an edge of the substrate among the marks aligned in the second direction.

Note that the present invention is not limited to the structures described above, which can be modified variously within the scope of the present invention without deviating from the technical concept thereof. In addition, examples of the structures of the present invention other than those described above are clarified by the entire description herein and the attached drawings.

According to the maskless exposure method of the present invention, the drawing by the exposure apparatus can be monitored accurately without disturbing a flow of the production, and the calibrating data can be extracted from the monitored data, so as to perform the feedback of the calibrating data to the exposure apparatus.

In addition, according to the maskless exposure method of the present invention, the inclination of the stage, the exposure start timing and the arrangement of the projection optical system can be monitored accurately without disturbing a flow of the production, and the data for constituting the apparatus is extracted if necessary for the feedback thereof to the exposure apparatus.

Other effects of the present invention are clarified by the entire description herein.

BRIEF DESCRIPTION OF THE DRAWINGS

In the accompanying drawings:

FIG. 17 is an explanatory diagram illustrating another example of the conventional calibration method for the maskless exposure machine;

FIG. 21 is a diagram illustrating a method of registering a reference pattern and a shape of a mark for recognizing a measurement location accurately in an image by pattern matching when the line width measuring machine is used for measurement;

DETAILED DESCRIPTION OF THE INVENTION

Figure 1:
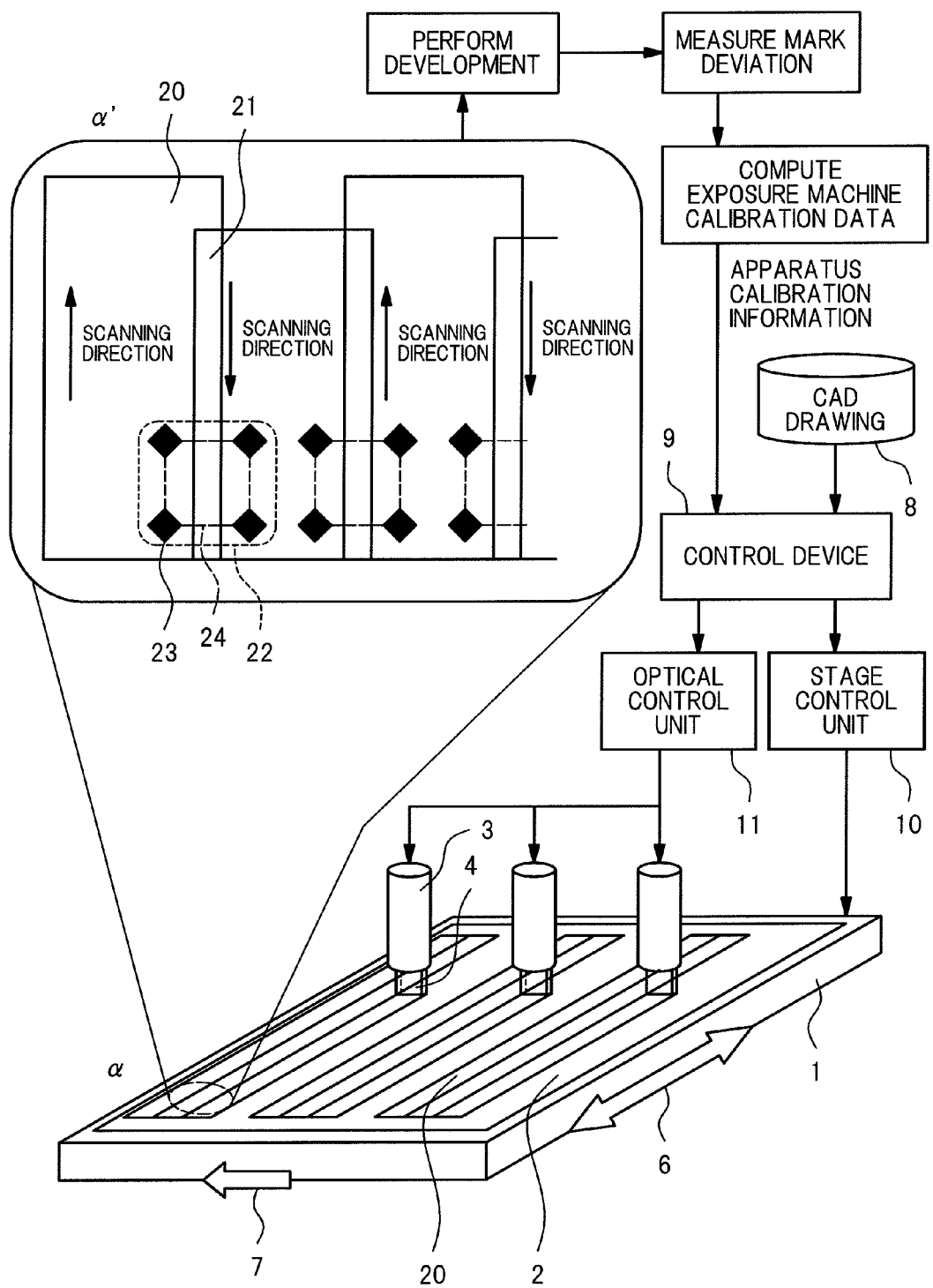
FIG. 1 is a schematic explanatory diagram illustrating a maskless exposure method according to an embodiment of the present invention.

Embodiments of the present invention are described with reference to the attached drawings. Note that the same or similar structural elements are denoted by the same reference numeral in the diagrams and the embodiments, and hence overlapping descriptions are omitted.

[First Embodiment]

FIG. 1 is a diagram illustrating a general outline of a maskless exposure method according to an embodiment of the present invention. In FIG. 1, the maskless exposure method includes entering information from CAD drawings 8 (hereinafter referred to as drawing information 8) in a control device 9 to burn an exposure pattern based on the drawing information 8 on a substrate 2 having a principal surface on which a photosensitive resist is applied.

The control device 9 sends control information to a stage control unit 10 so as to drive a stage 1 on which the substrate 2 with the applied photosensitive resist is fixed. The stage 1 is moved at a constant speed in a scanning direction 6 while exposing light 4 from a projection optical system 3 above the stage 1 is projected to have a band-like shape in which the width direction is perpendicular to the scanning direction. The scanning may be performed in one-directional manner or in a bidirectional manner. When the exposure of one line in a scanning region 20 is finished, the stage 1 is moved in a pitch feed direction 7 by a width a predetermined value smaller than the width of the exposing light 4, and the scanning is restarted. The reason why the stage 1 is moved by a width smaller than the width of the exposing light 4 is to avoid an occurrence of a gap between the scanning regions 20, which causes a discontinuity of wiring or the like. For this reason, the scanning regions 20 are scanned and drawn so as to form an overlapping drawing region 21 therebetween.

On the other hand, the control device 9 transmits drawing information to an optical control unit 11 so as to control the projection optical system 3 in synchronization with a motion of the stage 1. The linear exposing light 4 is turned on and off partially so that a pattern corresponding to the drawing information 8 is exposed on the substrate 2. As a light source of the exposing light 4, an ultraviolet light beam or an ultraviolet laser beam is used. A device such as a digital micromirror device (DMD) or a grating light valve (GLV) is used for turning on and off the exposing light 4 electrically and partially. A drawing head 3 keeps a constant space with respect to the substrate 2, and hence the exposing light 4 can focus on the substrate 2 correctly. As illustrated in FIG. 1, it is preferable to use a plurality of the projection optical systems 3 for shortening the process time if the substrate 2 has a large area. When the plurality of the projection optical systems 3 are used, a design space between the adjacent projection optical systems (space between heads) may have a constant value.

According to this method, a pattern can be exposed on the substrate 2 without using a mask. The exposure method using a mask can insure quality of the product by performing calibration using the mask as a reference of a dimension accuracy of the drawing. On the contrary, as to the maskless exposure method, quality of the product is deteriorated or varied unless a position of the projection optical system 3, an angle of the projection optical system 3 with respect to the scanning direction, speed variation, rectilinearity and positioning accuracy of the stage 1, drawing start timing, and a drawing magnification of the exposing light 4 (magnitude of width) are maintained to have high accuracy constantly. In addition, as an essential performance, the exposure machine is required to have high accuracy of alignment in the exposure process with accurate positioning with respect to a base layer.

In the first embodiment of the present invention, as illustrated in an enlarged view $\alpha'$ corresponding to a dot line circle a on the scanning regions 20 of the exposing light 4, a measurement portion 22 to be formed by four measuring marks 23 (measuring mark set) is drawn, whereby a deviation between the adjacent scanning regions 20 is measured. When the projection optical system 3 performs the exposure, two marks 23 that are different from a circuit pattern are formed in one of a pair of the scanning regions 20 while similar two marks 23 are formed in the other scanning region 20, which form a pair each (set 22). For instance, when the scanning region 20 is formed from the left to the right in FIG. 1, as for a pair of the scanning regions 20, a deviation of the two marks 23 in the right scanning region 20 with respect to the two marks 23 of the left scanning region 20 is detected. The exposed mark can be measured by performing a developing process 27 on a photosensitive resist formed on the principal surface of the substrate 2. Deviation amounts in the scanning direction 6 and in the pitch feed direction 7 are obtained from deviation measurement data obtained from the mark set 22, and the apparatus is calibrated based on the deviation amount.

Next, a method of measuring the deviation between the adjacent scanning regions 20 by using a line width measuring device is described with reference to FIGS. 2 and 3. The line width measuring machine is a device for measuring a line width or a distance between specific edges in accordance with an image obtained by a camera provided to the device, which is necessary for testing patterns of a flat panel display device (FPD). The line width measuring machine usually operates at higher speed than that of a length measuring machine for measuring coordinates of a mark on the substrate. In addition, the line width measuring machine having a high-grade function can measure relative deviations in the scanning direction 6 and in the pitch feed direction 7 between the scanning regions 20 by using two marks 23. In the first embodiment of the present invention, a principal objective is to use the line width measuring machine that is commonly used in the manufacturing site of the display device. Thus, additional cost can be reduced.

Figure 2:
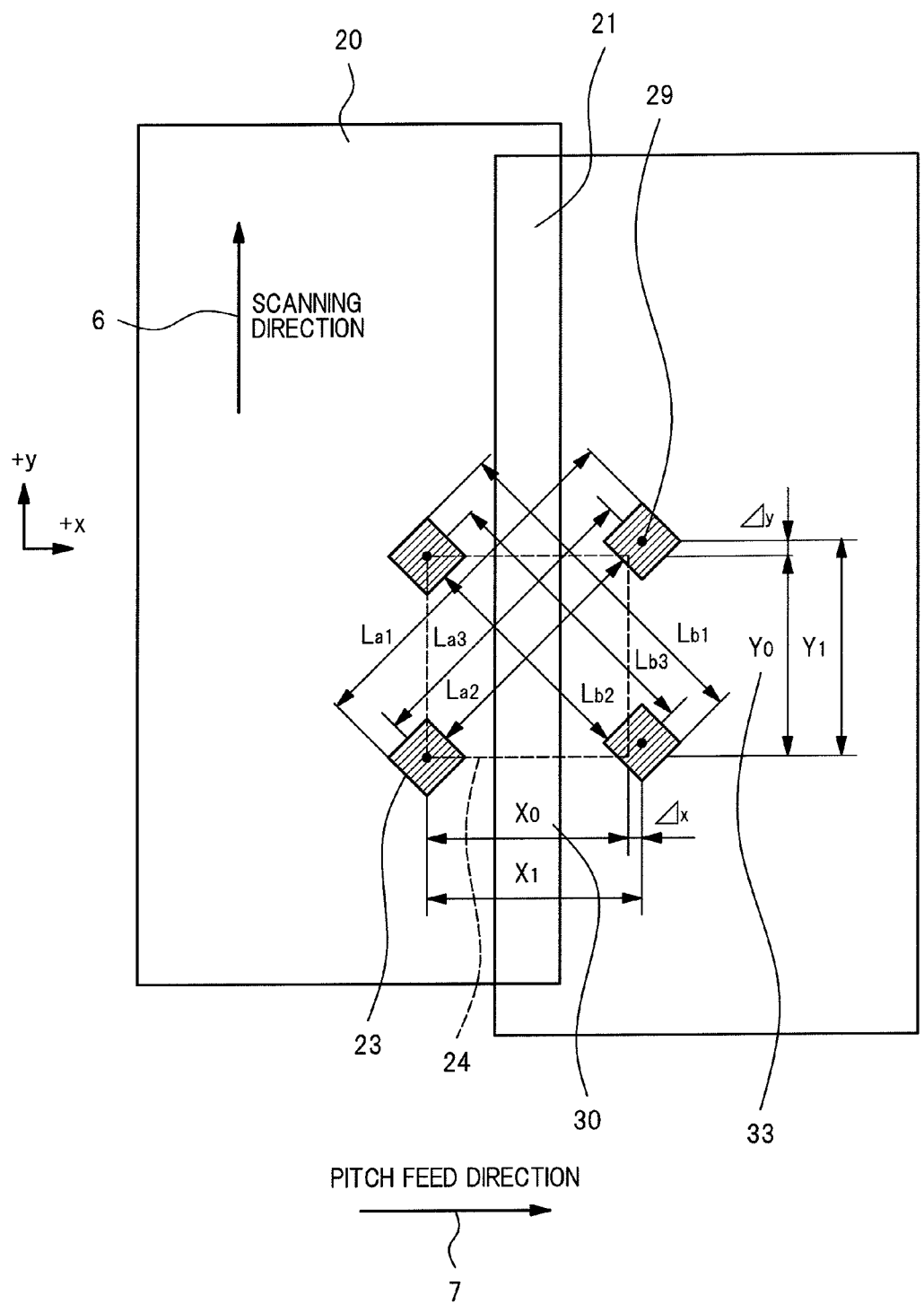
FIG. 2 is an explanatory diagram illustrating an example of a method of measuring a deviation between scanning regions by a line width measuring machine using a measuring mark set.
Figure 3:
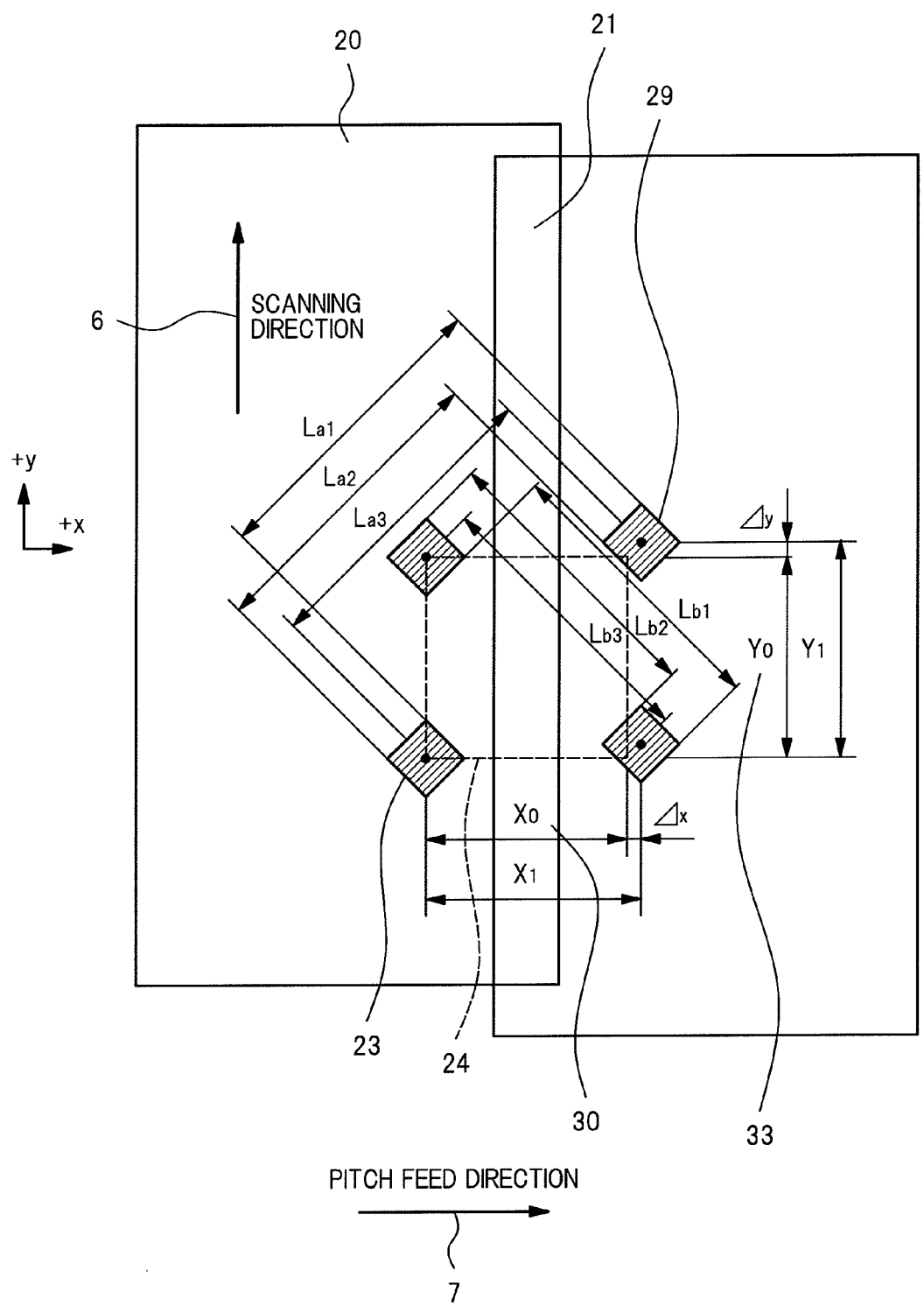
FIG. 3 is an explanatory diagram illustrating another example of the method of measuring a deviation between the scanning regions by the line width measuring machine using the measuring mark set.
Figure 4A:
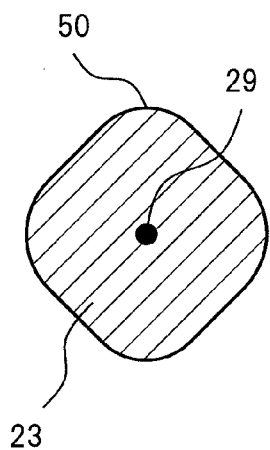
FIGS. 4A to 4E are explanatory diagrams illustrating examples of a measuring mark having shapes based on a square shape.
Figure 4B:
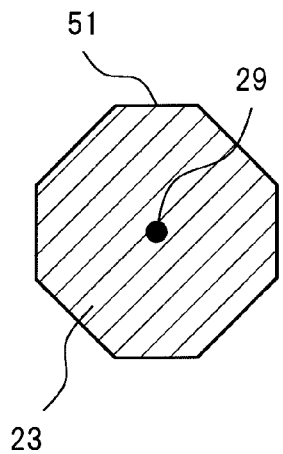
Figure 4C:
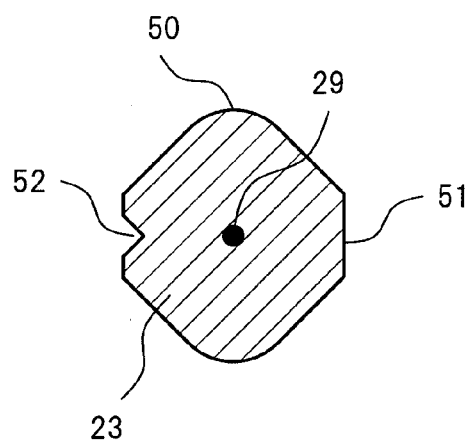
Figure 4D:
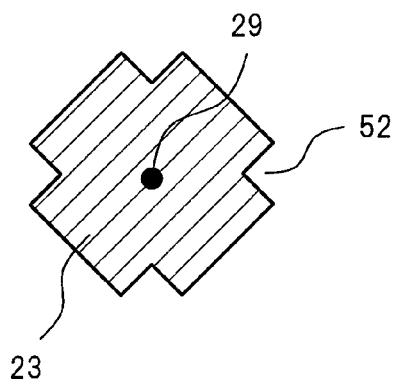
Figure 4E:
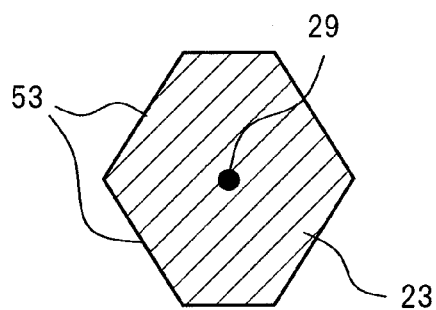

In FIGS. 2 and 3, the marks 23 have a square shape having sides inclined by 45 degrees with respect to the scanning direction 6. The square marks 23 are located outside the overlapping exposure region 21 and exposed by giving an instruction value to the projection optical system 3 so that centroids 29 of the square marks 23 are respectively located at vertexes of an imaginary square 24 having two sides that are parallel to the scanning direction 6. In the measurement after the developing process, the square marks 23 at the lower left and the upper right of FIG. 2 or 3 are grouped as a first group while the square marks 23 at the upper left and at the lower right are grouped as a second group, and distances $L_{a3}$ and $L_{b3}$ between the centroids of the marks are determined in the individual groups. In order to measure the distance between centroids by using a function of the line width measuring machine, distances $L_{a1}$ and $L_{a2}$ as well as distances $L_{b1}$ and $L_{b2}$ between edges of the squares as illustrated in FIG. 2 or 3 are measured, and the distance between centroids of the marks can be determined as an average of the distances, respectively. According to this measurement method, the distance between centroids of the marks can be measured without being affected by a reduction of the pattern due to a variation of the exposure condition.

Deviations in the pitch feed direction 7 and in the scanning direction 6 are computed as follows from the distance between centroids obtained as described above. Here, the pitch feed direction is referred to as an x direction while the scanning direction is referred to as a y direction. Considering ranges of trigonometric functions in a computing process, the computing process is performed with being divided into three cases illustrated in FIGS. 18A and 18B, FIGS. 19A and 19B, and FIGS. 20A and 20B.

In the computation below, a length of a side of the imaginary square 24 is denoted by L, a diagonal length of the imaginary square 24 is denoted by $d_0$, and differences between the instruction value and the distance between centroids are denoted by $\Delta d1 = L_{a3} - d_0$ and $\Delta d2 = L_{b3} - d_0$. In addition, positional deviation amounts of the mark in the x direction and in the y direction are denoted by $\Delta x$ and $\Delta y$, respectively.

Case 1: $L_{a3} = L_{b3} (\Delta y = 0)$ \hfill (1)

Figure 18A:
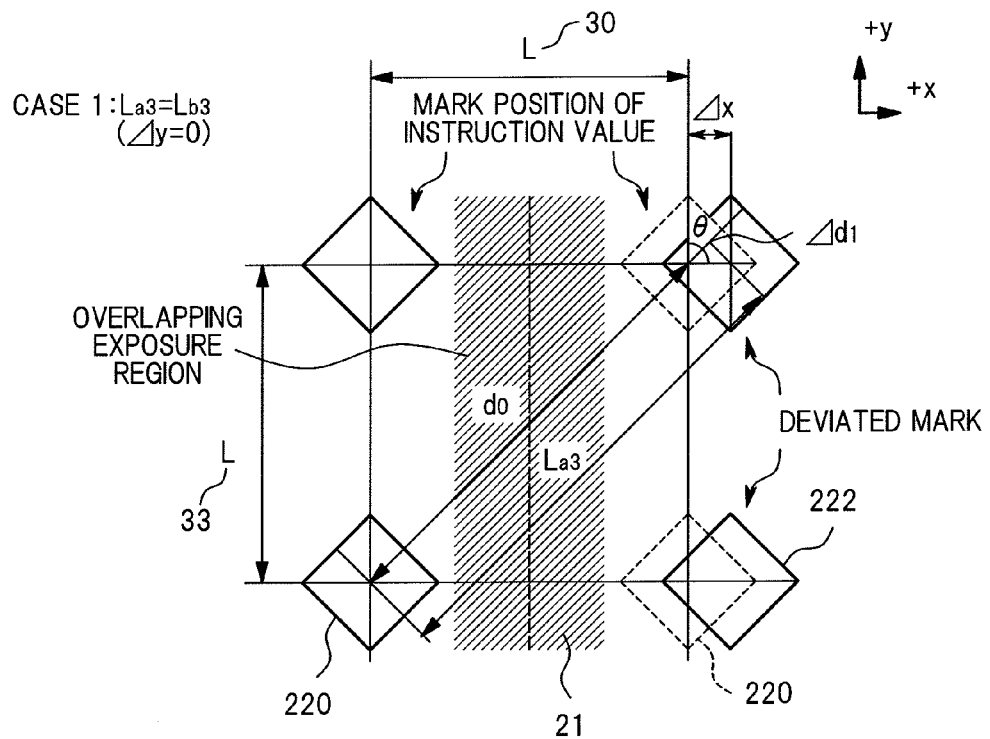
FIGS. 18A and 18B are diagrams illustrating geometrically a method of determining the deviation between the scanning regions from a distance between centroids at two points in the measuring mark set (Case 1)
Figure 18B:
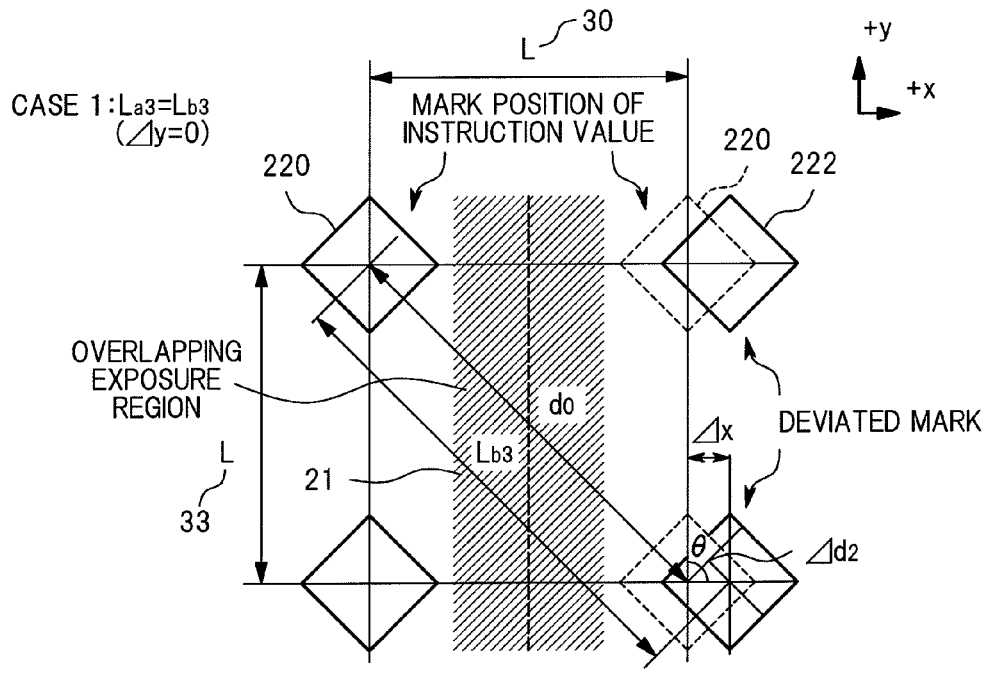

FIGS. 18A and 18B illustrate geometrical relationships. FIG. 18A illustrates a distance relationship between the lower left mark and the upper right mark among the four marks. FIG. 18B illustrates a distance relationship between the upper left mark and the lower right mark. A mark denoted by reference numeral 220 is a mark at a reference position while a mark denoted by reference numeral 222 is a mark deviated from the reference position. In addition, reference numerals 30 and 33 respectively denote lengths of sides of the imaginary square.

From the geometrical relationships in this case, $\Delta x$ and $\Delta y$ are computed by the equations below.

$$\Delta x = (L_{a3} - d_0)/\cos(\pi/4)$$

$$\Delta y = 0$$

Case 2: $L_{a3} > L_{b3} (\Delta y > 0)$ \hfill (2)

Figure 19A:
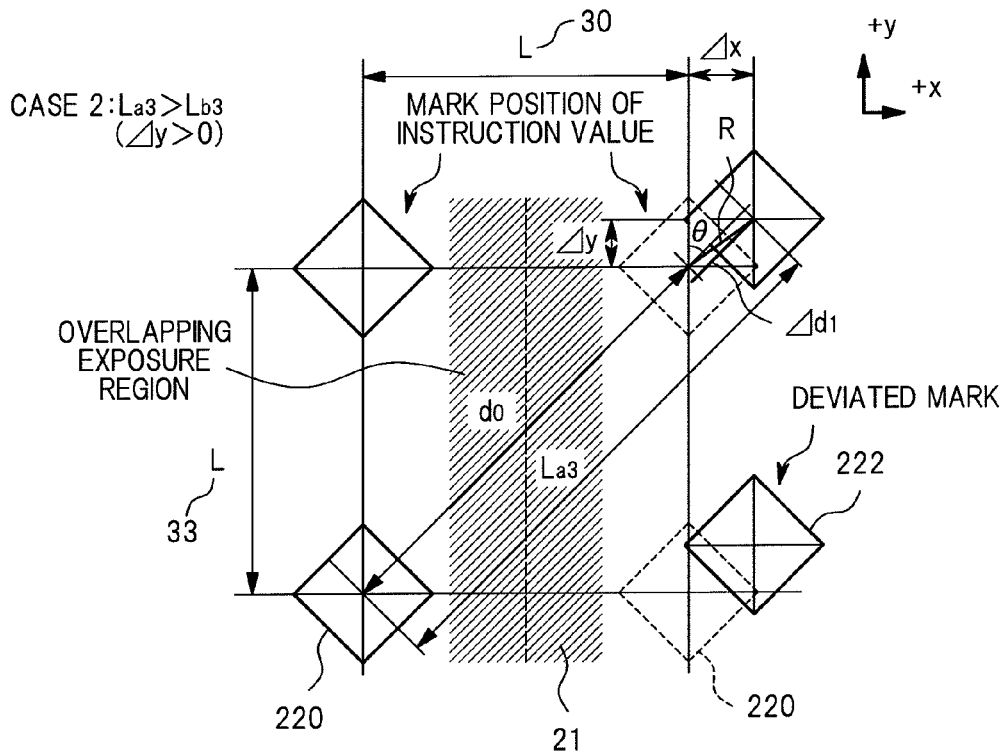
FIGS. 19A and 19B are diagrams illustrating geometrically a method of determining the deviation between the scanning regions from the distance between centroids at two points in the measuring mark set (Case 2)
Figure 19B:
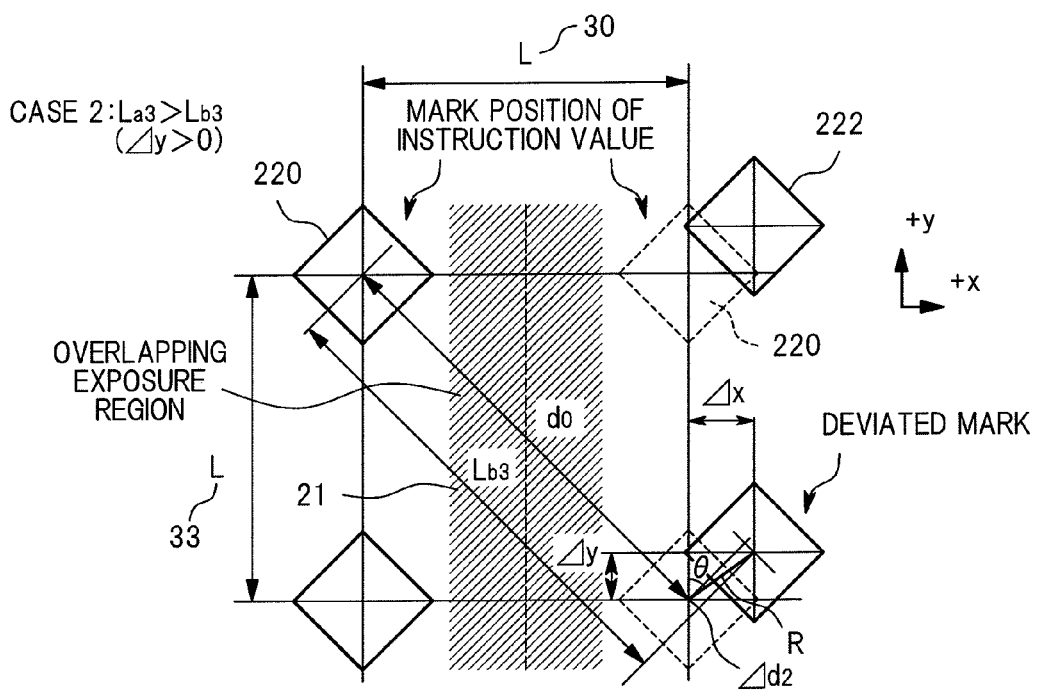

FIGS. 19A and 19B illustrate geometrical relationships. FIGS. 19A and 19B correspond to FIGS. 18A and 18B, respectively.

From the geometrical relationships in this case, $\Delta x$ and $\Delta y$ are computed by the equations below.

$$\Delta x = R \sin \theta$$

$$\Delta y = R \cos \theta$$

Here, R denotes a distance between the centroid of the mark at the reference position and the centroid of the mark at the position deviated from the reference position, and "$R = (\Delta d1^2 + \Delta d2^2)^{1/2}$" holds. Further, $\theta$ is an angle between a straight line connecting the centroid of the mark at the reference position with the centroid of the mark at the position deviated from the reference position and a straight line in the y direction.

Case 3: $L_{a3} < L_{b3} (\Delta y < 0)$ \hfill (3)

Figure 20A:
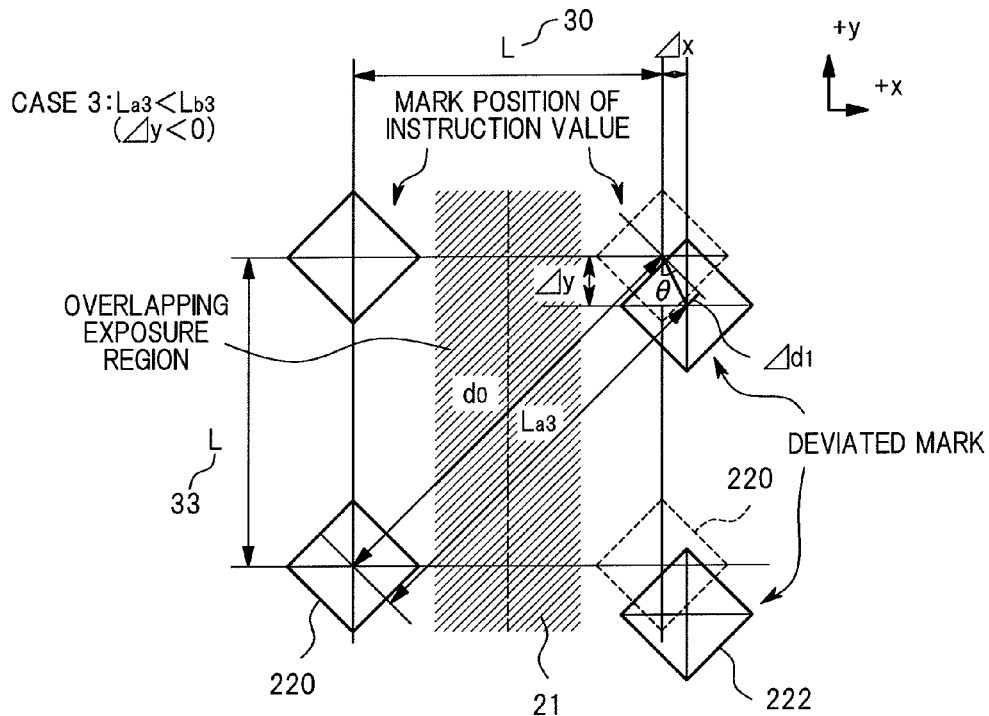
FIGS. 20A and 20B are diagrams illustrating geometrically a method of determining the deviation between the scanning regions from the distance between centroids at two points in the measuring mark set (Case 3)
Figure 20B:
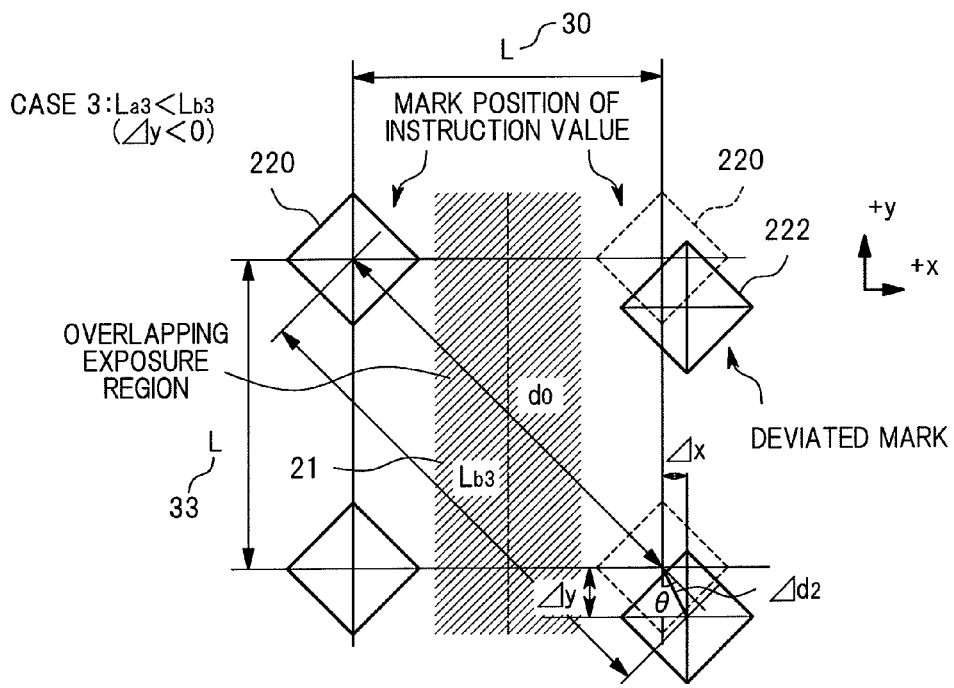

FIGS. 20A and 20B illustrate geometrical relationships. FIGS. 20A and 20B correspond to FIGS. 18A and 18B, respectively.

From the geometrical relationships in this case, $\Delta x$ and $\Delta y$ are computed by the equations below.

$$\Delta x = R \sin \theta$$

$$\Delta y = -R \cos \theta$$

In this way, edges of the squares located at the diagonal positions among the four squares are designated, and the distance therebetween is measured by the line width measuring device. Accordingly, deviations in the scanning direction and in the pitch feed direction 7 between the scanning regions 20 can be determined.

Figure 5:
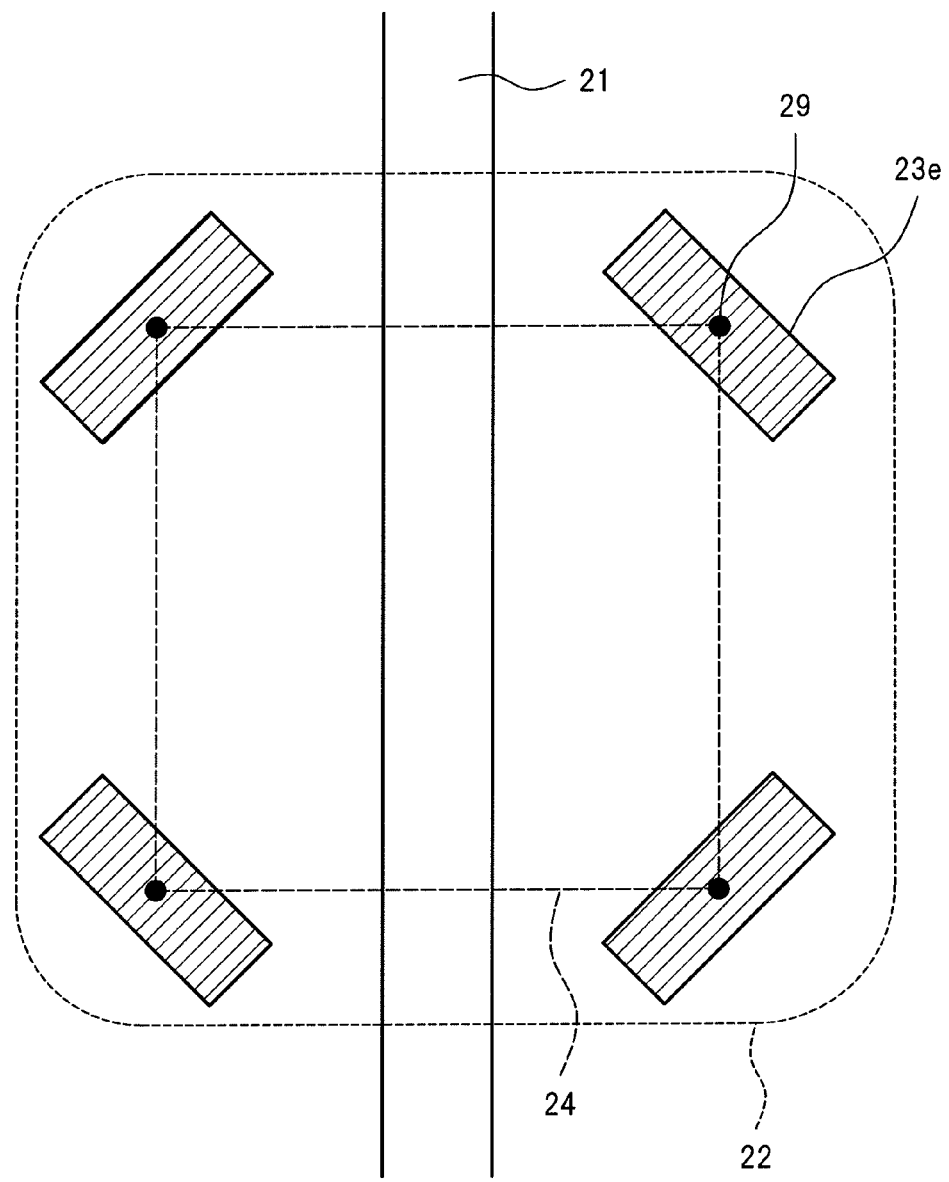
FIG. 5 is an explanatory diagram illustrating an example of the measuring mark having a rectangular shape.

As long as $L_{a3}$ and $L_{b3}$ can be measured by the line width measuring machine, the deviations described above can be measured even if a shape with rounded corners 50 of the square mark 23 (FIG. 4A), a shape with chamfered corners 51 thereof (FIG. 4B), a shape with notched corners 52 thereof (FIG. 4D), a shape with combined corners thereof (FIG. 4C), or a polygon having at least one set of parallel sides 53 facing each other (FIG. 4E) is applied as illustrated in FIGS. 4A to 4E. Therefore, the mark 23 may have the shape described above. In the polygon, the parallel sides facing each other are inclined with respect to the y direction. Further, if the deviation between the scanning regions 20 is large in the case of immediately after the facility is assembled or in other cases, a rectangular mark 23e may be used instead of the square as illustrated in FIG. 5. Also in this rectangular mark 23e, the shape of corners may be modified as illustrated in FIGS. 4A to 4E as long as there is no obstruction to the measurement.

When the line width measuring machine is used for the measurement, a search pattern may be registered. When the measurement is performed, matching of the registered search pattern is performed in the obtained image, whereby the position to be measured is grasped correctly so that the measurement between the marks is performed. In this case, if the measuring mark sets 22 as illustrated in FIG. 1 are registered as the search pattern, an error may occur in the pattern searching when a deviation occurs between the scanning regions 20, which causes a trouble in the measurement. Further, if only one square mark 23 is registered as the search pattern, a trouble may occur because there exist other three marks 23 having the same shape.

Figure 22:
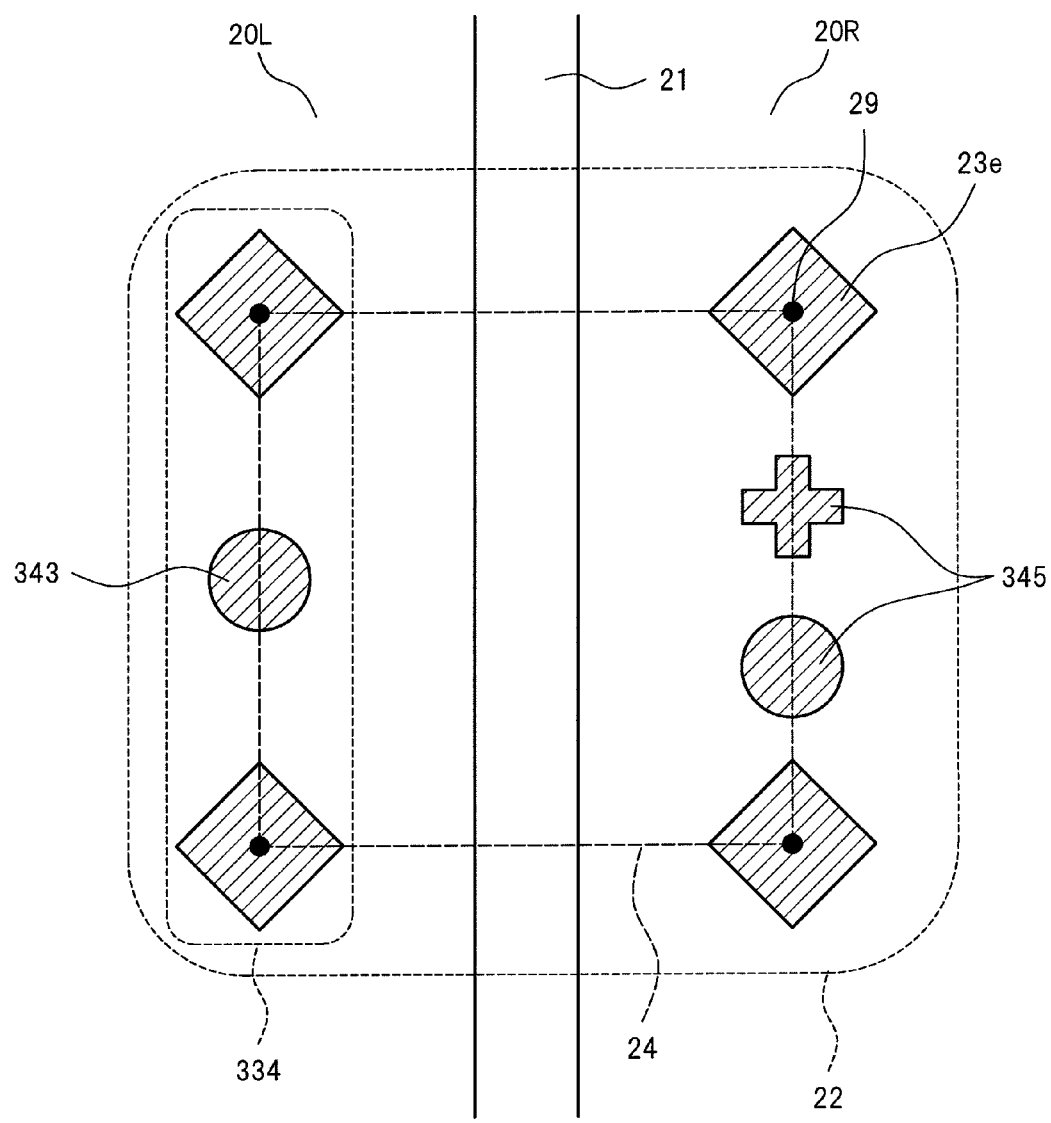
FIG. 22 is a diagram illustrating a method of registering a reference pattern and a shape of the mark for recognizing the measurement location accurately in the image by pattern matching when the line width measuring machine is used for the measurement.

In this case, it is preferable to draw an auxiliary pattern in the vicinity of the four square patterns as illustrated in FIGS. 21 and 22. If a left scanning region 20L is the reference for the measurement as illustrated in FIG. 21, for example, an additional mark 343 for pattern register is drawn between the square patterns in the left scanning region, whereby a set of this mark 343 and the two square patterns 23e in the scanning region 20L is registered as a search pattern 344. Thus, it is possible to distinguish the two square patterns 23e located in the left scanning region 20L and the right scanning region 20R. The additional mark 343 for pattern register is drawn in the scanning region 20 to be the reference in FIG. 21, but it is possible that the region without the mark 343 is the reference. The mark 343 is drawn in one of the scanning regions in FIG. 21. However, the purpose is to enable to distinguish between the square mark 23e in the left scanning region 20L and the square mark 23e in the right scanning region 20R, and hence a mark 345 different from the mark 343 located in the left scanning region 20L may be drawn in the vicinity of the square mark 23e in the right scanning region 20R, for example, as illustrated in FIG. 22, to obtain the same effect. To sum up, if the same pattern or similar patterns to the search pattern 344 are not observed in the left and right scanning regions 20 in the image when the measurement is performed, it is possible to prevent occurrence of an error in the measurement.

If the measuring mark sets 22 described above are provided to positions immediately after the scanning starts, a middle position of the scanning, and an end position of the scanning in the scanning region, it is possible to observe tendencies of the deviations due to a scanning start timing, speed variation of the stage, and yawing of the stage. Those tendencies can be observed in more detail by further decreasing the interval between the measuring mark sets 22. Immediately after the exposure machine is assembled, a pattern of the measuring mark sets 22 with decreased interval is exposed for the single purpose of adjustment, whereby the adjustment can be performed with high accuracy.

[Second Embodiment]

If a pattern of a display device to be a product is exposed for monitoring a normal state of an exposure machine, the measuring mark sets 22 may also be exposed at the same time. Then, the measurement described above can be performed when a line width of a pattern of the product is measured. According to this method, the exposure machine can be monitored without exposing the test substrate at a constant lot interval or without offline measurement, and hence it is possible to insure accuracy of the exposure machine, which has been a bottleneck in the maskless exposure method.

Figure 6:
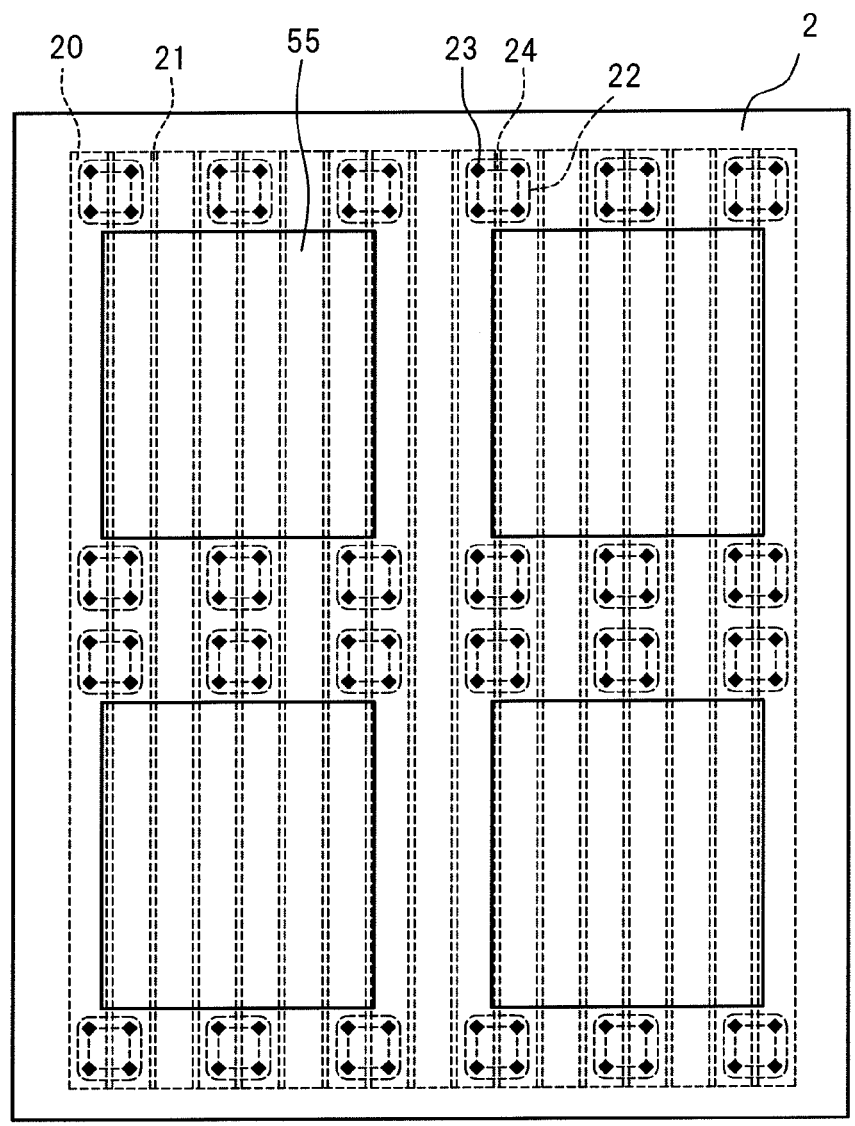
FIG. 6 is a diagram illustrating an example of arranging the measuring marks outside a display region of a display device in a manufacturing process of the display device.
Figure 7:
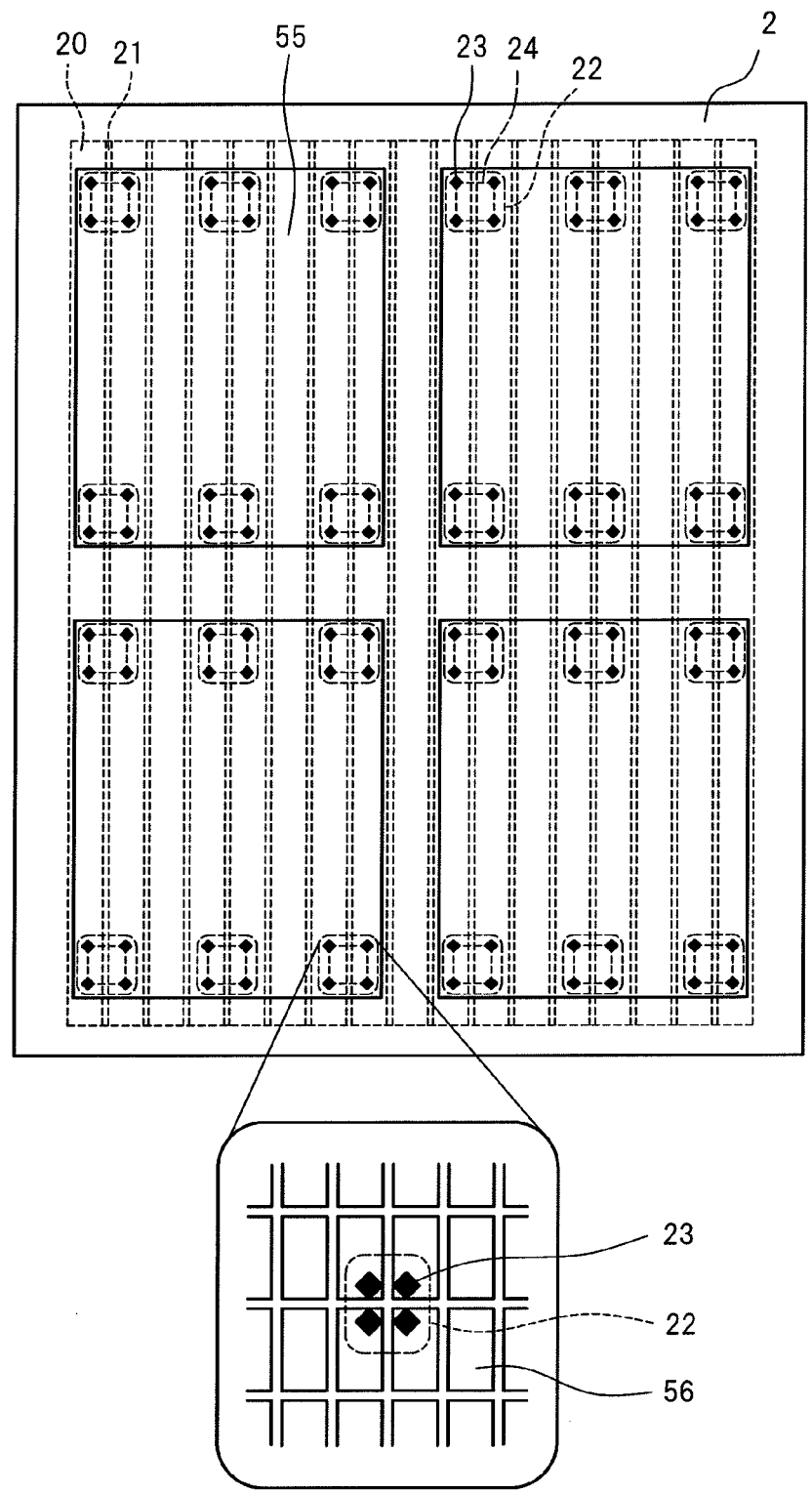
FIG. 7 is a diagram illustrating an example of arranging the measuring marks inside the display region of the display device in the manufacturing process of the display device.

As to the position in which the measuring mark set 22 is provided when the pattern of the display device to be the product is exposed, there are two possible methods. One is the method involving providing the measuring mark set 22 outside a pattern of a display region of a display device 55 as illustrated in FIG. 6. Another is the method involving providing the measuring mark set 22 in the pattern inside the display region 55 as illustrated in FIG. 7. Concerning a fine product such as a mobile phone, the method involving providing the measuring mark set 22 outside the pattern of the display region of the display device 55 as illustrated in FIG. 6 is convenient. In contrast, concerning a display device used for a large screen television set or the like, the measuring mark set 22 may be provided inside a pixel 56 as illustrated in FIG. 7 because an area of the pixel 56 is large. In addition, the measuring mark set 22 is another one different from the pattern of the display device in the above-mentioned description, but it is possible to design the pattern so that the measuring mark set 22 is incorporated in a part of an electrode pattern or a transistor pattern. The measuring mark set 22 can be used not only for monitoring for daily management of a state of the maskless exposure machine but also for quality control of display devices manufactured by using the maskless exposure machine. The following effect can also be obtained. If a failure such as display unevenness or the like occurs in the display device, it is possible to inspect later whether or not the failure is caused by the maskless exposure machine by checking the measuring mark set 22 for measuring the deviation between the scanning regions described above.

In this way, by utilizing the deviation measurement data between the mark sets 22 as calibration data for the maskless exposure machine, maintenance and management of performances of the apparatus can be performed. If the exposing light 4 from the projection optical system 3 is perpendicular to the scanning direction 6, the calibration can be performed simply regarding the deviation in the x direction as a deviation in the pitch feed direction 7 and regarding the deviation in the y direction as a scanning start timing in the scanning direction 6.

[Third Embodiment]

Figure 8A:
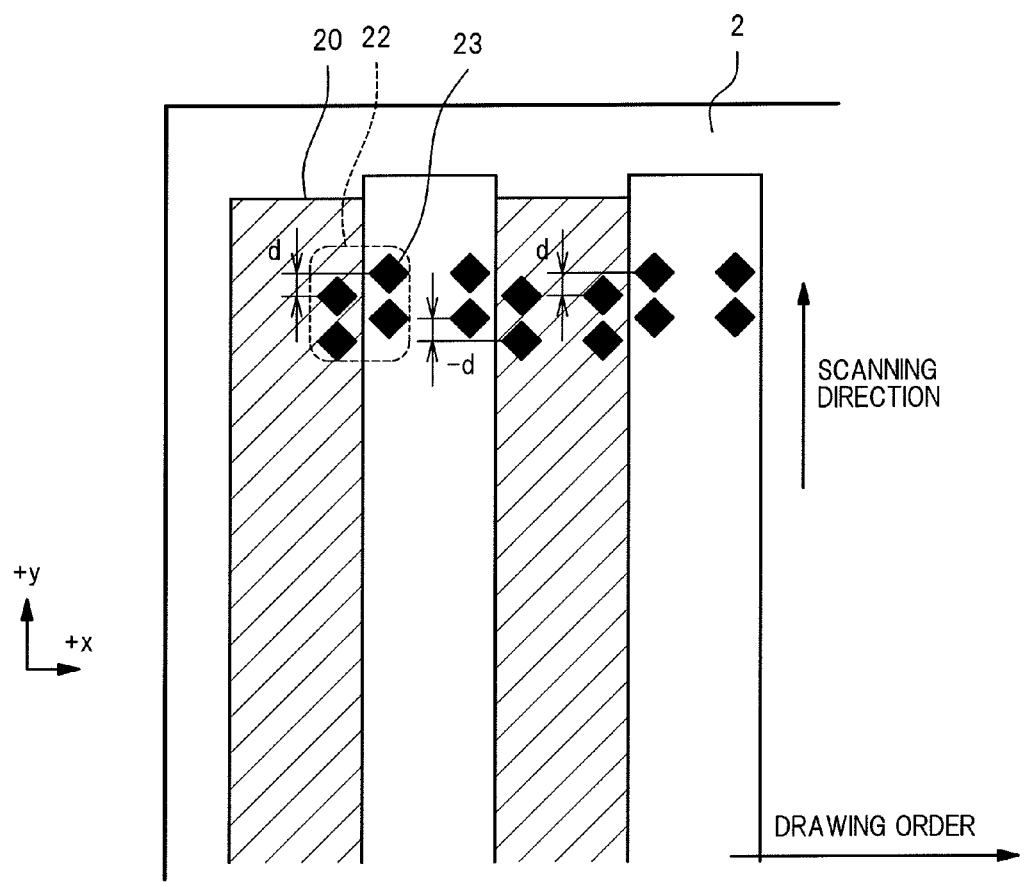
FIGS. 8A and 8B are explanatory diagrams illustrating a tendency of a result of a measured deviation in a scanning direction in a case where a periodical scan timing shift occurs.
Figure 8B:
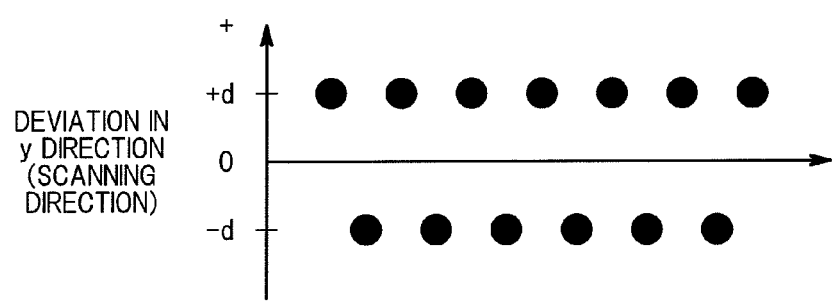

FIGS. 8A, 8B, 9A, 9B and 10 illustrate examples of a basic manner of the deviation in the y direction (scanning direction 6) and the deviation detected from the measuring mark sets 22. FIGS. 8A and 8B illustrate the case where the scanning regions 20 are deviated alternately (see FIG. 8A), whereby measurement values are obtained alternately as d, −d, d, −d, . . . (see FIG. 8B). In this case, the deviation can be canceled by converting any one of an odd scanning start timing and an even scanning start timing into a length to thereby adjusting d.

Figure 9A:
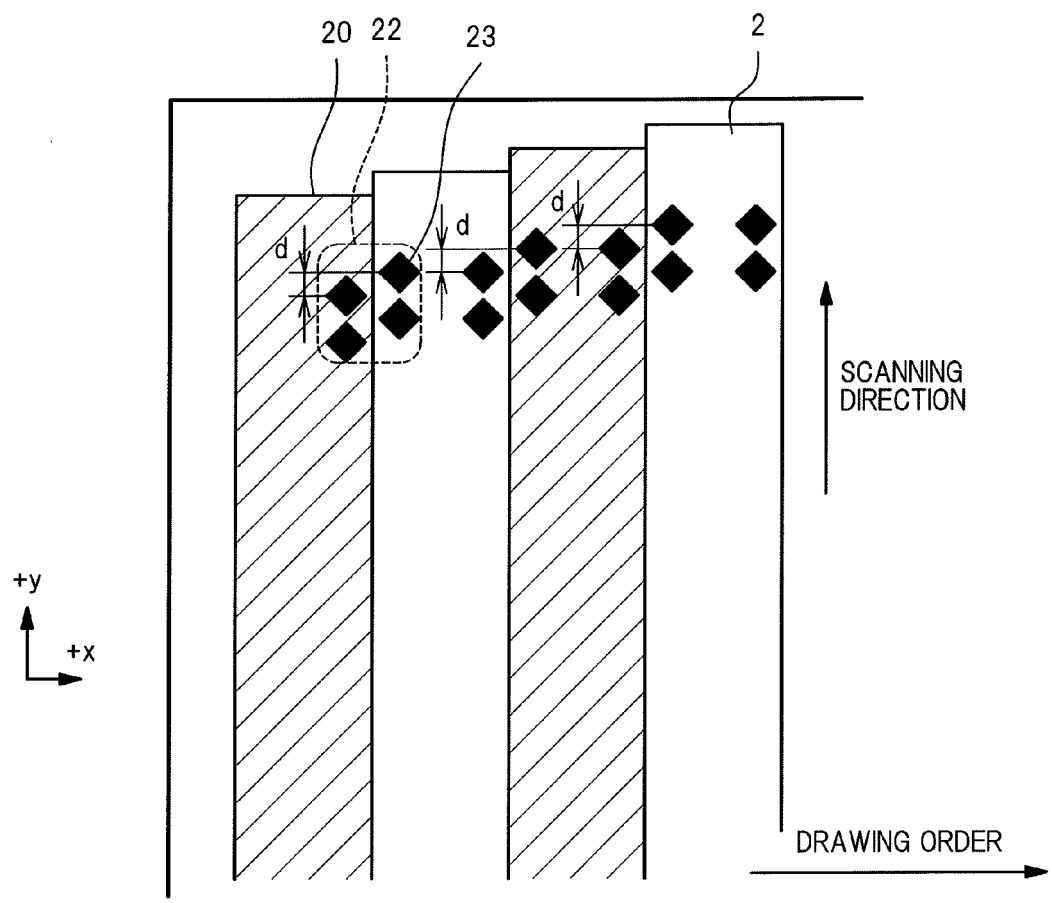
FIGS. 9A and 9B are explanatory diagrams illustrating a tendency of the result of the measured deviation in the scanning direction in a case where a scan timing shift in the same direction occurs.
Figure 9B:
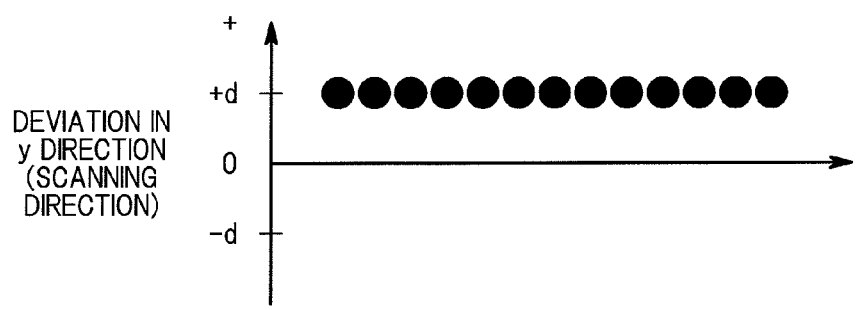
Figure 10:
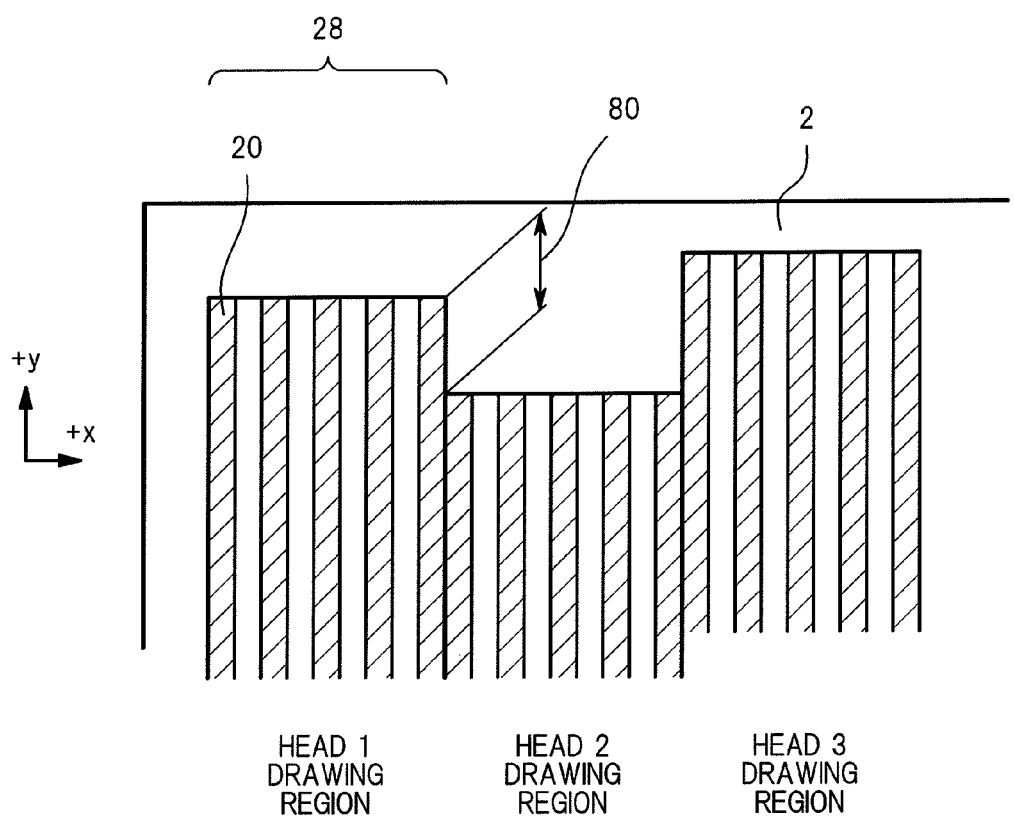
FIG. 10 is an explanatory diagram illustrating the deviation in the scanning direction generated in each projection optical system when a plurality of projection optical systems are used.

FIGS. 9A and 9B illustrate the case where the scanning regions 20 are exposed so as to have a step d each from the left to the right in FIG. 9A, for example (see FIG. 9A), and a deviation amount in the scanning direction is constant (see FIG. 9B). In this case, a constant amount of the shift of the scanning start timing is generated in the case of one-directional scanning, and the shift can be adjusted by shifting the scanning start timing by a constant period of time each. In the case of bidirectional scanning, it is considered, for example, that the odd scanning start timing leads by d/2 on the length basis while the even scanning start timing lags by d/2 on the length basis with respect to the instruction value. In accordance with the lead or the lag, the scanning start timing is adjusted so that the deviation can be canceled. If the area of the substrate is large and a plurality of the projection optical systems 3 are used, a step 80 may occur between areas (head drawing regions) handled by the individual projection optical systems 3 as illustrated in FIG. 10 because of a mechanical mounting error of the projection optical system or the shift of the scanning start timing (deviation between heads in the scanning direction). However, the step 80 can also be measured by using the measuring mark sets 22 for measuring the deviation between the scanning regions 20 as described above, and based on a result of the measurement, the adjustment can be performed mechanically or electrically so that the scan timings become uniform.

However, when the marks are provided to the first scanning region and the n-th scanning region, for example, to measure a difference between errors of the two measured mark coordinates from the instruction value, a clear difference larger than the measurement error may be generated between the difference and a result of summing up the deviations between the scanning regions 20 by using the measuring mark sets 22. Such the difference may occur in the case where a mechanically adjusted state of the apparatus is not perfect or in the case where a mechanical trouble has occurred.

In the x direction, if a width of the exposing light 4 in the pitch feed direction is not equal to a previously specified value, an error occurs between coordinates even if the feed pitch accuracy is adjusted. As to the x direction, after an error in the pitch feed direction 7 is corrected, the difference between errors of the two measured mark coordinates from the instruction value and the deviation as a result of summing up the deviations between the scanning regions 20 by using the measuring mark sets 22 are computed, and a difference therebetween per one scanning region width is used as an adjustment amount of the width of the exposing light 4 so that the width of the exposing light 4 can be corrected.

Figure 11A:
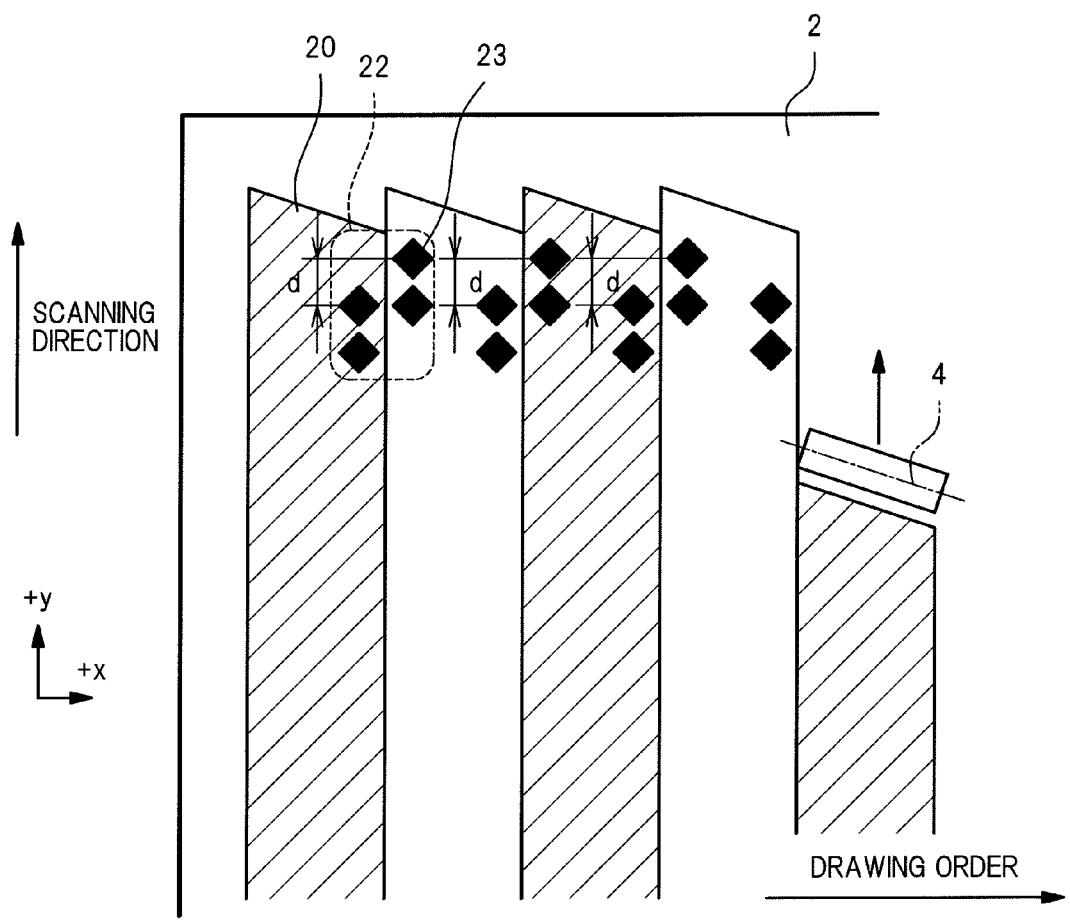
FIGS. 11A and 11B are explanatory diagrams illustrating a tendency of the deviation in the scanning direction measured to be an exposed state in a case where an inclination of the projection optical system occurs with respect to the scanning direction.

In the y direction scanning, if the projection optical system is inclined with respect to the scanning direction 6, the exposing light 4 may not be perpendicular to the scanning direction 6 (see FIG. 11A). In this case, the deviation in the y direction of the measuring mark for measuring the deviation between the scanning regions 20 described above is always d (see FIG. 11B). This state can be regarded as the state illustrated in FIG. 9 for adjusting the scan timing so that the deviation between the scanning regions 20 can be canceled. However, when the marks are provided to the first scanning region and the n-th scanning region to perform the coordinate measurement therebetween, and a difference between y coordinates of the two marks is compared between the measurement value and the instruction value, the difference becomes larger than that before the adjustment and is deteriorated. Therefore, in order to finish the adjustment in short period of time, it is necessary to determine whether the difference is caused by the inclination of the exposing light 4 or by the shift of the scanning start timing.

Figure 12:
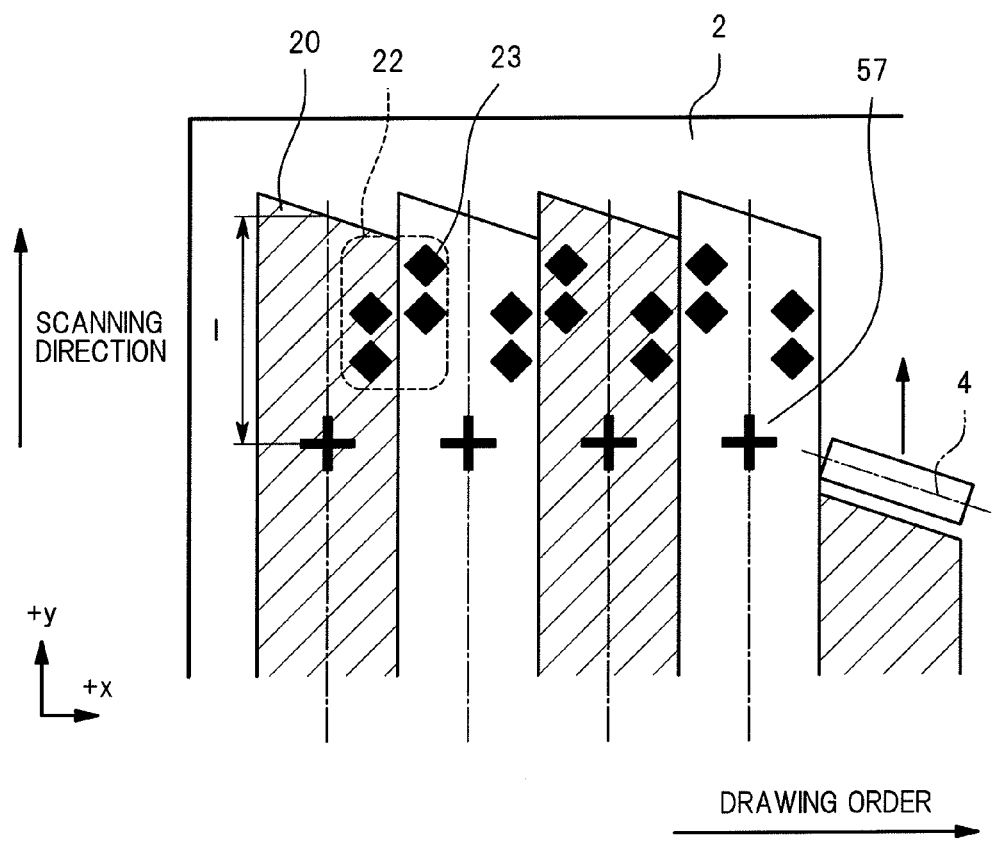
FIG. 12 is an explanatory diagram illustrating a method of setting marks for detecting an inclination angle of the projection optical system.

Therefore, as illustrated in FIG. 12, it is preferable to expose marks 57 for detecting the coordinates on center lines in the scanning region 20 respectively, which is parallel to the scanning direction 6. The positions of the marks 57 on the center lines are constant in the scanning direction. By performing both the coordinate measurement of the marks 57 and the measurement of the measuring mark sets 22 between the scanning regions 20 after the developing process, the inclination of the exposing light 4 and the shift of the scanning start timing can be separated from each other.

Hereinafter, with reference to FIGS. 13A and 13B, the method involving separating the inclination of the exposing light 4 from the shift of the scanning start timing is described.

Figure 13A:
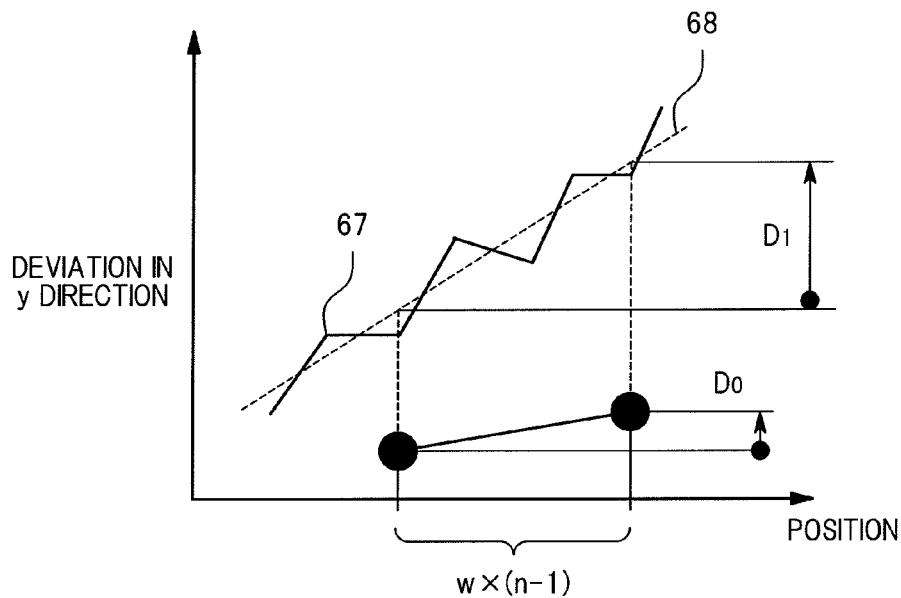
FIGS. 13A and 13B are explanatory diagrams illustrating a method of detecting the inclination angle of the projection optical system using a coordinate measurement in combination.
Figure 13B:
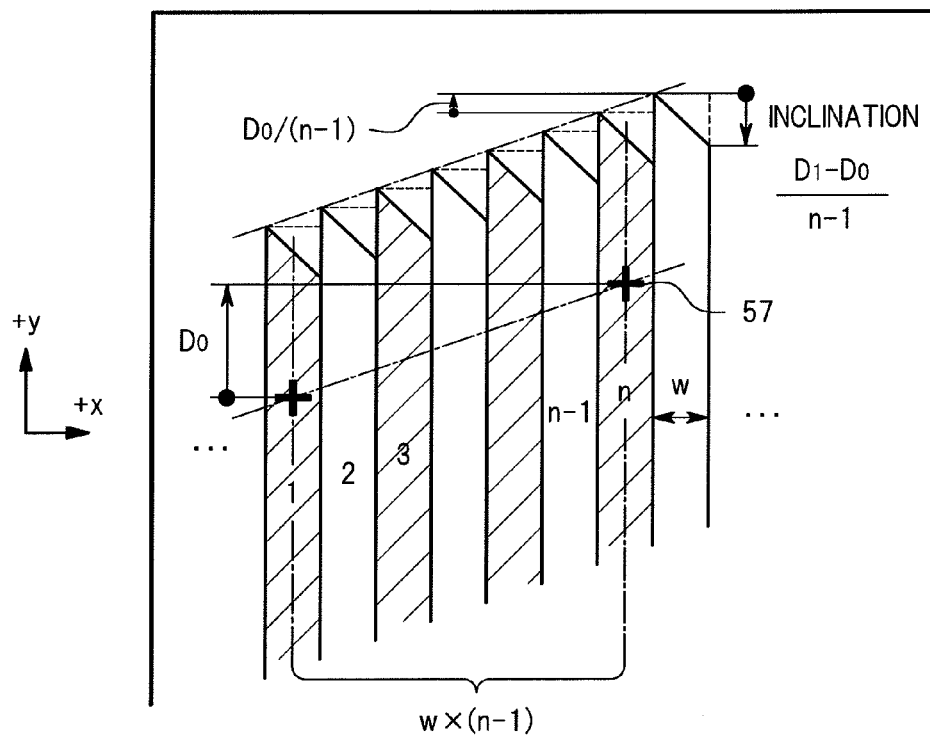

FIG. 13A illustrates accumulation of the deviation between the scanning regions 20 formed in parallel with each other and the shift of the scanning start timing, and FIG. 13B illustrates the individual scanning regions 20 together with the coordinate measuring marks 57. In FIG. 13B, the coordinates of the coordinate measuring marks 57 in the first and the n-th scanning regions 20 are measured by the length measuring machine, and the difference between the coordinates in the y direction is determined. The coordinate of each of the coordinate measuring marks 57 in the y direction is exposed to be constant, and hence the deviation $D_0$ therebetween in the y coordinate can be regarded as the accumulation of the scanning start timing shift in w×(n−1) that is the width of (n−1) scanning start regions. An average value of the accumulation is used as a correction amount of the shift of the scanning start timing for the adjustment. In order to improve accuracy of the adjustment, it is preferable to perform the measurement of the coordinates by selecting a plurality of sets of the coordinate measuring marks 57 and to calculate the correction amount by averaging the measured values. Next, the deviations of the mark sets 22 for measuring the deviation between the scanning regions are measured by using the line width measuring machine, and a result of the measurement of the deviations in the scanning direction is accumulated during the first to n-th scanning regions 20. FIG. 13A illustrates an example of a state of the accumulation. A line 67 showing a change in accumulation of the deviations between the scanning regions does not become a straight line because of a measurement error or the like. Therefore, for instance, an approximate line 68 is determined by the method of least squares or the like, and the calibration data of the inclination of the exposing light 4 is computed based on the approximate line 68. When the accumulation of the deviations during the first to n-th scanning regions 20 is denoted by $D_1$, the component of the inclination of the exposing light 4 becomes $D_1-D_0$ because the accumulation of the scan timing shift during the period is $D_0$. Therefore, the inclination of the exposing light 4 per one scanning region 20 is determined as $(D_1-D_0)/(n-1)$, whereby the inclination can be adjusted.

Figure 14:
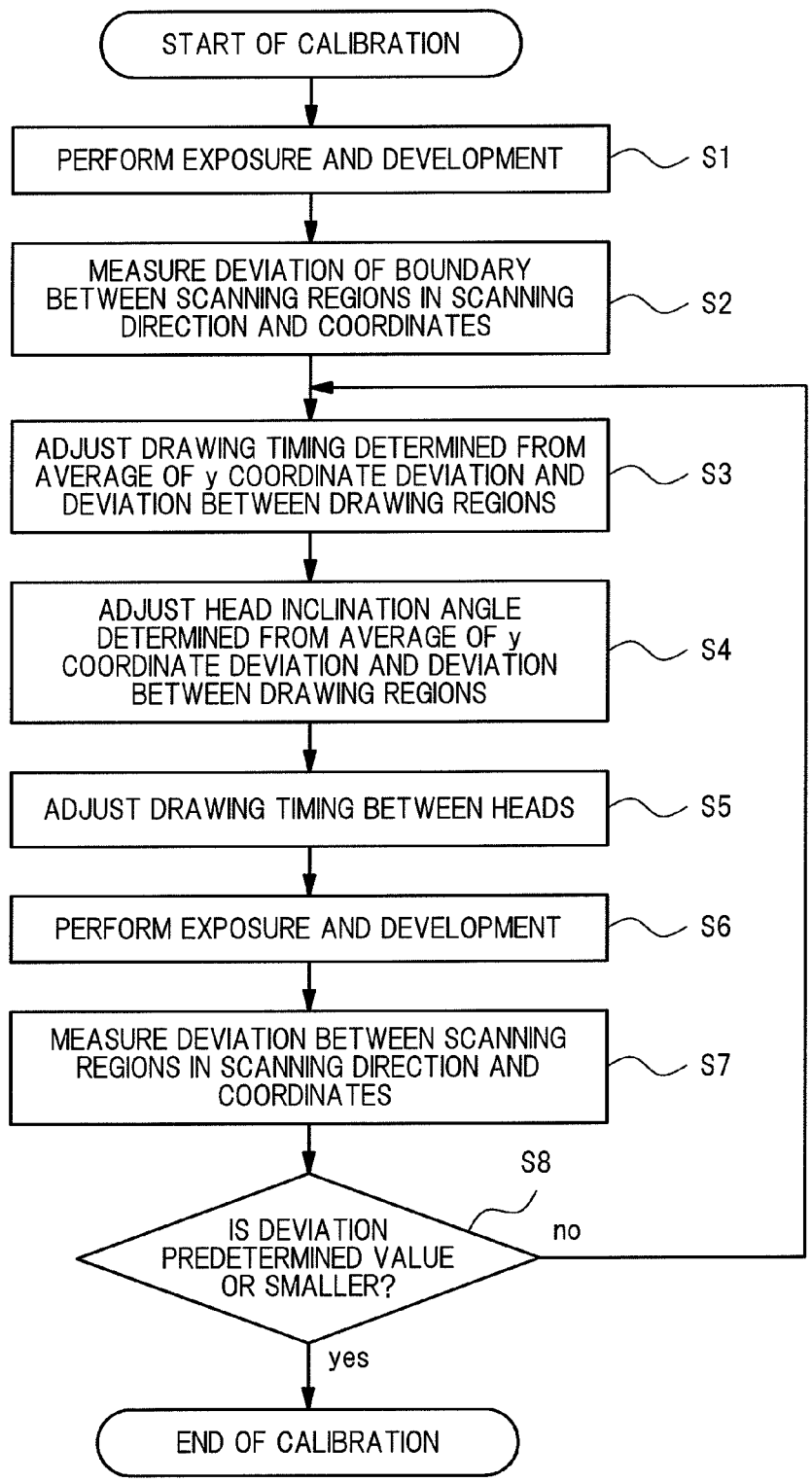
FIG. 14 is a flowchart illustrating a method of adjusting the inclination angle of the projection optical system using the coordinate measurement in combination.

FIG. 14 illustrates a flowchart of a job using the method illustrated in FIGS. 13A and 13B. In FIG. 14, exposure and development are performed (Step S1), and the deviations of a boundary between the scanning regions in the scanning direction and the coordinates are measured (Step S2). After that, an average value of the deviations of the coordinate measuring marks in the y coordinate and the deviations between the drawing regions 20 are determined, and the drawing timing is determined from the average value and is adjusted (Step S3). Further, ahead inclination angle is adjusted (Step S4). After that, the drawing timing between the heads is adjusted (Step S5), whereby the exposure and the development are performed (Step S6). Then, the deviations between the scanning regions in the scanning direction are measured, and the coordinate measurement is performed (Step S7). It is decided whether or not the deviations are smaller than a predetermined value (Step S8). If the deviations are a predetermined value or smaller, the calibration is finished. If the deviations are not smaller than the predetermined value, the process goes back to Step S3.

This correction is performed for each projection optical system 3. If a plurality of the projection optical systems 3 are provided, the adjustment is performed based on deviation data between the projection optical systems 3 similarly to the case of the deviations between the scanning regions 20 that is determined as described above in the x direction and in the y direction between the projection optical systems 3 adjacent last. After the adjustment, the test pattern is newly exposed on the substrate on which the photosensitive resist is applied. After the developing process, the measurement is performed again so as to check whether or not the deviations are improved.

Figure 11B:
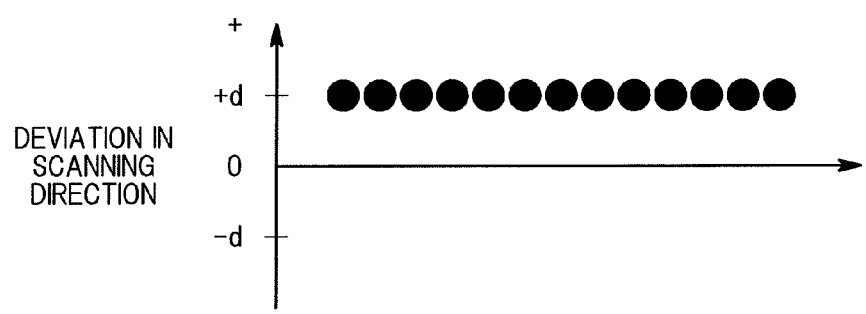
Figure 15:
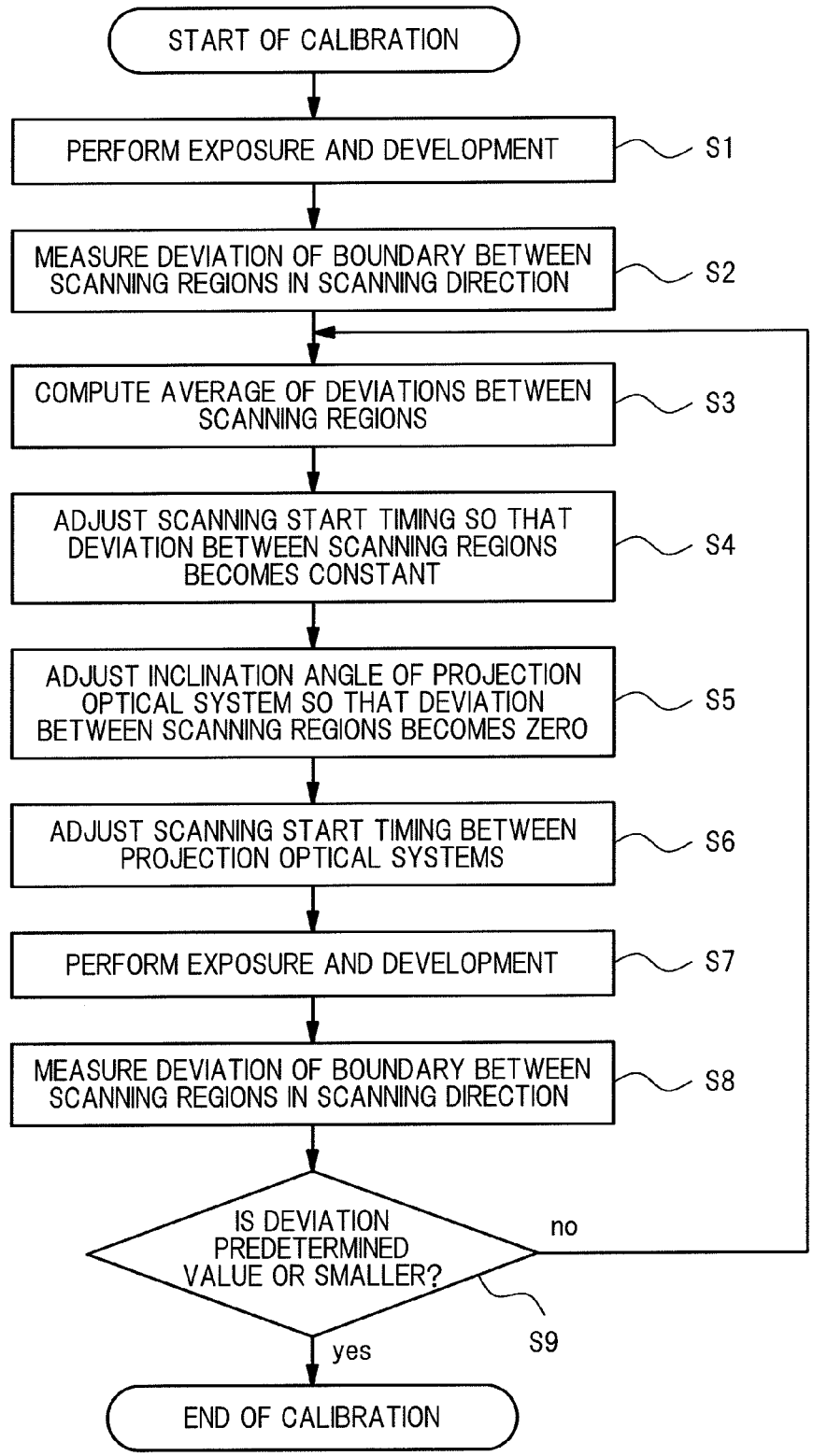
FIG. 15 is a flowchart illustrating a method of adjusting the inclination angle of the projection optical system without using the coordinate measurement in combination.
Figure 16:
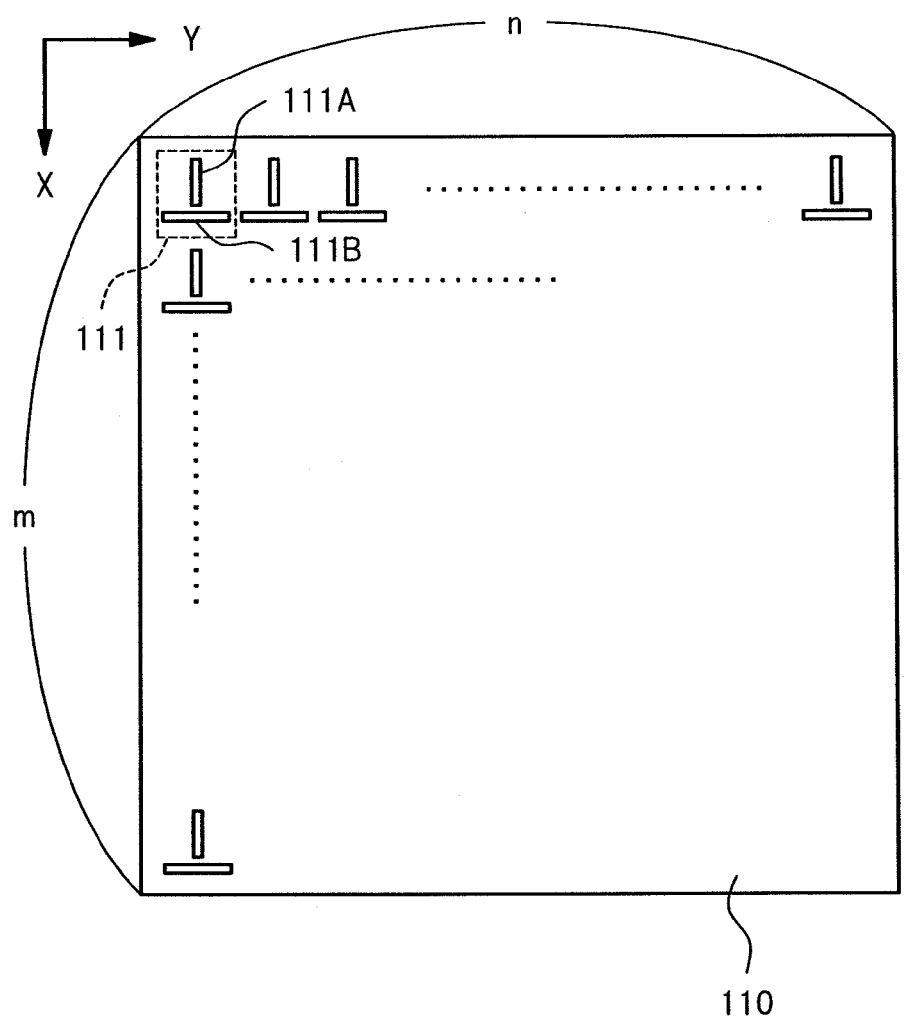
FIG. 16 is an explanatory diagram illustrating an example of a conventional calibration method for a maskless exposure machine.

Further, if it can be regarded that the coordinate deviation and the deviations between the scanning regions 20 are generally small, it is possible to perform the calibration only by measurement of the measuring mark sets 22 for measuring the deviations between the scanning regions 20 without performing the measurement of the coordinate measuring marks 57. A flowchart of this job is illustrated in FIG. 15. Specifically, in FIG. 15, exposure and development are performed first (Step S1), and the deviation in the scanning direction at the boundary between the scanning regions is measured (Step S2). After that, an average value of the deviations between the scanning regions is computed (Step S3), and the scanning start timings are adjusted so that the deviations between the scanning regions become constant (Step S4). After that, the inclination angle of the projection optical system is adjusted so that the deviations between the scanning regions become zero (Step S5). Further, the scanning start timing is adjusted between the projection optical systems (Step S6). After that, the exposure and the development are performed (Step S7), and the deviations between the scanning regions in the scanning direction are measured (Step S8). Then, it is decided whether or not the deviation is smaller than a predetermined value (Step S9). If the deviations are a predetermined value or smaller, the calibration is finished. If the deviations are not smaller than the predetermined value, the process goes back to Step S3. As clarified by this flowchart, after the measurement between the scanning regions 20, the scanning start timings are adjusted to be uniform among the individual scanning regions 20 as illustrated in FIGS. 11A and 11B, and the inclination of the exposing light 4 is corrected.

Further, if the adjustment of the maskless exposure machine illustrated in FIG. 1 is performed in the flowchart illustrated in FIG. 14 or 15, the deviation data obtained by the measuring method may be converted by the above-mentioned method into the calibration data of the scanning start timing, a pitch feed amount, the width adjustment of the exposing light 4, and the position adjustment and the inclination of the projection optical system 3 with respect to the maskless exposure machine, and means for correcting them may be provided so that a system for automatically maintaining and managing performances can be established.

[Fourth Embodiment]

Figure 23:
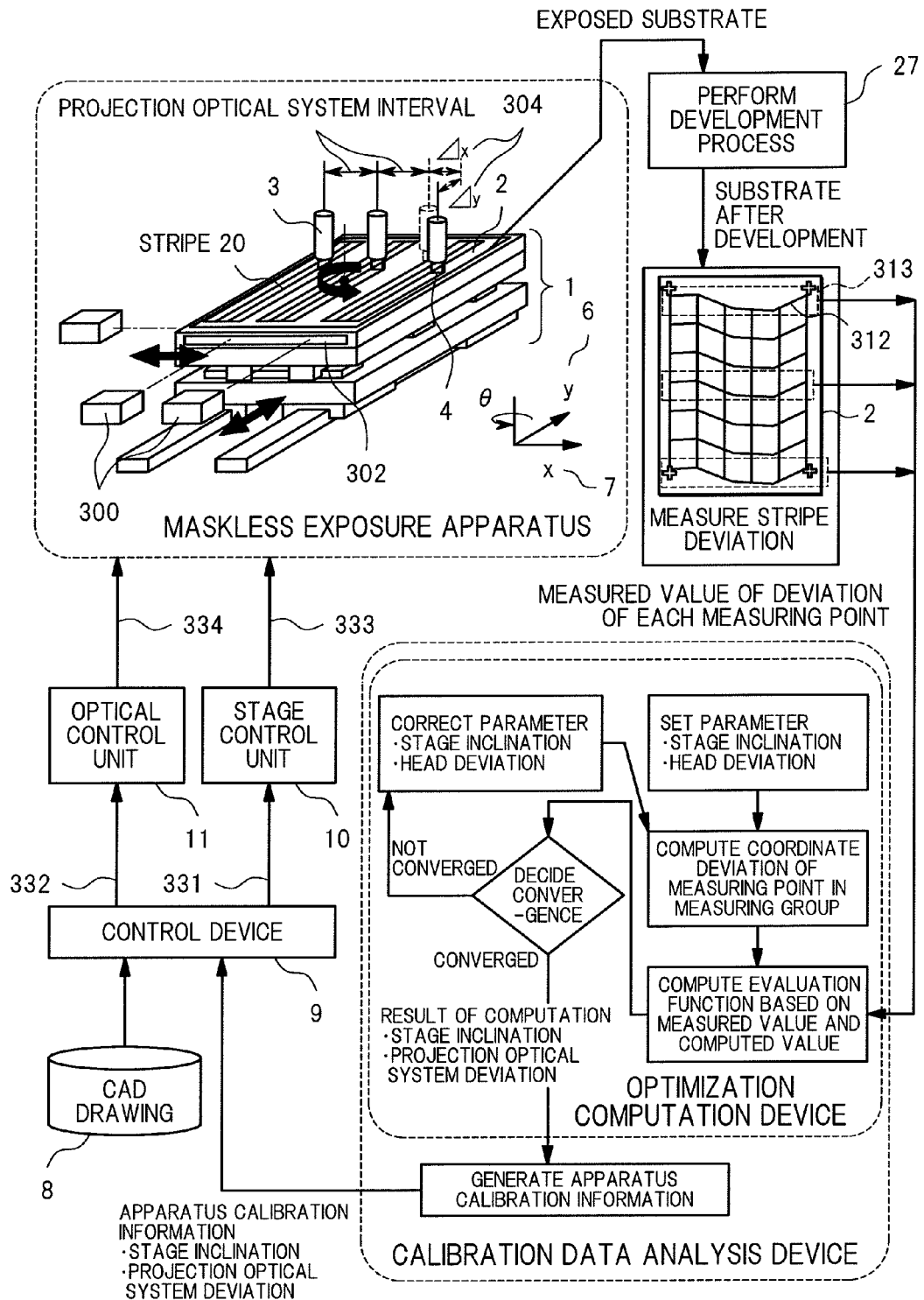
FIG. 23 is a diagram illustrating a maskless exposure method according to the fourth embodiment of the present invention.

With reference to FIG. 23, a general outline of the maskless exposure method according to a fourth embodiment of the present invention is described. In this maskless exposure method, the drawing information (exposure pattern information) 8 obtained by a CAD system is entered in the control device 9, the optical pattern based on the drawing information 8 is formed on the substrate 2 having the principal surface on which the photosensitive resist is applied, and a predetermined pattern is exposed on the photosensitive resist film that is applied on the principal surface of the substrate 2.

The control device 9 sends stage control information 331 to the stage control unit 10 so as to drive the stage 1 by a stage drive signal 333. The substrate 2 applied with the photosensitive resist is fixed on the stage 1. In FIG. 23, the substrate 2 on the stage 1 is moved in the scanning direction 6 (hereinafter referred to as y direction) at a constant speed while the projection optical system 3 disposed above the stage 1 projects the band-like exposing light 4 that is perpendicular to the y direction 6. The scanning may be any one of one-directional scanning and bidirectional scanning.

When the exposure of the scanning region 20 of one line is finished, the substrate 2 on the stage 1 is moved in the pitch feed direction 7 (hereinafter referred to as x direction) by a width a predetermined value smaller than the width of the exposing light 4, and the scanning is restarted. In order to avoid an occurrence of a gap between the scanning regions 20, which causes a discontinuity of wiring or the like, the pitch feed in the x direction is performed by a predetermined amount that is smaller than the width of the exposing light 4.

In other words, the scanning exposure is performed while forming the overlapping exposure region 21.

On the other hand, the control device 9 transmits optical system control information 332 to the optical control unit 11, so as to control the projection optical system 3 via a projection optical system drive signal 334 in synchronization with the motion of the stage 1. Further, the control device 9 turns on and off the linear exposing light 4 partially so that a pattern corresponding to the drawing information 8 is exposed on the substrate 2. As a light source of the exposing light 4, an ultraviolet light beam or an ultraviolet laser beam is used. Further, a device such as a digital micromirror device (DMD) or a grating light valve (GLV) is used for turning on and off the exposing light 4 electrically and partially. The projection optical system 3 keeps a constant space with respect to the substrate 2, whereby the exposing light 4 can focus on the substrate 2 correctly. It is preferable to use a plurality of the projection optical systems 3 for shortening the process period of time.

When the exposure is finished, a developing process 27 is performed on the photosensitive resist film on the principal surface of the substrate 2, and the unnecessary photosensitive resist is removed to thereby obtain the desired pattern. In the fourth embodiment of the present invention, the pattern of the photosensitive resist at that process or a pattern in the state where the photosensitive resist has been removed after etching a lower layer film of the photosensitive resist in the post-process is detected, whereby the deviation of the scanning region is detected.

The exposure method using a mask can insure quality of the product by performing calibration using the mask as a reference of a dimension accuracy of the pattern. On the contrary, as to the maskless exposure method, quality of the product is deteriorated or varied unless a position accuracy and an angle with respect to the scanning direction are maintained to have high accuracy constantly for the projection optical system 3, and unless speed variation, straightness, inclination in the exposure process, positioning accuracy, exposure start timing, and a magnification (magnitude of width) of the exposing light 4 are maintained to have high accuracy constantly for the stage. In addition, as an essential performance, the exposure machine is required to have high accuracy of alignment in the exposure process with accurate positioning with respect to a base layer. In this embodiment, the inclination of the stage in the exposure process, relative deviation between adjacent scanning exposure regions or the exposure timing shift is analyzed based on a result of the measurement of the deviation between the scanning regions.

Figure 27:
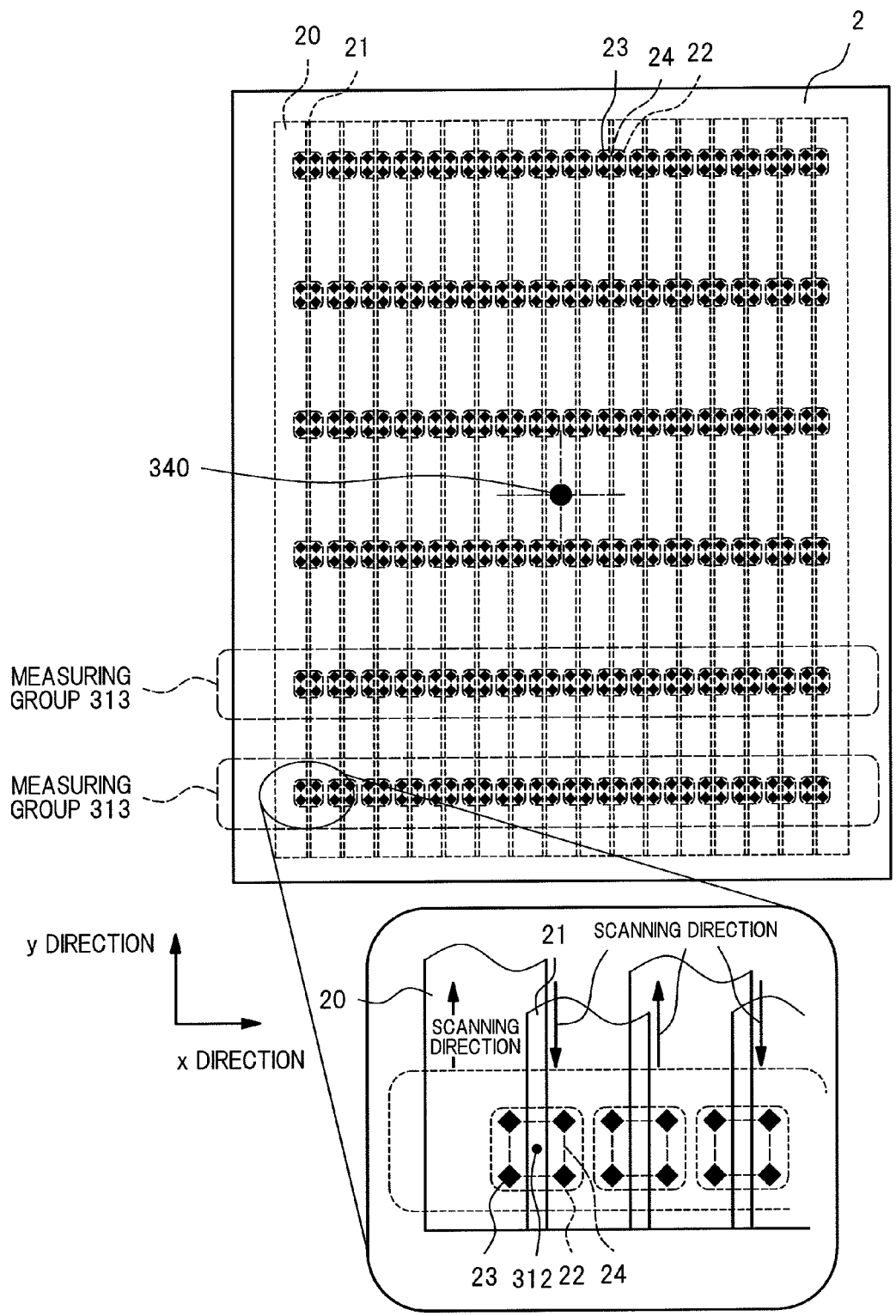
FIG. 27 is a diagram illustrating an example of an exposure pattern for detecting the inclination of the stage and the deviation of the projection optical system used in the maskless exposure method according to the fourth embodiment of the present invention.
Figure 28:
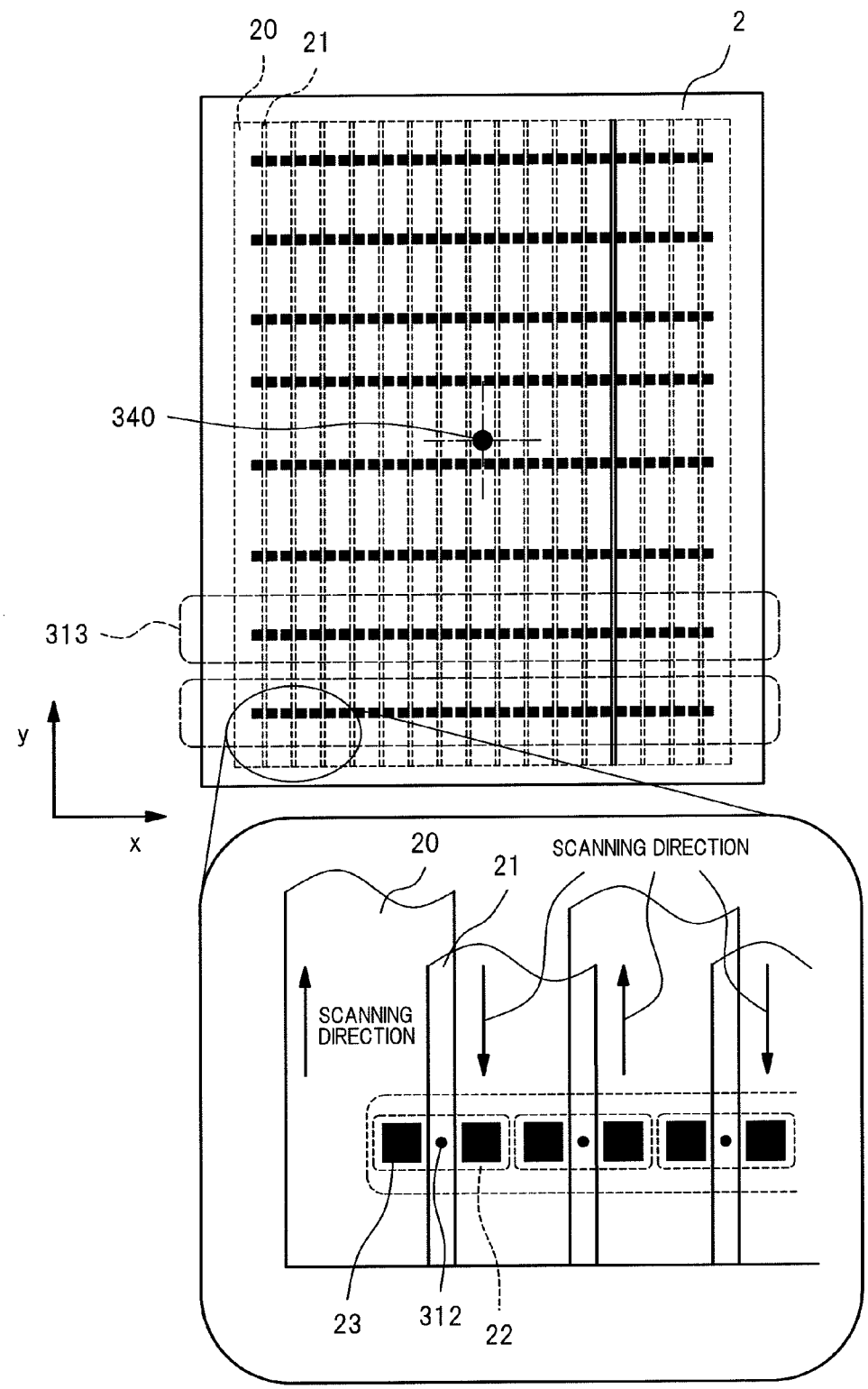
FIG. 28 is a diagram illustrating another example of the exposure pattern for detecting the inclination of the stage and the deviation of the projection optical system used in the maskless exposure method according to the fourth embodiment of the present invention.
Figure 29:
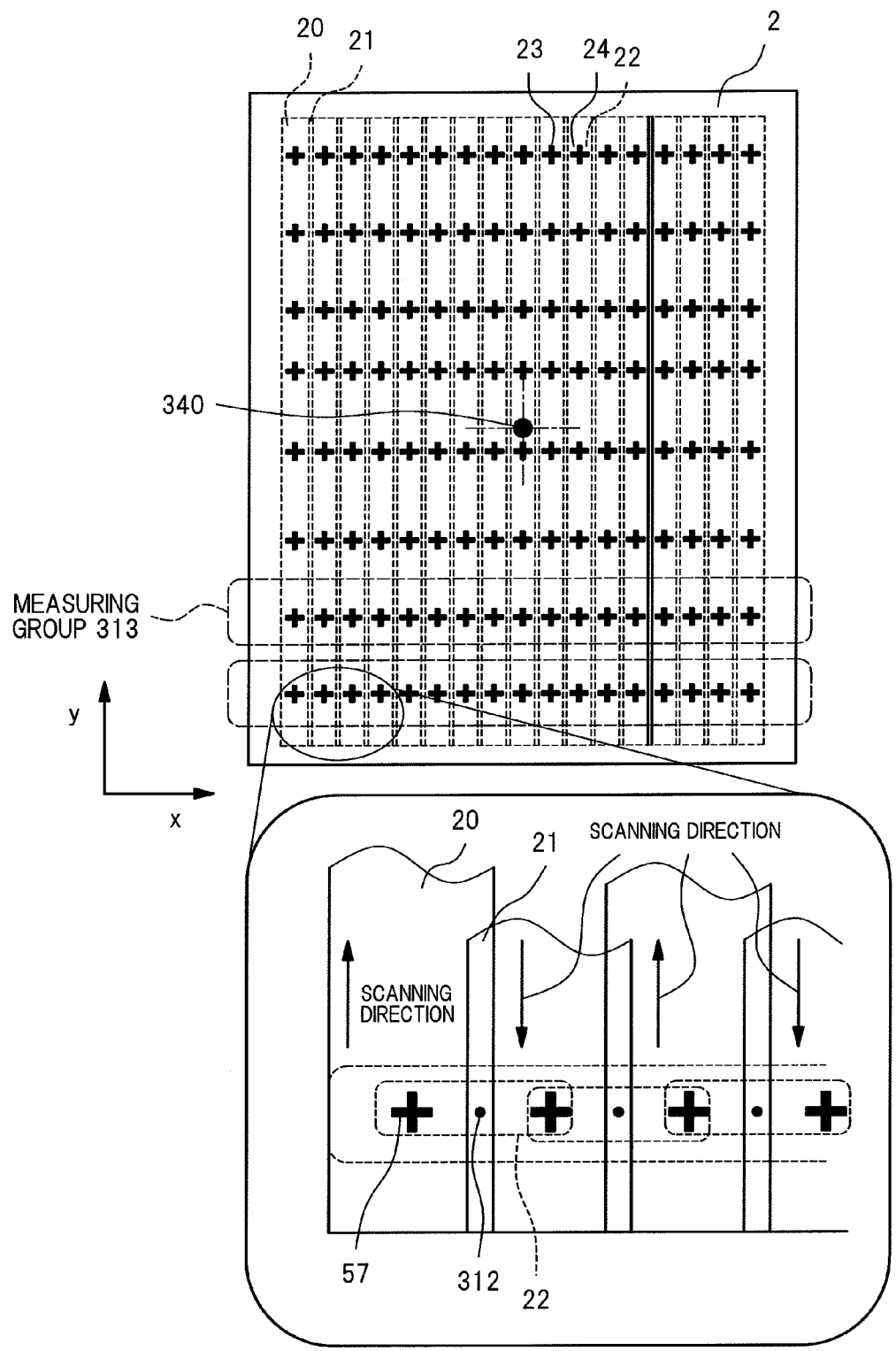
FIG. 29 is a diagram illustrating still another example of the exposure pattern for detecting the inclination of the stage and the deviation of the projection optical system used in the maskless exposure method according to the fourth embodiment of the present invention.

As to the deviation between the adjacent scanning regions 20, the marks 23 such as rectangles or squares are exposed to be disposed in a grid-like manner, and the deviation is measured based on a state of the marks as illustrated in FIGS. 27 to 29.

As illustrated in FIGS. 27 and 28, the marks 23 that are different from the circuit pattern are formed on one of a pair of the scanning regions 20 by the exposure of the projection optical system 3, to thereby constitute a pair with the marks 23 formed on the other scanning region 20. For instance, if the scanning region 20 is formed from the left to the right in FIGS. 27 and 28, the deviations of the marks 23 in the right scanning region is detected on the basis of the marks 23 in the left scanning region 20 between the adjacent scanning regions 20. The exposed marks 23 can be measured by developing the photosensitive resist formed on the principal surface of the substrate 2. Based on the measurement data of the deviations obtained from the mark sets 22 of the marks 23, the deviations in the y direction 6 and in the x direction 7 are measured. The measurement is performed by using the line width measuring machine that exists in the manufacturing process of the FPD. The line width measuring machine measures a distance between edges or centroids of the marks that constitute a pair, to thereby measure the deviation between the adjacent scanning regions 20. The measuring marks, shapes and quantities thereof may be modified appropriately in accordance with capacity of the line width measuring machine.

As illustrated in FIG. 29, if the cross-shaped measuring marks 23 are exposed at predetermined positions corresponding to the width of each scanning region 20, the length measuring machine is used for the measurement. The length measuring machine detects the centroid of the measuring marks 23 so as to measure the coordinates on the substrate 2. The deviation between the scanning regions 20 is obtained as a difference between the coordinates of the marks 23.

Figure 24A:
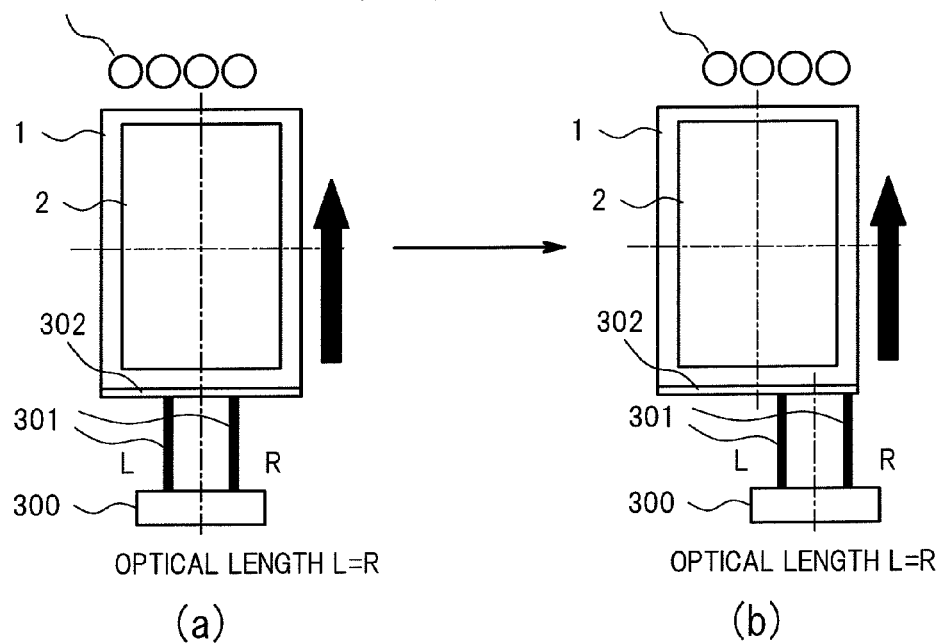
FIGS. 24A and 24B are diagrams illustrating an arrangement of the scanning regions in a case where exposure is performed in a normal state without an inclination of a stage.
Figure 24B:
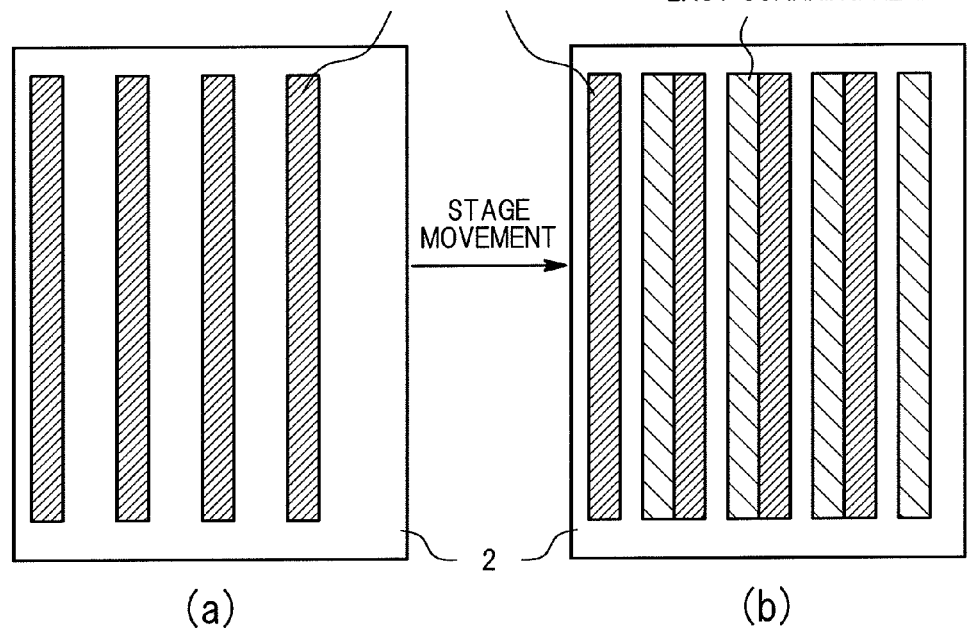

Next, a method of analyzing the inclination of the stage in the exposure process, the arrangement state of the projection optical system, and the exposure start timing are described. FIG. 24A is a plan view of the stage 1, and FIG. 24B is a plan view of the substrate 2. In FIGS. 24A and 24B, the stage 1 before the pitch feed is illustrated in Section (a) while the stage 1 after the pitch feed is illustrated in Section (b).

As illustrated in FIGS. 24A and 24B, the stage 1 performs the scanning without inclination with respect to the scanning direction during the exposure process. In general, the stage 1 that is used in the exposure machine improves the mechanical accuracy so that inclination of the stage does not vary and yawing is reduced. However, if the maskless exposure machine that is used for the display device has a distortion of only approximately 1 μm, there may arise a problem of occurrence of a failure such as display unevenness or the like in the commercialized display device. Therefore, it is necessary to control the posture of the stage more precisely.

Therefore, means for controlling the yawing of the stage 1 is necessary. The stage 1 is made up of at least three drive shafts including an x shaft, a y shaft and a θ shaft, and is controlled by detecting motions of the individual shafts with sensors. The y shaft is driven for the scanning exposure, the x shaft is driven for the pitch feed, and the θ shaft is driven for controlling the inclination of the stage 1 (hereinafter, a part of the stage 1 that rotates when the θ shaft is driven is referred to as a θ stage).

In order to remove the yawing of the stage 1, the y shaft is driven for the scanning exposure while an error about the straightness is corrected by the motion of the x shaft, and the inclination of the stage 1 is further suppressed by the θ shaft. If the scanning is performed in the y direction, straightness in a traveling direction is corrected by the x shaft while the inclination of the stage is corrected by the θ shaft in the exposure process, whereby linearity of the scanning region 20 can be secured with high accuracy.

Two left and right laser length measuring machines 300 are generally used for angle correction control of the θ stage for controlling rotation, and a plane mirror 302 for reflecting the laser is provided to the side face of the θ stage. The two laser length measuring machines 300 are arranged in the horizontal direction and in parallel so as to be opposed to the plane mirror 302 fixed to the stage 1. Reflection light from the plane mirror 302 is detected by the laser length measuring machine 300, and a change in difference between left and right optical paths of the laser beam is detected, whereby the rotation is detected. The plane mirror 302 is manufactured so as to be flat as much as possible. However, there is a distortion in the manufacturing process or a distortion due to attachment.

Therefore, the angle correction control may have a minute angle of the deviation. If the plane mirror 302 has a distortion, the linearity of the scanning exposure region cannot be secured, and a positional deviation of the exposure pattern may be generated.

Figure 25A:
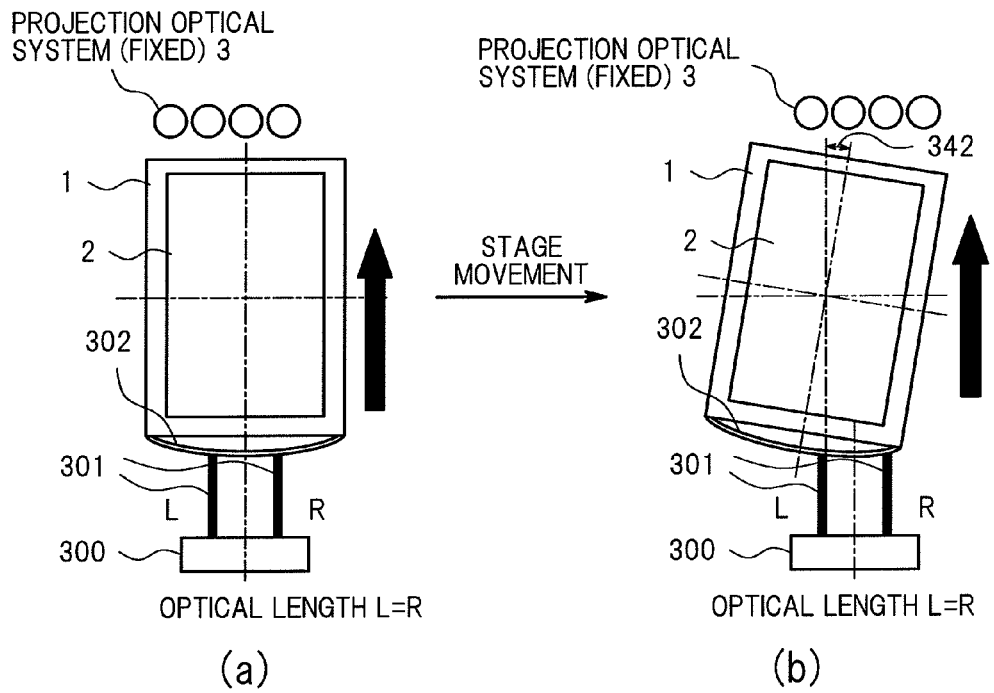
FIGS. 25A and 25B are diagrams illustrating a relationship between the inclination of the stage and an inclination in an exposure region, which are generated when a distortion occurs in a plane mirror in laser length measurement.
Figure 25B:
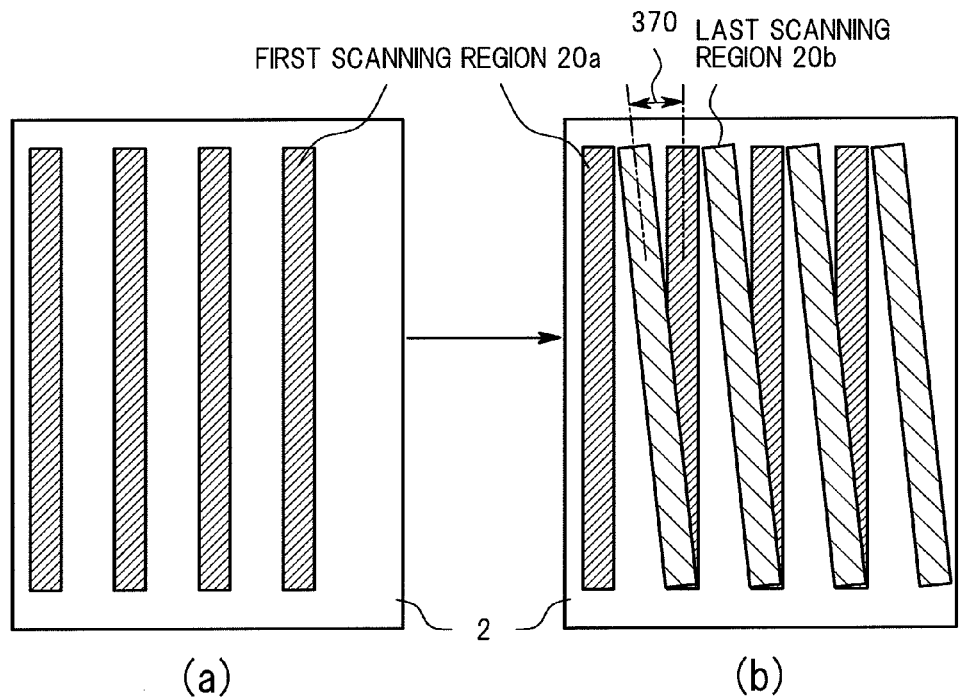

FIGS. 25A and 25B illustrate a problem in the case where the plane mirror is deformed. FIGS. 25A and 25B correspond to FIGS. 24A and 24B, respectively. FIG. 25A is the case where the plane mirror 302 has a distortion in a parabola-like manner. If a set of laser length measuring machines 300 is disposed at the middle of the stage before the pitch feed, the optical lengths are equal between left and right laser beams 301. Therefore, inclination of the stage 1 does not occur so that a scanning region 20a can be exposed. Next, it is supposed that the stage 1 is moved by the pitch feed to the left side before the exposure. There is a difference between the optical lengths of the laser beams 301 in the left and right laser length measuring machines 300, and thus the control of the stage 1 is performed so as to cancel the difference so that the stage 1 is inclined to the right side. As a result, in spite of the normal operation of the control system, a scanning region 20b exposed this time is inclined with respect to the scanning region 20a exposed before.

If the substrate 2 is positioned with some accuracy on the stage 1, the laser length measuring machine 300 projects the laser beam 301 to the plane mirror 302 at substantially the same position in a specific scanning exposure. Therefore, if a local distortion generated in the plane mirror 302 is the cause of an inclination 342 of the stage, an inclination 370 of the exposed scanning region has reproducibility. Therefore, even if the plane mirror 302 has a distortion, the inclination 342 of the stage 1 can be corrected from a result of the measurement if the inclination 342 of the exposed substrate 2 (stage 1) can be measured precisely.

In this embodiment, the measuring marks 23 are exposed and developed in the scanning regions 20 of the substrate 2 on which the photosensitive resist is applied. After that, the deviation between the measuring marks 23 is measured, whereby the inclination 342 of the stage, the arrangement state of the projection optical system, and the exposure timing related to a deviation 304 are determined by the method described below.

As illustrated in FIGS. 27 to 29, the measuring marks 23 are exposed and developed in a grid-like manner, and after that, the measurement is performed by the line width measuring machine or the length measuring machine.

Figure 26:
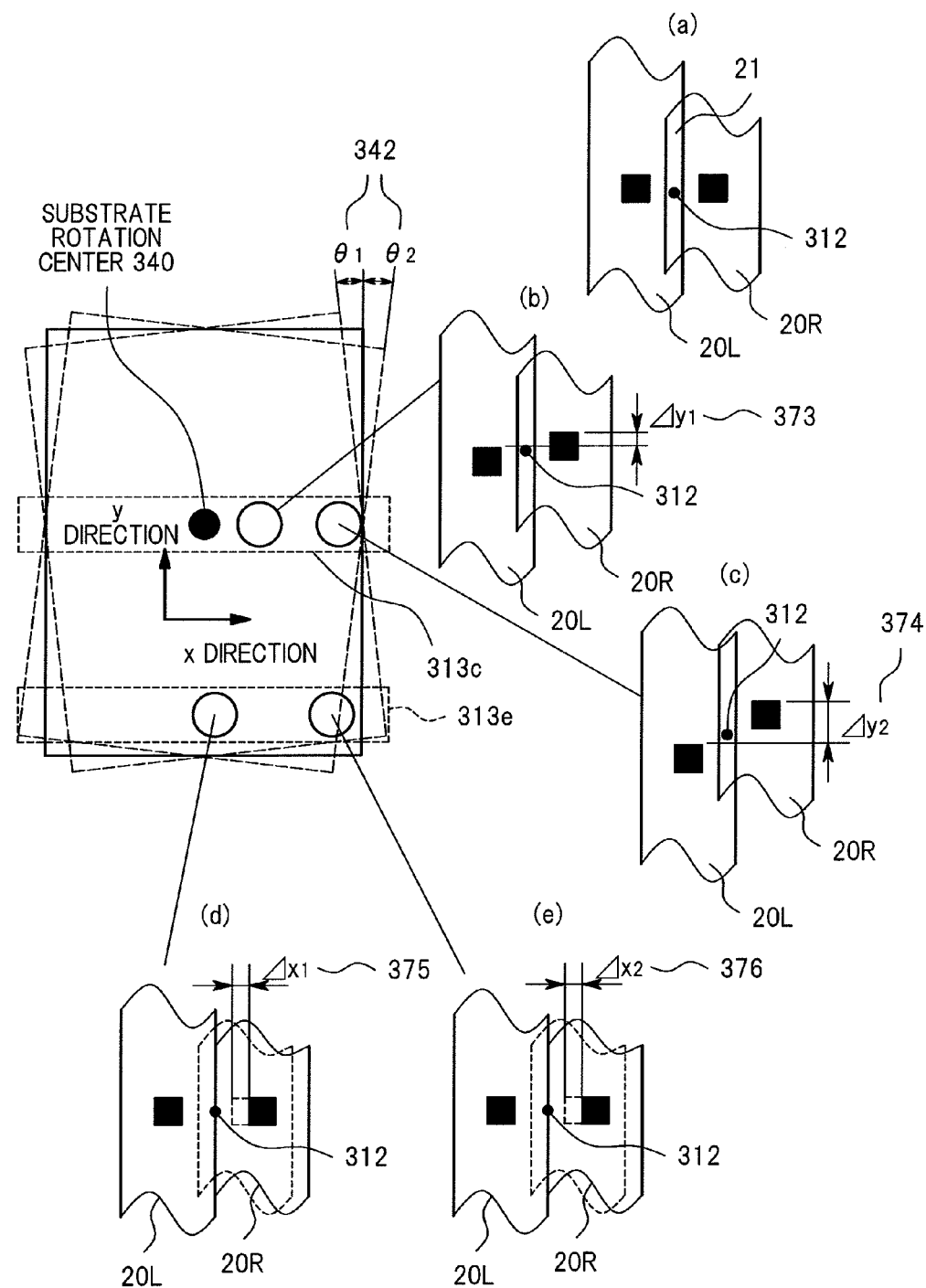
FIG. 26 is a diagram illustrating a tendency of the deviation between the scanning regions that is generated when the stage is inclined by micro-angle.

FIG. 26 is a diagram illustrating a tendency of the deviation between the scanning regions, which is generated if the stage 1 is inclined by a micro-angle. Note that Section (a) of FIG. 26 illustrates the case where the substrate 2 is in the normal state without the inclination.

As illustrated in FIG. 26, a measuring point 312 is set in the overlapping exposure region, and the measuring mark to be exposed is provided to each of the left scanning region 20L and the right scanning region 20R with respect to the measuring point 312. Therefore, if different angular deviations $\theta_1$ and $\theta_2$ (corresponding to the inclination 342 of the substrate 2) are generated in the θ stage during the period in which the parts of the measuring points 312 in the scanning regions are exposed, the positional deviations that are proportional to a distance between a rotation center 340 of the θ stage and the measuring point 312 and to each of the rotation angles $\theta_1$ and $\theta_2$ are generated. As for the measuring mark corresponding to the measuring point 312, the left and right scanning regions generate different deviations. Therefore, different deviations are observed at the measuring points. Further, if the left and right scanning regions 20 are exposed by the different projection optical systems 3, the deviation 304 on which the relative deviation of the projection optical system arrangement and a state of the scan timing of each projection optical system are reflected is added to the positional deviation to be observed.

In the case of a measuring group 313e having a micro rotation angle and a sufficiently large distance in the y direction from the rotation center 340, except for the deviation 304 on which the relative deviation of the projection optical system arrangement and a state of the scan timing of each projection optical system are reflected, the deviation is observed as one in the x direction. As examples thereof, a mark deviation 375 at an x coordinate close to the rotation center in a measuring group in the vicinity of an edge of the substrate is illustrated in Section (d) of FIG. 26, and a mark deviation 376 at a position close to a corner in the measuring group in the vicinity of the edge of the substrate is illustrated in Section (e) of FIG. 26. Further, in the case of a measuring group 313c having a short distance in the y direction from the rotation center 340, except for the deviation 304 on which the relative deviation of the projection optical system arrangement and a state of the scan timing of each projection optical system are reflected, there is little variation in the x direction and the deviation is observed as one in the y direction. As examples thereof, a mark deviation 373 at a position close to the rotation center in the measuring group in the vicinity of the rotation center is illustrated in Section (b) of FIG. 26, and a mark deviation 374 at a position far from the rotation center in the measuring group in the vicinity of the rotation center is illustrated in Section (c) of FIG. 26.

Figure 34:
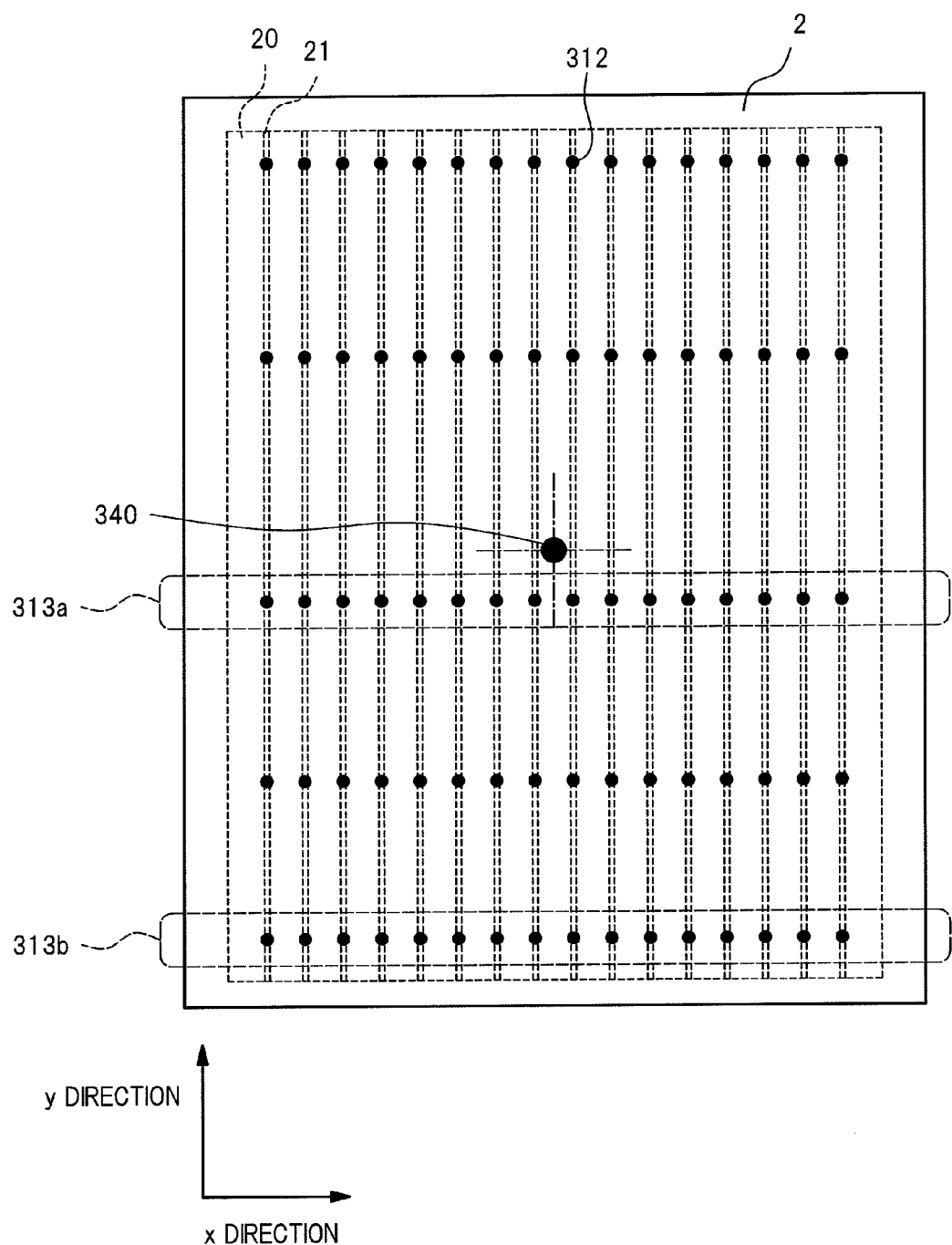
FIG. 34 is a diagram illustrating an example of the exposure pattern for detecting the inclination of the stage and the deviation of the projection optical system used in the maskless exposure method according to the fourth embodiment of the present invention.

Therefore, as illustrated in FIG. 34, a plurality of measuring points having the same y coordinate are set to the boundary between the scanning regions, whereby the angular deviation 342 of the stage 1 during the scanning exposure can be determined from a result of the measurement of the deviations in the x direction and in the y direction obtained by exposing the measuring marks described above. Hereinafter, this measuring method is described.

Figure 35:
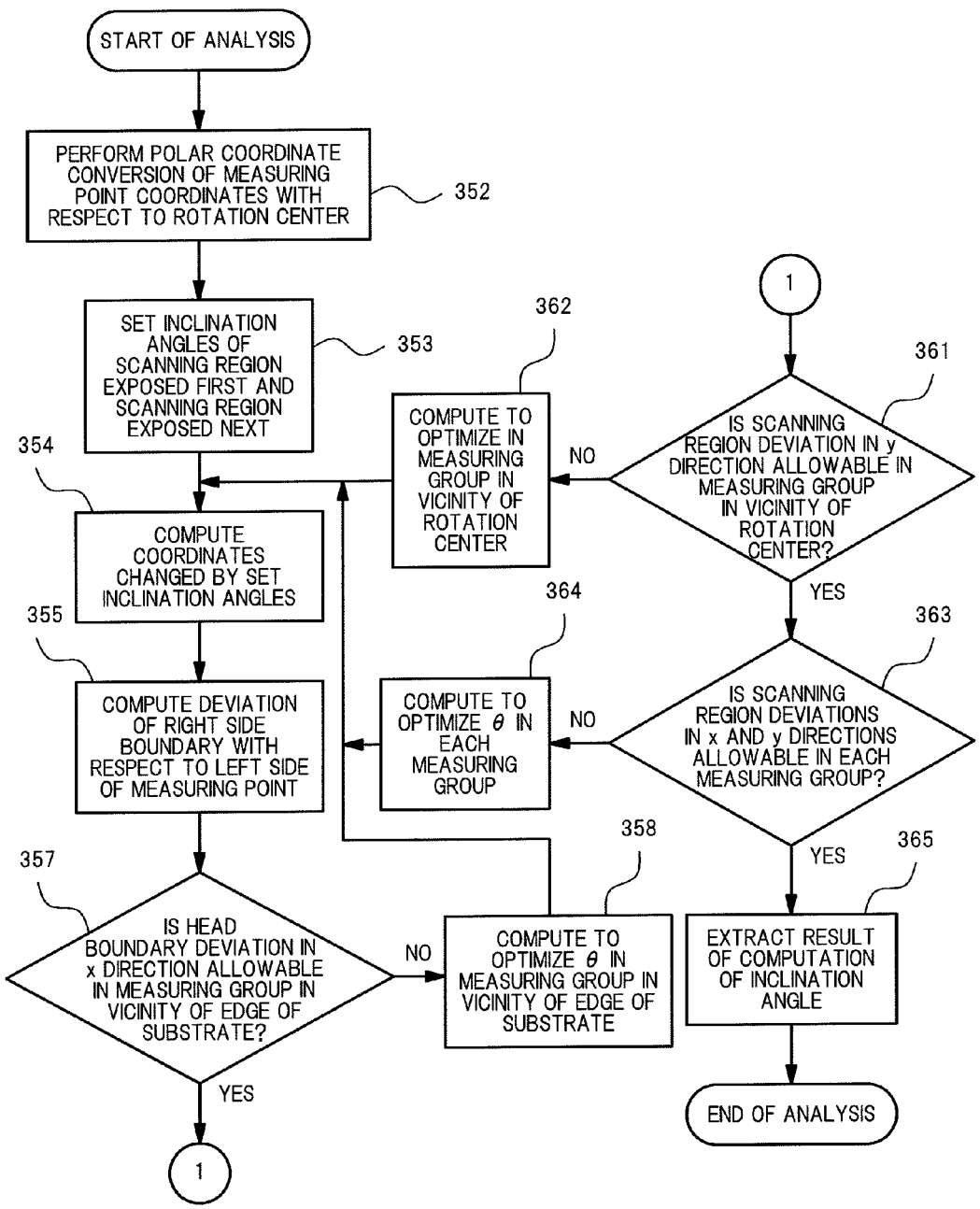
FIG. 35 is a flowchart illustrating an example of a work procedure for detecting the inclination of the stage and the deviation of the projection optical system used in the maskless exposure method according to the fourth embodiment of the present invention.

1. The case of using the measuring points 312 between the scanning regions 20 exposed by the same projection optical system 3 is described below. The following operations are performed in accordance with the flowchart illustrated in FIG. 35.

(1) As illustrated in FIG. 34, the measuring points 312 having the same y coordinate are made the measuring group 313, and the measuring marks 23 of the measuring points exposed at the same time are selected from the group 313. Then, the deviation in the x direction and the deviation in the y direction are measured as follows. (The number of the measuring points is the same as the maximum number of the projection optical systems, and the number is preferable to be as large as possible.)

The deviations in the x direction are denoted by $\Delta x_1, \ldots, \Delta x_n$.

The deviations in the y direction are denoted by $\Delta y_1, \ldots, \Delta y_n$.

(n denotes a measuring point number.)

(2) A distance $r_n$ between the coordinates $(x_0, y_0)$ of the rotation center 340 of the substrate 2 and each of the measuring points 312 (design values) to be a target is computed by using the equation below (Step 352). In other words, a polar coordinate conversion of the measuring point coordinates with respect to the rotation center is performed.

$$r_n = (x_0 - x_n)^2 + (y_0 - y_n)^2$$

(3) As illustrated in FIGS. 25A, 25B and 26, the inclination angles are set supposing that the stage has the inclination 342 of $+\Delta\theta$ during the period while the left scanning region 20L of the measuring point to be a target is exposed, and that the stage has the inclination 342 of $-\Delta\theta$ during the period while the right scanning region 20R of the same is exposed (Step 353). In other words, the inclination angle of the scanning region exposed first at each of the measuring point is set to be $-\Delta\theta$, and the inclination angle of the scanning region exposed next is set to be $+\Delta\theta$. As illustrated in Sections (b) of FIGS. 25A and 25B, the inclination 342 of the stage is opposite to the inclination of the scanning region. This is because the projection optical system 3 is fixed while the substrate 2 generates a rotational deviation. Therefore, viewing from the position of the measuring point to be exposed as intended, it looks as if the rotational deviation occurs in the opposite direction.

Viewing from the substrate 2, the coordinates of the measuring point determined from the position of the measuring mark disposed in the left scanning region 20L move to $(x_{nL}, y_{nL})$, and the coordinates of the measuring point determined from the position of the measuring mark disposed in the right scanning region 20R move to $(x_{nR}, y_{nR})$ Further, the measuring points to be targets are the measuring marks 23 exposed at the same time, and hence the measuring points have the same inclination 342 of the stage at any measuring point 312, which is assigned with the same $\Delta\theta$. Further, $x_{nL}, y_{nL}, x_{nR}$ and $y_{nR}$ are respectively computed by the equations below (Step 354).

$$x_{nL} = r(\cos(-(+\Delta\theta)) - \sin(-(+\Delta\theta)))$$

$$y_{nL} = r(\sin(-(+\Delta\theta)) + \cos(-(+\Delta\theta)))$$

$$x_{nR} = r(\cos(-(-\Delta\theta)) - \sin(-(-\Delta\theta)))$$

$$y_{nR} = r(\sin(-(-\Delta\theta)) + \cos(-(-\Delta\theta)))$$

(4) The deviations between the scanning regions 20 are determined at the measuring points, which is generated by the inclination 342 of the stage supposed in (3) (Step 355). A calculated value $\Delta x_n c$ of the deviation in the x direction and a calculated value $\Delta y_n c$ of the deviation in the y direction are as follows. Those values are calculated on the basis of the measuring mark 23 of the left scanning region 20L in this embodiment.

The calculated value $\Delta x_n c$ of the deviation in the x direction is:

$$\Delta x_n c = x_{nR} - x_{nL}.$$

The calculated value $\Delta y_n c$ of the deviation in the y direction is:

$$\Delta y_n c = y_{nR} - y_{nL}.$$

(5) Evaluation functions $e_x$ and $e_y$ are defined as follows, which are used for the method of least squares using the calculated deviations and the deviations obtained by actual measurement of the measuring points.

$$e_x = \Sigma(\Delta x_n c - \Delta x_n)^2$$

$$e_y = \Sigma(\Delta y_n c - \Delta y_n)^2$$

(6) Using the method of least squares, $\Delta\theta$ that minimizes $e_x$ and $e_y$ is found by searching (Steps 357, 358, 361, 362, 363 and 364). In this case, the accuracy can be improved by emphasizing $e_x$ in a measuring group 313b at the edge of the substrate illustrated in FIG. 34 while the accuracy can be improved by emphasizing $e_y$ in a measuring group 313a having a y coordinate in the vicinity of the rotation center 340.

Specifically, a recursive computing method is used. First, it is evaluated whether or not a head boundary deviation in the x direction between the calculated value and the actual measured value in the measuring group in the vicinity of the edge of the substrate is an allowable value or lower (Step 357). If the head boundary deviation is not the allowable value or lower (No in Step 357), a θ optimization computation is performed in the measuring group in the vicinity of the edge of the substrate (Step 358), and the process of Step 354 and subsequent steps is repeated using the computed new value of Δθ. If the head boundary deviation is the allowable value or lower (Yes in Step 357), it is evaluated whether or not a difference between scanning region deviations in the y direction of the calculated value and the actual measured value with respect to the measuring group in the vicinity of the rotation center is the allowable value or lower by using the evaluation function (Step 361). If the difference is not the allowable value or lower (No in Step 361), the θ optimization computation in the measuring group in the vicinity of the rotation center is performed (Step 362), and the process of Step 354 and subsequent steps are repeated using the computed new value of Δθ. If the difference is the allowable value or lower (Yes in Step 361), it is evaluated whether or not a difference between the scanning region deviations in the x and y directions of the calculated value and the actual measured value with respect to each of the measuring groups is the allowable value or lower by using the evaluation function (Step 363). If the difference is the allowable value or lower (No in Step 363), the θ optimization computation is performed in each of the measuring groups (Step 364), and the process of Step 354 and subsequent steps are repeated using the computed new value of Δθ. If the difference becomes the allowable value or lower (Yes in Step 363) the searching process for Δθ is finished.

(7) Next, the inclination angle of the measuring group at the edge of the substrate as a result of the computation is extracted (Step 365).

2. The case of using the measuring points 312 between the scanning regions 20 exposed by different adjacent projection optical systems 3 is described below. Similarly to the case described above, the recursive computing method is used.

In this case, it is necessary to determine the deviation 304 simultaneously, on which the relative deviation of the projection optical system arrangement and the state of the scan timing of each projection optical system are reflected. If the deviation does not exist by the adjustment, the inclination 342 of the stage can be determined by the computing method described above in Article 1. In contrast, in the adjustment process of the exposure apparatus or in the case of confirming the deviation 304 on which the relative deviation of the projection optical system arrangement and the state of the scan timing of each projection optical system are reflected, the inclination 342 of the stage can be determined by the following method. However, when the inclination 342 between two scanning regions where the measuring points exist is to be determined, it is necessary to determine also the deviation 304 on which the relative deviation of the projection optical system arrangement and the state of the scan timing of each projection optical system are reflected. In order to improve accuracy, it is preferable to prepare a plurality of the measuring points 312 are exposed at the same time as illustrated in FIG. 34. In other words, the measuring points 312 have the same y coordinate in one measuring group, but it is preferable to obtain data of measuring points having different y coordinates for improving accuracy. In addition, if the measured data of the measuring group 313*a* having the y coordinate in the vicinity of the rotation center 340 or the measuring group 313*b* in the vicinity of the edge of the substrate among the measuring groups 313 can be obtained, it is easier to obtain the deviation 304 on which the relative deviation of the projection optical system arrangement and the state of the scan timing of each projection optical system are reflected.

Figure 36:
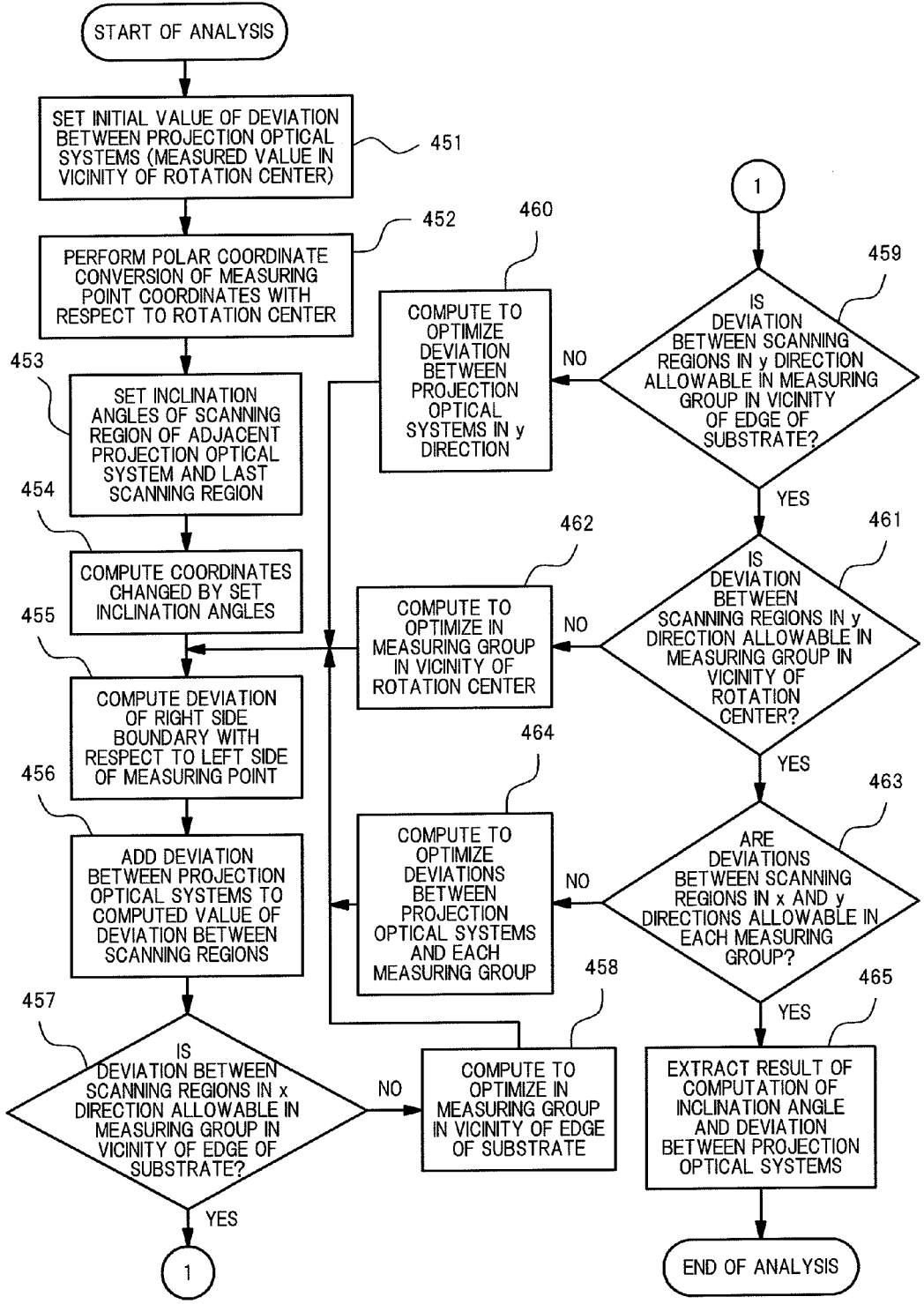
FIG. 36 is a flowchart illustrating another example of the work procedure for detecting the inclination of the stage and the deviation of the projection optical system used in the maskless exposure method according to the fourth embodiment of the present invention.

In accordance with the flowchart of FIG. 36, the following operation is performed.

(1) As illustrated in FIG. 34, the measuring marks 23 of the measuring point in the adjacent scanning regions 20 exposed by the two adjacent projection optical systems 3 are selected, and the deviation in the x direction and the deviation in the y direction are measured as follows. If there are a plurality of measuring groups 313, the same computation is performed for each of the measuring groups 313. (The number of the measuring points 312 is the same as the maximum number of the projection optical systems 3 minus one, but it is preferable that the number is as large as possible.)

The deviations in the x direction are denoted by $\Delta x_1, \ldots$ and $\Delta x_n$.

The deviations in the y direction are denoted by $\Delta y_1, \ldots$ and $\Delta y_n$.

(n denotes a measuring point number.)

(2) The deviation 304 on which the relative deviation of the projection optical system arrangement between the adjacent projection optical systems and the state of the scan timing of each projection optical system are reflected is set as a parameter (initial value) (Step 451).

The relative deviation of the projection optical system arrangement in the x direction is denoted by $\Delta x_{nh}$.

The deviation due to the relative deviation of the projection optical system arrangement and the scan timing of each projection optical system in the y direction is denoted by $\Delta y_{nh}$.

As to the measuring point in the measuring group 313 that is handled here, the left and right scanning regions 20 are exposed individually by the two adjacent projection optical systems 3. As described above, the relative deviation of the right projection optical system is shown with respect to the left projection optical system 3. Further, the projection optical system 3 has the deviation, and hence the above-mentioned deviations are observed as deviations in the same direction when the deviations are viewed from the substrate 2.

As described above, the deviation becomes a constant value among the measuring points having the same x coordinate regardless of the measuring group 313. The initial value may be zero. However, as to the x direction, if the measuring group 313*a* is located in the vicinity of the rotation center as illustrated in FIG. 26, $\Delta x_{nh}$ may be a result of the measurement in the measuring group 313*a*, whereby the computation by the method of least squares can be converged fast and accuracy thereof can be improved.

(3) A distance $r_n$ between the coordinates $(x_0, y_0)$ of the rotation center 340 of the substrate 2 and each of the measuring points 312 (design values) to be a target is computed by using the equation below (Step 452). In other words, a polar coordinate conversion of the measuring point coordinates with respect to the rotation center is performed.

$$r_n = (x_0 - x_n)^2 + (y_0 - y_n)^2$$

(4) As illustrated in FIGS. 25A, 25B and 26, the inclination angles are set supposing that, in a measuring group m, the stage has the inclination 342 of +Δθm during the period while the left scanning region 20L of the measuring point to be a target is exposed, and that the stage has the inclination 342 of −Δθm during the period while the right scanning region 20R is exposed. As illustrated in Sections (b) of FIGS. 25A and 25B, the inclination 342 of the stage is opposite to the inclination of the scanning region. This is because the projection optical system 3 is fixed while the substrate 2 generates a rotational deviation. Therefore, viewing from the position of the measuring point to be exposed as intended, it looks as if the rotational deviation occurs in the opposite direction. The inclination angle of the last scanning region at each measuring point in the scanning region and the inclination angle of the scanning region of the adjacent projection optical system are set (Step 453).

Viewing from the substrate 2, the coordinates of the measuring point determined from the position of the measuring mark disposed in the left scanning region 20L move to ($x_{nmL}$, $y_{nmL}$), and the coordinates of the measuring point determined from the position of the measuring mark disposed in the right scanning region 20R move to ($x_{nmR}$, $y_{nmR}$). Further, the measuring points to be targets are the measuring marks 23 exposed at the same time, and hence the measuring points have the same inclination 342 of the stage at any measuring point 312 in the same measuring group m 313, which has the same $\Delta\theta$. Further, $x_{nmL}$, $y_{nmL}$, $x_{nmR}$ and $y_{nmR}$ are respectively computed by the equations below (Step 454).

$$x_{nmL}=r(\cos(-(+\Delta\theta m))-\sin(-(+\Delta\theta m)))$$

$$y_{nmL}=r(\sin(-(+\Delta\theta m))+\cos(-(+\Delta\theta m)))$$

$$x_{nmR}=r(\cos(-(-\Delta\theta m))-\sin(-(-\Delta\theta m)))$$

$$y_{nmR}=r(\sin(-(-\Delta\theta m))+\cos(-(-\Delta\theta m)))$$

(Further, m denotes a measuring group number of the measuring point, and n denotes a measuring point number in the measuring group m.)

(5) As illustrated in FIG. 26, the deviation between the scanning regions 20 generated at the measuring point 312 due to the inclination 342 of the stage is determined (Step 455), the deviation 304 on which the relative deviation of the projection optical system arrangement between the adjacent projection optical systems and the state of the scan timing of each projection optical system are reflected are added (Step 456), and the deviation between the scanning regions 20 on the calculation basis is determined. In this embodiment, the calculation is performed on the basis of the measuring mark 23 in the left scanning region 20L illustrated in FIG. 26. The calculated value $\Delta x_{nm}c$ of the deviation in the x direction and the calculated value $\Delta y_{nm}c$ of the deviation in the y direction are as follows.

The calculated value of the deviation in the x direction is:

$$\Delta x_{nm}c=x_{nmR}-x_{nmL}+\Delta x_{nh}.$$

The calculated value of the deviation in the y direction is:

$$\Delta y_{nm}c=y_{nmR}-y_{nmL}+\Delta y_{nh}.$$

(6) Evaluation functions $e_{xm}$ and $e_{ym}$ are defined as follows, which are used for the method of least square using the calculated deviations in each measuring group 313 and the deviations obtained by actual measurement of the measuring point 312.

$$e_{xm}=\Sigma(\Delta x_{nm}c-\Delta x_{nm})^2$$

$$e_{ym}=\Sigma(\Delta y_{nm}c-\Delta y_{nm})^2$$

(7) With a target of the measuring group 313b having the y coordinate sufficiently distant from the rotation center (in the vicinity of the edge of the substrate), computation of the method of least squares is performed using the evaluation function $e_{xm}$ in the measuring group 313, and the inclination angle θm in the measuring group 313 is found by searching (Steps 457 and 458).

Specifically, it is evaluated whether or not the deviations in the x direction between the scanning regions of the calculated values and the actual measured values are allowable values or lower in the measuring group 313b (Step 457). If the deviations are not the allowable values or lower (No in Step 457), the θ optimization computation is performed in the measuring group 313b (Step 458), and the computation process of Step 454 and subsequent steps are repeated using the computed new value of Δθ until the deviations become the allowable values or lower (Yes in Step 457).

(8) In every measuring group 313b that is the target in (7), the deviations $\Delta y_{nh}$ that minimizes the evaluation function Ey obtained by adding $e_{ym}$ in (6) and is determined by the relative deviation in the y direction of the projection optical system arrangement and the scan timing of each projection optical system is found in searching by using the method of least squares (Steps 459 and 460).

Specifically, it is evaluated whether or not the deviations between the scanning regions in the y direction of the calculated values and the actual measured values in the measuring group 313b is the allowable value or lower (Step 459). If the deviation is not the allowable value or lower (No in Step 459), the optimization computation of the deviations between the projection optical systems is performed in the measuring group 313b (Step 460), and the computation process of Step 454 and subsequent steps are repeated using the computed new values until the deviations become the allowable value or lower (Yes in Step 459).

(9) Based on the parameter obtained by the operations (1) to (8), with respect to the measuring group having the y coordinate in the vicinity of the rotation center, one of sum Ey of $e_{ym}$ and sum Exy of $e_{xm}$ and $e_{ym}$ in the measuring group to be a target is used as the evaluation function to search for the inclination 342 θm of the stage at each measuring point 312 in the measuring group 313a to be a target having the y coordinate in the vicinity of the rotation center by the method of least squares (Steps 461 and 462). (As described above, in the measuring group 313a having the y coordinate in the vicinity of the rotation center, the deviation generated in the x direction is small in the case of an extremely small inclination angle. Therefore, it is preferable to emphasize a result of the measurement in the y direction.)

Specifically, it is evaluated whether or not the deviation between the scanning regions in the y direction of the calculated values and the actual measured values in the measuring group in the vicinity of the rotation center are allowable values or lower (Step 461). If the deviations are not the allowable values or lower (No in Step 461), the optimization computation is performed in the measuring group in the vicinity of the rotation center (Step 462), and the computation process of Step 454 and subsequent steps are repeated using the computed new values until the deviations become the allowable value or lower (Yes in Step 461).

(10) The value Exy obtained by adding all of $e_{xm}$ and $e_{ym}$ obtained in (6) in every measuring group 313 is regarded as the evaluation function. The inclination 342 θm of the stage in each measuring group 313, and the deviations 304 $\Delta x_{nh}$ and $\Delta y_{nh}$ on which the relative deviations of the projection optical system arrangement between the adjacent projection optical systems and the state of the scan timing of each projection optical system are reflected are found in searching by the method of least squares (Steps 463 and 464).

Specifically, it is evaluated whether or not the deviations between the scanning regions in the x and y directions of the calculated values and the actual measured values in every measuring group are allowable values or lower (Step 463). If the deviations are not the allowable values or lower (No in Step 463), the optimization computation of the θ of each measuring group and deviations in the x and y direction between the projection optical systems is performed (Step 464), and the computation process of Step 454 and subsequent steps are repeated using the computed new values until the deviations become the allowable value or lower (Yes in Step 463).

(11) The calculated inclination angle in the measuring group in the vicinity of the edge of the substrate and the value of the deviation between the projection optical systems are extracted (Step 465).

The method of minimizing each evaluation function by using the method of least square is described above in the measurements of Articles 1 and 2, which is an example of solving a so-called minimizing problem. However, it is possible to determine the solutions by other methods.

Further, a fundamental flow of the computation is described in Article 2, but it is possible to determine the angle of the inclination 342 of the scanning region 20 without performing (7) to (9) so as to grasp a general state of the apparatus.

In the way as described above, the inclination 342 of the stage between the adjacent scanning exposure regions, the relative deviation of the arrangement of the projection optical system, and the state of the scan timing of each projection optical system related to the deviation 304 can be grasped. Based on the values in this way, the inclination of the stage can be corrected for each scanning region 20 with respect to the maskless exposure apparatus. Specifically, the deviation of the arrangement of the projection optical system and the scan timing of each projection optical system are corrected so that the linearity in the scanning exposure region with high accuracy can be secured.

In this embodiment, a relative value is computed as to the inclination 342 of the stage between the adjacent scanning regions as well as the deviation 304 on which the deviation of the projection optical system arrangement between the adjacent projection optical systems and the state of the scan timing of each projection optical system are reflected. Therefore, for example, on the basis of the position of the leftmost projection optical system 3, the left to the right projection optical systems 3 are corrected so that the relative deviation computed in this embodiment is canceled. Thus, the exposure process can be performed in accordance with the design value. The adjustment can be performed only in a mechanical manner as to the x direction perpendicular to the scanning direction, but it is possible to perform the adjustment also by shifting an exposure scanning start signal electrically as to the y direction parallel to the scanning direction.

[Fifth Embodiment]

As an application of the fourth embodiment, a method of managing and adjusting the maskless exposure apparatus in mass production is described.

Figure 30:
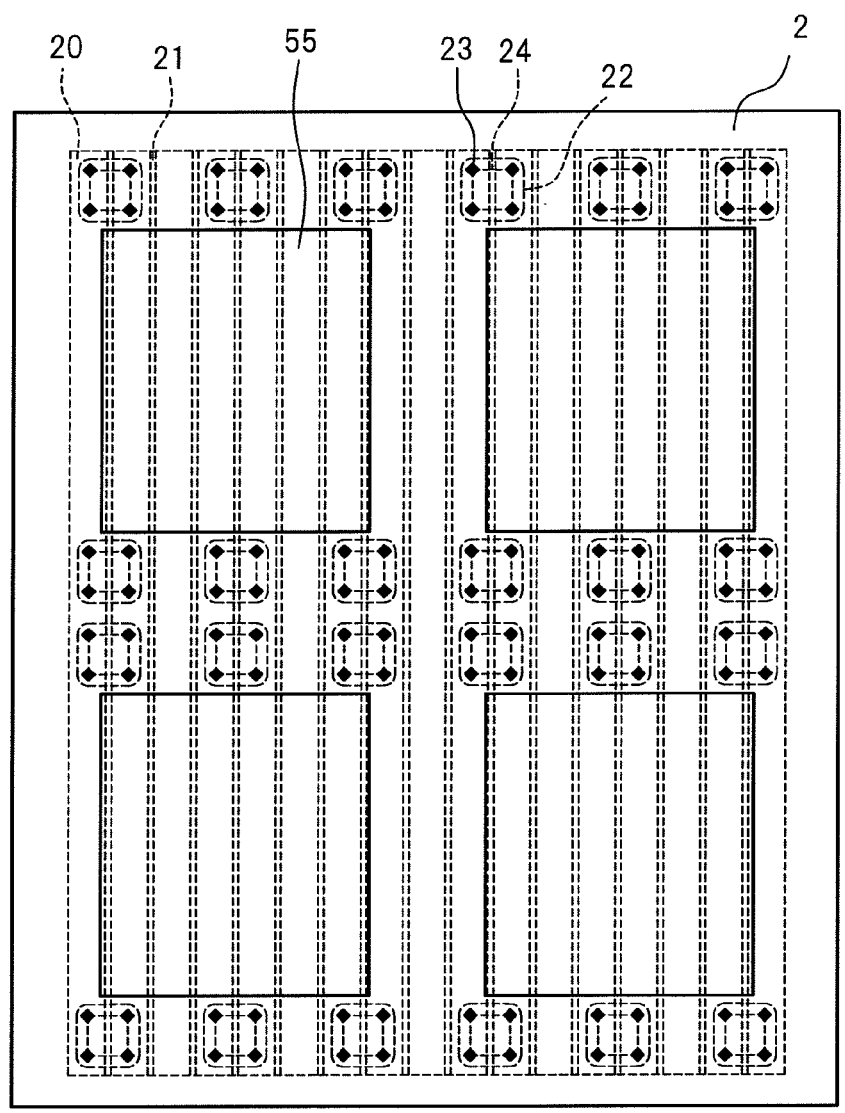
FIG. 30 is a diagram illustrating an example of arranging the exposure pattern for detecting the inclination of the stage and the deviation of the projection optical system outside a pattern for the display device, which is used for a substrate for mass production in the maskless exposure method according to the fifth embodiment of the present invention.
Figure 31:
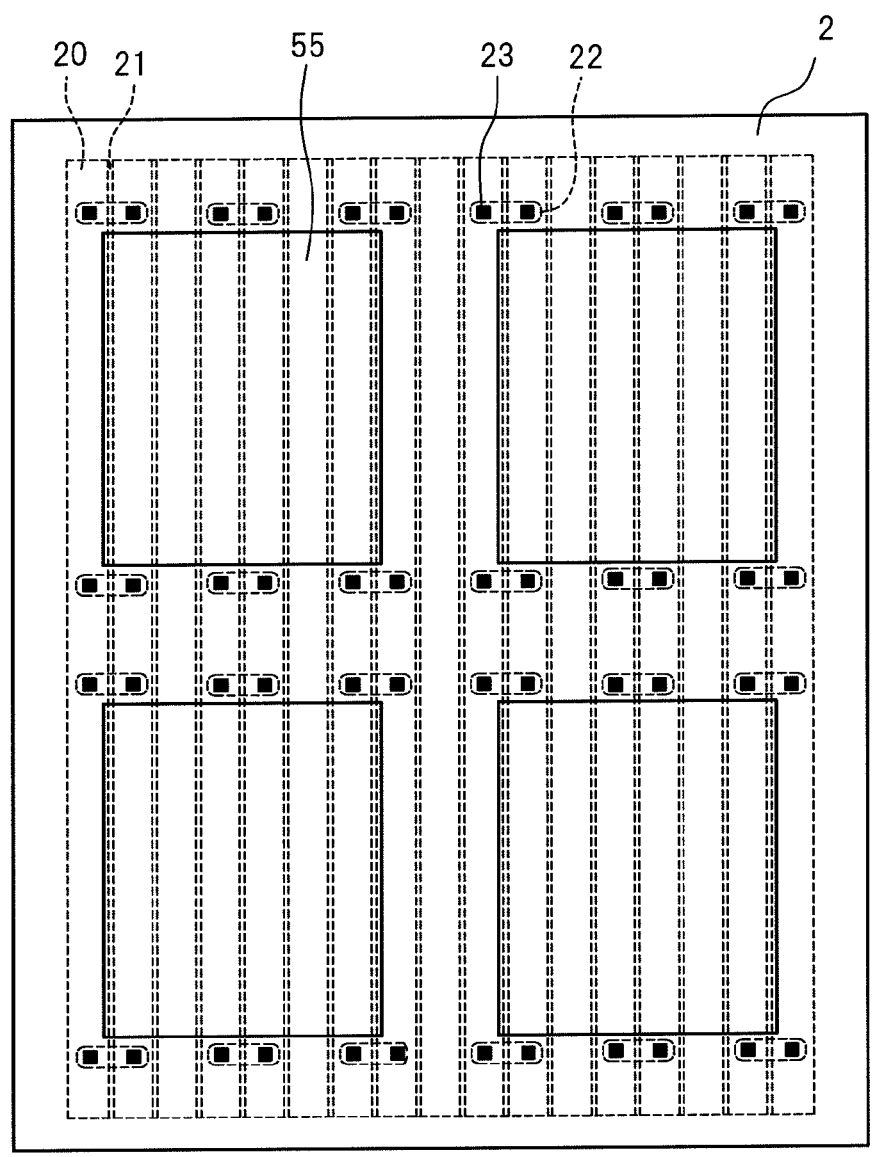
FIG. 31 is a diagram illustrating an example in a case where the exposure pattern for detecting the inclination of the stage and the deviation of the projection optical system works also as an in-pixel circuit pattern of the display device, which is used for the substrate for mass production in the maskless exposure method according to the fifth embodiment of the present invention.
Figure 32:
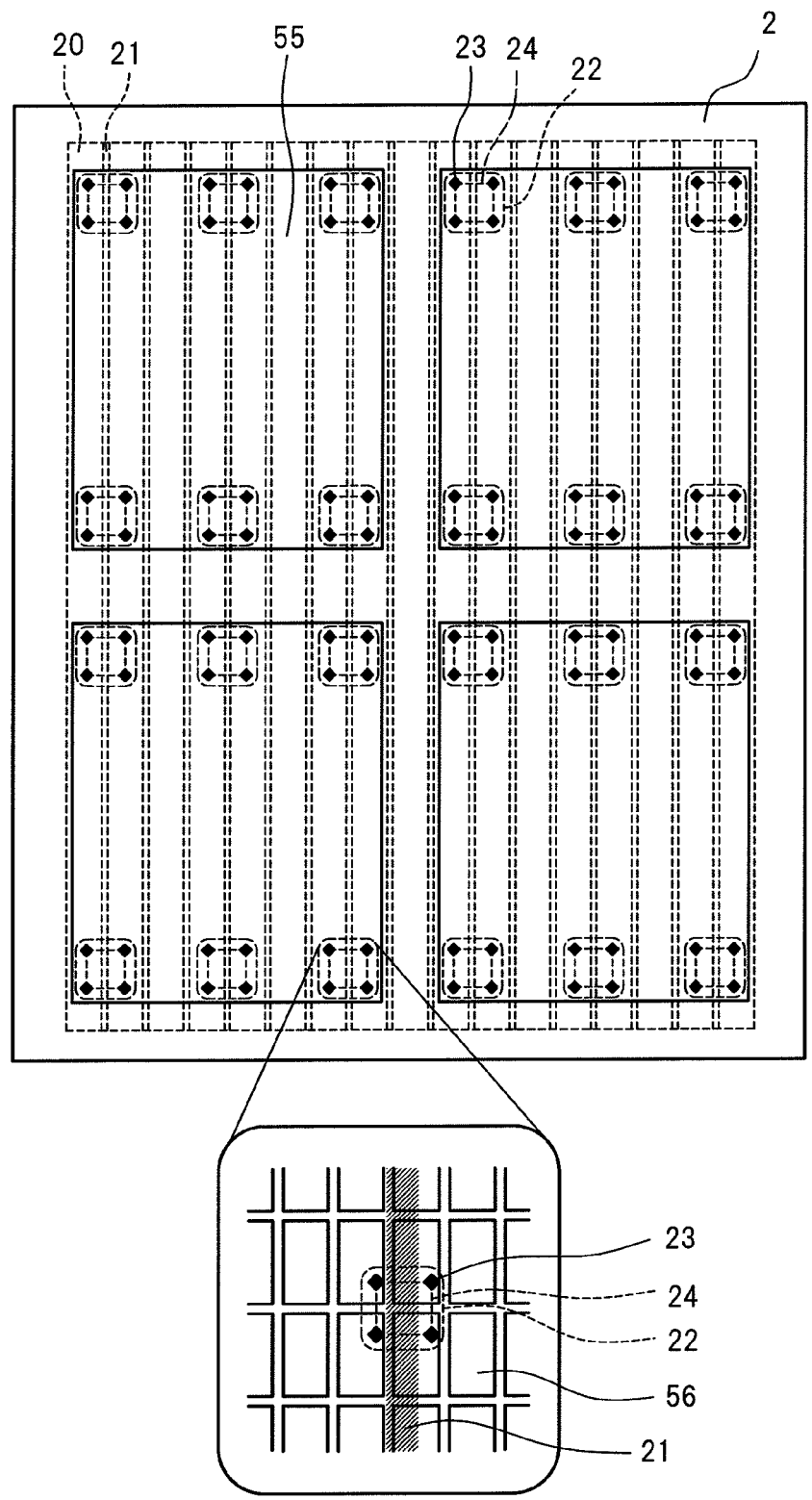
FIG. 32 is a diagram illustrating an example of arranging the exposure pattern for detecting the inclination of the stage and the deviation of the projection optical system inside the pattern for the display device, which is used for the substrate for mass production in the maskless exposure method according to the fifth embodiment of the present invention.
Figure 33:
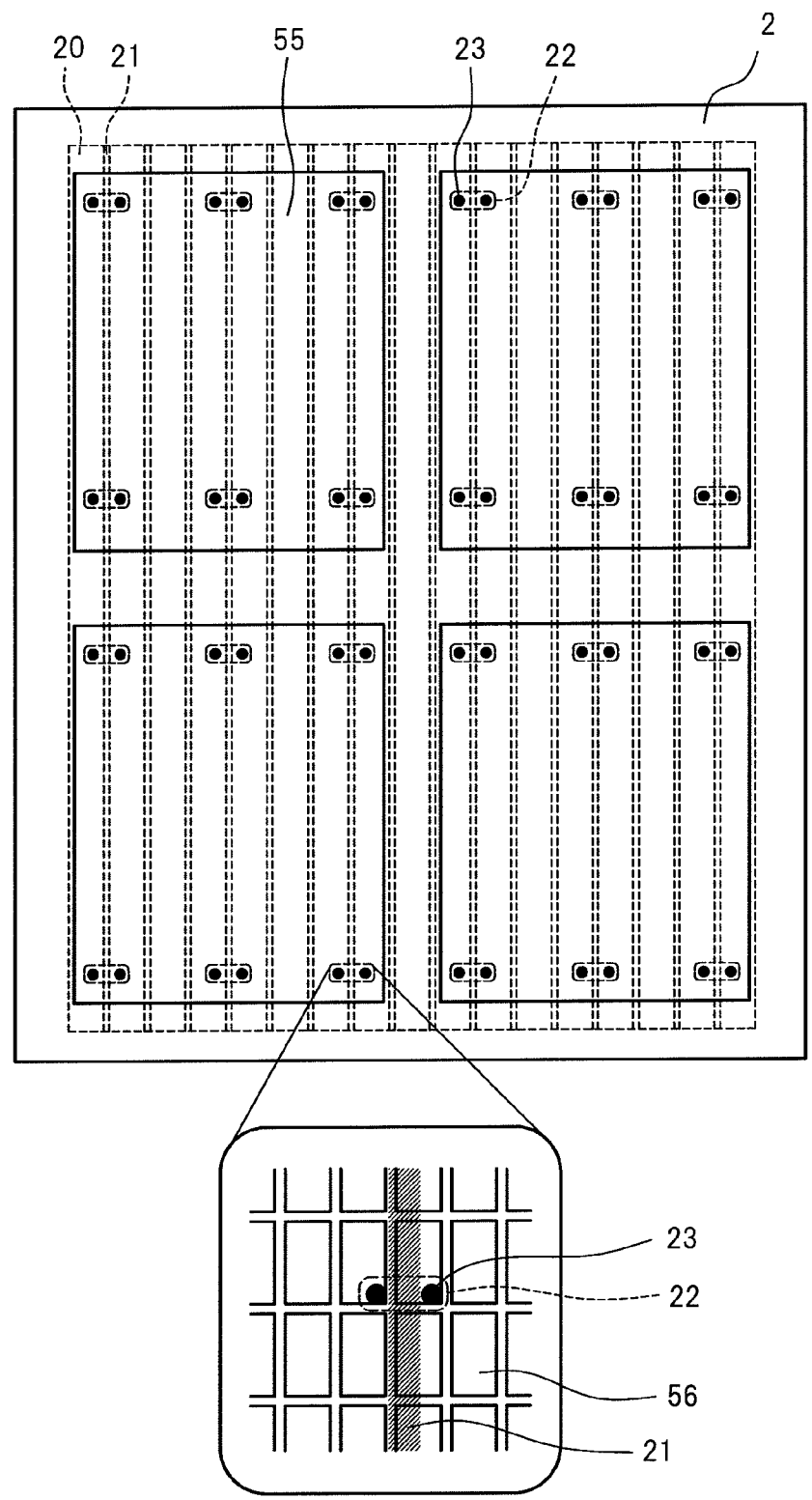
FIG. 33 is a diagram illustrating another example of arranging the exposure pattern for detecting the inclination of the stage and the deviation of the projection optical system inside the pattern for the display device, which is used for the substrate for mass production in the maskless exposure method according to the fifth embodiment of the present invention.

In FIGS. 27 to 29 referred to in the description of the fourth embodiment, the measuring marks 23 are exposed for only adjusting the maskless exposure machine. However, the exposure of the measuring marks 23 may cause a delay in production of display devices to be products. Therefore, the pattern is exposed as illustrated in FIGS. 30 and 31, in which the measuring marks 23 are disposed outside a pattern group serving as the display region 55 of the display device, or the pattern is exposed as illustrated in FIGS. 32 and 33, in which the measuring marks 23 having a shape that can be measured by the line width measuring machine or the length measuring machine are disposed as a part of the circuit in the pattern group serving as the display region 55 of the display device. In this way, the inclination 342 of the stage, the deviation of the arrangement of the projection optical system, and the scan timing of each projection optical system can be measured from inspection data of the products. Thus, the monitoring can always be performed without delaying the production of the maskless exposure machines.

The method of measuring the deviation, the inclination 342 of the stage between the adjacent scanning exposure regions, and the relative deviation of the arrangement of the projection optical system and the scan timing of each projection optical system, which are analyzed from a result of the measurement, are the same as those described above in the fourth embodiment.

If a variation of the inclination 342 of the stage, and the relative deviation of the arrangement of the projection optical system and the scan timing of each projection optical system is small between the measuring points 312, approximation of function can be performed. Further, it is possible to reduce and control the number of the measuring points 312, and it is also possible to reduce a load in an inspection step in the mass production.

If the inspection method according to the fourth embodiment and the adjustment method of the fifth embodiment are combined with each other, it is possible to provide a system that monitors and adjusts a state of the maskless exposure apparatus automatically through the product without delaying the production.

[Sixth Embodiment]

A sensor may be attached to the stage 1 of the maskless exposure machine so as to perform calibration of position accuracy of the projection optical system. In this case, it is necessary to insure straightness and position accuracy of the stage. Hereinafter, this embodiment is described with reference to FIGS. 27, 28, 29, 37A and 37B, in which the present invention is applied to correction of straightness or position accuracy of the stage.

As illustrated in FIGS. 27 to 29, the measuring points 312 are set in grid covering the boundary between the scanning regions, and the measuring marks for measuring the deviation between the scanning regions are exposed on both sides of the measuring point 312 with respect to each scanning region 20. After the developing process of the substrate, the deviation of the scanning regions 20 is measured based on the measuring marks 23 exposed on the substrate by using the line width measuring machine or the length measuring machine. Based on a result of the measurement, using the method described above in the fourth and fifth embodiments, the inclination angle between the scanning regions 20 is measured. If the measuring mark 23 is exposed in the vicinity of the boundary between the scanning regions 20 as illustrated in FIG. 27 or 28, it is preferable to use the line width measuring machine. If the measuring mark 23 is exposed at a particular position such as the middle of the scanning region 20 as illustrated in FIG. 29, it is preferable to use the length measuring machine.

Figure 37A:
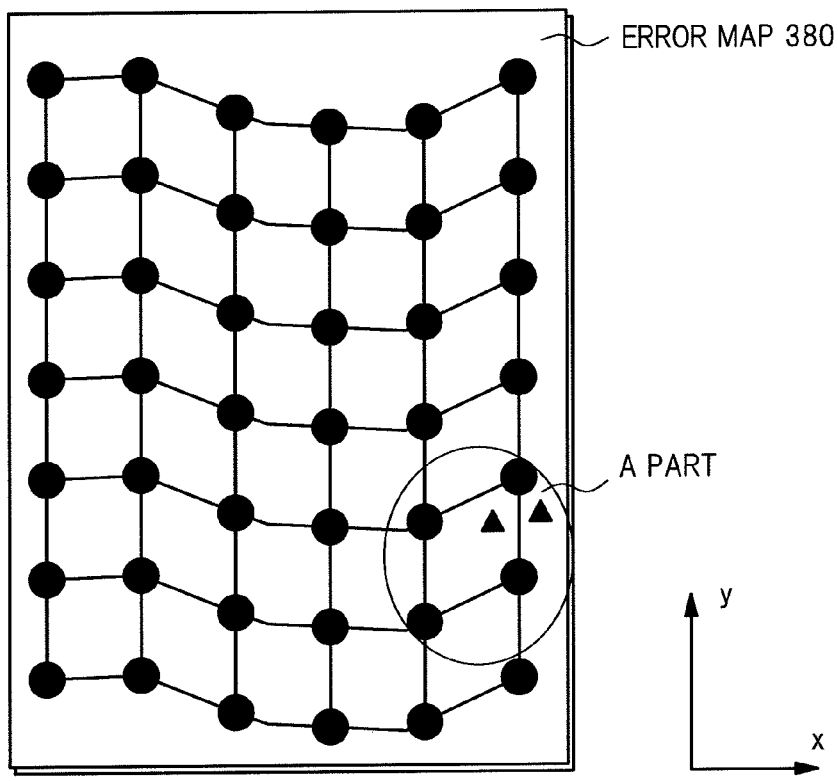
FIG. 37A is a diagram illustrating an error map based on information about the inclination of the stage and the deviation between the scanning regions obtained by the maskless exposure method and a method of predicting an error that occurs when stage positioning is performed according to the sixth embodiment of the present invention.
Figure 37B:
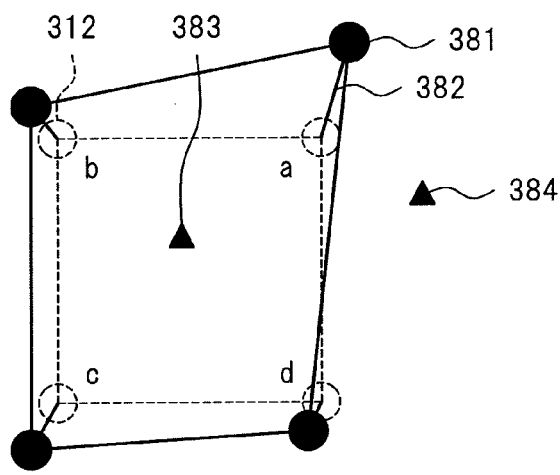
FIG. 37B is an enlarged diagram of Part A of FIG. 37A.

Based on a result 381 of the deviation measurement as described above, a deviation vector 382 is determined from the deviation in the x direction and the y direction with respect to the measuring points 312 set in grid as illustrated in FIG. 37B, and an error map 380 is generated. As to the measuring points 312 set in grid, the pattern is exposed in accordance with the design by exposing after correcting the stage control based on the error map 380.

In addition, it is possible to correct the coordinates of the position surrounded by the peripheral measuring points 312 as illustrated in FIG. 37B, i.e., to correct the deviation of an internally dividing point 383 of a measuring point grid. In this case, the deviation vectors 382 of the peripheral measuring points 312, i.e., a to d are added in accordance with an internally dividing ratio, and the deviation vector of the internally dividing point 383 of the measuring point grid is determined for interpolation. Thus, the correction amount is calculated so that straightness or position accuracy of the stage can be insured. Correction of accuracy in the exposed range is defined in the above description. As to an externally dividing point 384 of the measuring point grid on the periphery of the grid of the measuring points 312, a correction value is computed by predicting (by so-called extrapolation of) the deviation vector in the range over the range of the measuring points from a change of the deviation vectors of the near measuring points (e.g., a to d).

For instance, a camera is fixed to the stage, and position accuracy of the projection optical system 3 is checked, or position accuracy of an alignment camera for detecting the alignment marks for positioning the substrate 2 is checked. In this case, the calculation of the correction value is effective for moving the stage 1 over the range of the exposure of the substrate 2 so that the positioning can be performed with high accuracy.

According to the method described above, the calibration of the maskless exposure machine can be performed with high accuracy for the case other than the case of the stage 1 or the projection optical system 3.

The embodiments of the present invention have been described above, but each structure described in the embodiments is merely an example. The present invention can be modified as appropriate within the scope of the present invention without deviating from the technical concept thereof. In addition, the structures described in the embodiments can be combined for use as long as no contradiction arises.

The fields to which the present invention can be applied include maskless exposure for forming a circuit pattern on a printed circuit board and maskless exposure in a TFT film forming process for an LCD panel or an OLED panel. In addition, the exposure on the photosensitive resist applied on the substrate is described above, but the present invention can be applied to a color filter film forming process or the like for an LCD panel by direct printing using an ink jet printer.

While there have been described what are at present considered to be certain embodiments of the invention, it is understood that various modifications may be made thereto, and it is intended that the appended claims cover all such modifications as fall within the true spirit and scope of the invention.

What is claimed is:

1. A maskless exposure method of drawing a circuit pattern on a photosensitive resist film, comprising:

moving a substrate on which the photosensitive resist film is formed with respect to a projection optical system;

scanning, by the projection optical system, the substrate in a first direction;

shifting a scanning region in a second direction that crosses the first direction;

scanning the substrate in the first direction so that an overlapping part is formed in the second direction; wherein:

a plurality of marks different from the circuit pattern are exposed in a vicinity of the overlapping part on a pair of the scanning regions adjacent to each other with the overlapping part, the plurality of marks are a set of marks at least including two marks disposed on one side of the overlapping part and two marks disposed on another side of the overlapping part;

deviations between the pair of the scanning regions adjacent to each other in the first direction and in the second direction, and an inclination of exposing light of the projection optical system with respect to the first direction are detected by measuring deviations of distances among the plurality of marks;

calibration data are obtained from a result of the detecting;

marks are drawn on a center axis along the first direction in a plurality of the scanning regions by the projection optical system;

coordinates of two points among the marks drawn by the same projection optical system are measured after the photosensitive resist film is developed;

the deviation between the pair of the scanning regions adjacent to each other in the first direction is derived from a difference between a distance between the two points in the first direction and a distance in an exposure instruction value between the measured two points in the first direction;

calibration data of a scanning start timing of the projection optical system are generated from the deviation between the pair of the scanning regions adjacent to each other in the first direction obtained in the measuring the coordinates;

the deviation between the pair of the scanning regions adjacent to each other in the first direction are measured among the plurality of the scanning regions;

measured values of the measured deviation in the first direction are averaged;

the deviation between the pair of the scanning regions adjacent to each other in the first direction are derived; and calibration data of the inclination of the projection optical system with respect to the first direction are generated from a difference between the deviation between the pair of the scanning regions adjacent to each other in the first direction obtained in the measuring among the plurality of the scanning regions and the deviation between the pair of the scanning regions adjacent to each other in the first direction obtained in the measuring the coordinates; and correcting the scanning start timing of the projection optical system and adjusting the inclination of the projection optical system with respect to the first direction are performed based on each of the calibration data of the scanning start timing of the projection optical system and the calibration data of the inclination of the projection optical system.

* * * * *